(12) United States Patent
Pickard et al.

(10) Patent No.: US 10,030,863 B2
(45) Date of Patent: Jul. 24, 2018

(54) HEAT SINK STRUCTURES, LIGHTING ELEMENTS AND LAMPS INCORPORATING SAME, AND METHODS OF MAKING SAME

(75) Inventors: Paul Kenneth Pickard, Morrisville, NC (US); Curt Progl, Raleigh, NC (US); Joshua N. Gray, Salt Lake City, UT (US)

(73) Assignee: Cree, Inc., Durham, NC (US)

( * ) Notice: Subject to any disclaimer, the term of this patent is extended or adjusted under 35 U.S.C. 154(b) by 1071 days.

(21) Appl. No.: 13/089,807

(22) Filed: Apr. 19, 2011

(65) Prior Publication Data

US 2012/0268936 A1 Oct. 25, 2012

(51) Int. Cl.
| | |
|---|---|
| *F21V 29/74* | (2015.01) |
| *F21K 9/00* | (2016.01) |
| *F21K 9/90* | (2016.01) |
| *F21V 23/02* | (2006.01) |
| *F21V 3/02* | (2006.01) |

(Continued)

(52) U.S. Cl.
CPC ............ *F21V 29/74* (2015.01); *F21K 9/00* (2013.01); *F21K 9/232* (2016.08); *F21K 9/90* (2013.01); *F21V 3/02* (2013.01); *F21V 29/506* (2015.01); *F21V 29/75* (2015.01); *F21V 29/777* (2015.01); *F21V 29/80* (2015.01); *F21V 29/83* (2015.01); *H05K 3/284* (2013.01); *F21V 23/02* (2013.01); *F21V 29/20* (2013.01); *F21V 29/78* (2015.01); *F21V 29/85* (2015.01); *F21Y 2107/30* (2016.08);

(Continued)

(58) Field of Classification Search
CPC .......... F21K 9/135; F21V 29/74; F21V 29/75; F21V 29/777; F21V 29/83; F21V 29/90

USPC ...... 362/249.01, 249.02, 294, 373, 649, 650
See application file for complete search history.

(56) References Cited

U.S. PATENT DOCUMENTS

| | | |
|---|---|---|
| 4,211,955 A | 7/1980 | Ray |
| 5,087,212 A | 2/1992 | Hanami |

(Continued)

FOREIGN PATENT DOCUMENTS

| | | |
|---|---|---|
| CN | 101666439 | 3/2010 |
| DE | 10 2007 040 444 | 3/2009 |

(Continued)

OTHER PUBLICATIONS

U.S. Appl. No. 13/622,763, filed Sep. 19, 2012, Progl.

(Continued)

*Primary Examiner* — William N Harris
(74) *Attorney, Agent, or Firm* — Burr & Brown, PLLC

(57) ABSTRACT

In some embodiments, a lighting element comprising at least first and second solid state light emitters, a first heat sink structure with a fold region between first and second heat sink regions, and at least one light emitter on each of the heat sink regions, and methods of making. In some embodiments, a lighting element, comprising plural heat sink regions on respective regions of a flexible circuit board, and plural light emitters on respective regions of the flexible circuit board, and methods of making. In some embodiments, heat sink structures comprising plural heat sink regions and a circuit board with plural regions, and lighting elements comprising them. In some embodiments, a heat sink structure, comprising plural heat sink regions and an internal flow guide structure, and lighting elements comprising same. Also, other lighting elements, lamps and heat sink structures.

52 Claims, 23 Drawing Sheets

(51) Int. Cl.
    *H05K 3/28*           (2006.01)
    *F21V 29/506*       (2015.01)
    *F21V 29/75*        (2015.01)
    *F21V 29/77*        (2015.01)
    *F21V 29/78*        (2015.01)
    *F21V 29/80*        (2015.01)
    *F21V 29/83*        (2015.01)
    *F21V 29/85*        (2015.01)
    *F21K 9/232*        (2016.01)
    *F21Y 115/10*       (2016.01)
    *F21Y 107/30*       (2016.01)
    *F21V 29/00*        (2015.01)

(52) U.S. Cl.
    CPC . *F21Y 2115/10* (2016.08); *H05K 2201/10106* (2013.01); *Y10T 29/4935* (2015.01)

(56) References Cited

U.S. PATENT DOCUMENTS

| | | | |
|---|---|---|---|
| 5,191,512 A * | 3/1993 | Ogura et al. | 361/720 |
| 5,378,158 A | 1/1995 | Owen et al. | |
| 5,585,688 A | 12/1996 | DeKleine | |
| 5,850,126 A | 12/1998 | Kanbar | |
| 5,890,794 A | 4/1999 | Abtahi et al. | |
| 5,946,931 A | 9/1999 | Lomax et al. | |
| 6,353,295 B1 | 3/2002 | Sridhar et al. | |
| 6,499,860 B2 * | 12/2002 | Begemann | F21K 9/135 362/230 |
| 6,573,536 B1 | 6/2003 | Dry | |
| 6,598,996 B1 | 7/2003 | Lodhie | |
| 6,621,222 B1 | 9/2003 | Hong | |
| 6,815,724 B2 | 11/2004 | Dry | |
| 6,948,829 B2 | 9/2005 | Verdes et al. | |
| 6,991,351 B1 * | 1/2006 | Petrick | B60Q 1/2611 340/815.45 |
| 7,031,155 B2 | 4/2006 | Sauciuc et al. | |
| 7,064,498 B2 | 6/2006 | Dowling et al. | |
| 7,144,135 B2 | 12/2006 | Martin et al. | |
| 7,172,314 B2 | 2/2007 | Currie et al. | |
| 7,213,940 B1 | 5/2007 | Van De Ven et al. | |
| 7,245,495 B2 | 7/2007 | Ouyang | |
| 7,253,446 B2 | 8/2007 | Sakuma et al. | |
| 7,344,296 B2 * | 3/2008 | Matsui et al. | 362/652 |
| 7,396,142 B2 | 7/2008 | Laizure, Jr. et al. | |
| 7,434,964 B1 * | 10/2008 | Zheng et al. | 362/294 |
| 7,521,875 B2 | 4/2009 | Maxik | |
| 7,524,089 B2 | 4/2009 | Park | |
| 7,534,015 B2 | 5/2009 | Xu et al. | |
| 7,556,869 B2 | 7/2009 | Fukushima et al. | |
| 7,611,263 B2 | 11/2009 | Huang et al. | |
| 7,661,854 B1 | 2/2010 | Yang et al. | |
| 7,695,162 B2 * | 4/2010 | Zhang et al. | 362/294 |
| 7,744,250 B2 * | 6/2010 | Lee | F21K 9/00 362/249.02 |
| D626,267 S | 10/2010 | Pickard | |
| 7,857,488 B2 * | 12/2010 | Chen et al. | 362/297 |
| 7,874,699 B2 | 1/2011 | Liang | |
| D644,356 S | 8/2011 | Pickard | |
| 8,066,414 B2 * | 11/2011 | Pabst et al. | 362/373 |
| 8,104,919 B2 | 1/2012 | Wung et al. | |
| 8,123,381 B1 * | 2/2012 | Wray | 362/294 |
| 8,333,487 B2 * | 12/2012 | Mekhtarian | 362/294 |
| 8,680,754 B2 * | 3/2014 | Premysler | 313/46 |
| 8,783,910 B2 * | 7/2014 | Hua | 362/294 |
| 2003/0063462 A1 | 4/2003 | Shimizu et al. | |
| 2003/0117803 A1 | 6/2003 | Chen | |
| 2005/0111234 A1 | 5/2005 | Martin et al. | |
| 2005/0174780 A1 | 8/2005 | Park | |
| 2005/0200289 A1 | 9/2005 | Krichtafovitch | |
| 2006/0056113 A1 | 3/2006 | Fukushima et al. | |
| 2006/0193130 A1 * | 8/2006 | Ishibashi | F21K 9/135 362/227 |
| 2007/0102033 A1 | 5/2007 | Petrocy | |
| 2007/0230184 A1 | 10/2007 | Shuy | |
| 2008/0055909 A1 | 3/2008 | Li | |
| 2008/0253125 A1 * | 10/2008 | Kang | F21V 29/004 362/294 |
| 2008/0316755 A1 | 12/2008 | Zheng et al. | |
| 2009/0040759 A1 * | 2/2009 | Zhang | F21K 9/00 362/249.01 |
| 2009/0045933 A1 * | 2/2009 | Smith et al. | 340/468 |
| 2009/0046464 A1 * | 2/2009 | Liu | F21K 9/00 362/294 |
| 2009/0046473 A1 | 2/2009 | Wen-Kuei | |
| 2009/0059559 A1 * | 3/2009 | Pabst et al. | 362/84 |
| 2009/0080187 A1 | 3/2009 | Chou | |
| 2009/0080205 A1 * | 3/2009 | Chang | F21V 29/02 362/373 |
| 2009/0160363 A1 | 6/2009 | Negley | |
| 2009/0161356 A1 | 6/2009 | Negley et al. | |
| 2009/0190312 A1 | 7/2009 | Katayama et al. | |
| 2009/0195186 A1 * | 8/2009 | Guest et al. | 315/294 |
| 2009/0245308 A1 | 10/2009 | Yu et al. | |
| 2009/0261268 A1 | 10/2009 | Schwiebert et al. | |
| 2009/0283779 A1 | 11/2009 | Negley | |
| 2009/0288807 A1 | 11/2009 | Yang et al. | |
| 2009/0310349 A1 * | 12/2009 | Xiang | F21K 9/00 362/234 |
| 2010/0079984 A1 * | 4/2010 | Liu | F21S 9/037 362/183 |
| 2010/0165635 A1 | 7/2010 | Chen et al. | |
| 2010/0207502 A1 * | 8/2010 | Cao | F21V 3/00 313/46 |
| 2010/0237760 A1 | 9/2010 | Yang | |
| 2010/0265710 A1 * | 10/2010 | Xiao | F21V 19/0055 362/249.02 |
| 2010/0277069 A1 | 11/2010 | Janik et al. | |
| 2010/0314985 A1 | 12/2010 | Premysler | |
| 2010/0327725 A1 | 12/2010 | Huang et al. | |
| 2011/0156584 A1 * | 6/2011 | Kim | F21K 9/00 315/32 |
| 2011/0254423 A1 * | 10/2011 | Lee | F21K 9/135 313/46 |
| 2011/0297361 A1 | 12/2011 | Carbone et al. | |
| 2012/0075854 A1 | 3/2012 | Maxik et al. | |
| 2012/0224374 A1 | 9/2012 | Aliberti | |
| 2014/0340870 A1 | 11/2014 | Premysler | |

FOREIGN PATENT DOCUMENTS

| | | |
|---|---|---|
| DE | 10 2007 046639 A1 | 4/2009 |
| EP | 2 239 493 | 10/2010 |
| JP | 2004-265626 | 9/2004 |
| JP | 2004-296245 | 10/2004 |
| KR | 20100003326 | 1/2010 |
| WO | 2009/073394 | 6/2009 |
| WO | 2009/091562 | 7/2009 |
| WO | 2009/155704 | 7/2009 |
| WO | 2009-157704 | 12/2009 |

OTHER PUBLICATIONS

2011/0090686 (U.S. Appl. No. 12/582,206), Apr. 21, 2011 (filed Oct. 20, 2009), Pickard.
2011/0089838 (U.S. Appl. No. 12/607,355), Apr. 21, 2011 (filed Oct. 28, 2009), Pickard.
2011/0089830 (U.S. Appl. No. 12/683,886), Apr. 21, 2011 (filed Jan. 7, 2010), Pickard.
Premysler, Philip; U.S. Appl. No. 61/011,180 "Omnidirectionl LED Light Bulb".
Office Action from a corresponding European patent application dated Dec. 23, 2014, 6 pages.
2010/0246177 (U.S. Appl. No. 12/411,905), Sep. 30, 2010 (filed Mar. 26, 2009), Van de Ven.
2010/0301360 (U.S. Appl. No. 12/476,356), Dec. 2, 2010 (filed Jun. 2, 2009), Van de Ven.
Gernert, Nelson, *Active heat sink technology delivers added performance*, Electronic Products, Developments in active heat sink technology, pp. 1-4.

(56) References Cited

OTHER PUBLICATIONS

ANSI C78.20-2003, Revision of C78.20-1995, American National Standard for electric lamps—A, G, PS and Similar Shapes with E26 Medium Screw Bases, (Oct. 2003), pp. 1-48.
Computer Cooling, Electronics Cooling, . . . , SynJet® Technology: Overview, www.noventix.com/technology, pp. 1-2.
Cooligy's Active Microchannel Cooling System, www.frostytech.com/articleview.cfm, pp. 1-2.
EE Times, Pin-fin heat sink integrates fan, www.eetimes.com/showarticle.jhtml, (Nov. 2009), pp. 1-2.
Indian origin scientists microchip-sized fan produces enough wind to cool a laptop, thaindian.com/.../indian-origin-scientist . . . , Mar. 19, 2008, pp. 1-2.
Ionic Wind-Chillin' the PC, http://thefutureofthings.com/articles.p . . . , Jan. 2, 2007, pp. 1-5.
LED PARFECTION™, The Perfectly Designed Green Lighting Solution, http://www.litetronics.com/advertising/led-parfection-perfectly-designed.html.
Philips, *Philips First to Submit to Department of Energy L PRIZE*<sup>SM</sup> *Competition with Development of LED Replacment for Common Household Bulb,* Philips L PRIZE<sup>SM</sup> Press Information, Sep. 24, 2009, pp. 1-3.
Coyne et al., *Giant Magnetoresistance: The Really Big Idea Behind a Very Tiny Tool,* Magnet Lab, www.magnet.fsu.edu/education/.../gmr/, pp. 1-4.
Dan Schlitz, *Dan Schlitz of Thorrn Micro Technologies, Inc., Describes Innovative Micro-fan Technology,* National Science Foundation, Press Release 08-041-Video, nsf.gov/news/news_videos.jsp?cntn_id . . . , pp. 1.
Nuventix, *Cooling LEDs is no longer a design obstacle,* Dual DLM Brochure, www.nuventix.com/led_cooling, pp. 1-4.
Nuventix, *SynJet® PAR20 LED Cooler with Heat Sink,* Design Guide, Version 1.0, Jul. 2009, pp. 1-33.
Piezo Fans, *PiezoFans, LLC brings the latest piezoelectric technology to cooling applications,* http://www.piezofans.com/piezofans.php, pp. 1-2.
Daniel Schlitz, *SBIR Phase I: Compact Heat Sink using Microscale Ion Driven Air Flow,* Science Storm, sciencestorm.com/award/0340270.html, pp. 1-3.
Daniel Schlitz, *SBIR Phase II: Miniature Cooling System for Laptop Computers* , Science Storm, sciencestorm.com/award/0522126.html, pp. 1-3.
Daniel Schlitz, *Silent, microchip-sized 'fan' has no moving parts, yet produces enough wind to cool a laptop,* www.physorg.com/print125057974.html, Mar. 18, 2008 in Technology/Semiconductors, pp. 1-2.
THERMACORE, *Active Heat Sink Technology, AHST ,* 2008, pp. 1.
Press Release 08-041, Tiny Torrents, National Science Foundation, nsf.gov/news/news_summ.jsp?cntn_id . . . , Mar. 17, 2008, pp. 1-3.
Jason Lombarg, *Toshiba to release highly-efficient LED bulbs,* http://www.ecnmag.com/news-Toshiba-LED-bulbs-100509.aspx, Oct. 5, 2009, pp. 1-2,
2013-0208469 (U.S. Appl. No. 13/622,763), Aug. 15, 2013 (filed Sep. 19, 2012), Progl.
Litetronics International LED Parfection, 2010, pp. 1-2.
Office Action from a corresponding European patent application (EP 12 714 154.7) dated Apr. 12, 2018, 6 pages.

\* cited by examiner

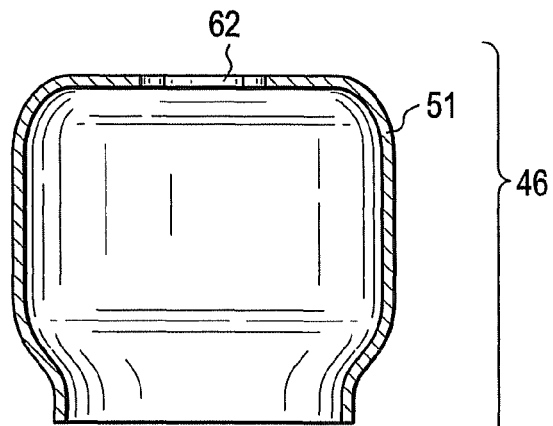
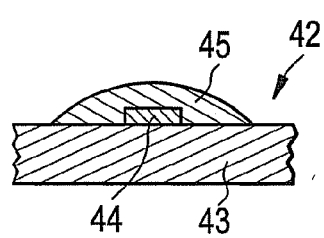
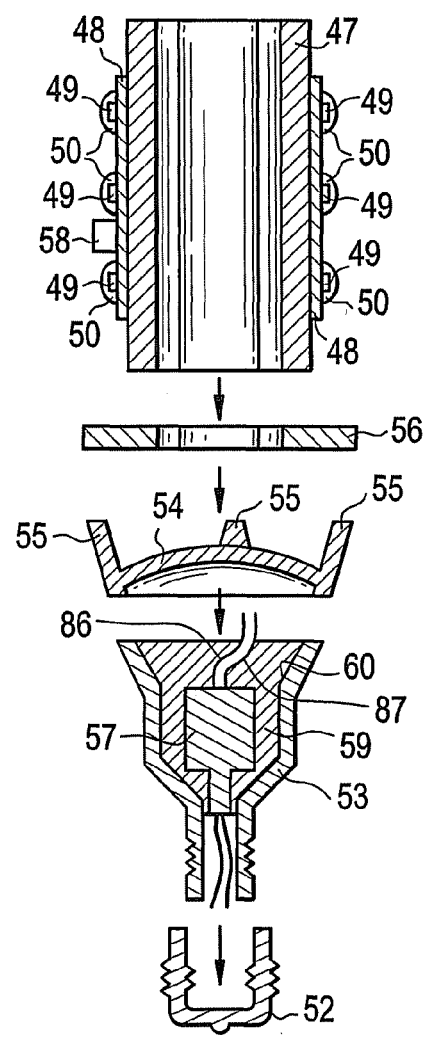

HEAT SINK STRUCTURES, LIGHTING ELEMENTS AND LAMPS INCORPORATING SAME, AND METHODS OF MAKING SAME

FIELD OF THE INVENTIVE SUBJECT MATTER

The inventive subject matter relates to the field of general illumination. In some aspects, the inventive subject matter relates to a lamp (and components for such a lamp) that comprises one or more solid state light emitters and that can be connected to a standard electrical connector, e.g., an electrical connector that is conventionally used for installing an incandescent lamp, a fluorescent lamp or any other type of lamp, such as an Edison socket or a GU-24 socket, for example. In some aspects, the inventive subject matter relates to such a lamp (and components for such a lamp) that is of a size and/or shape that is relatively close to a size and/or shape of a conventional lamp. In some aspects, the inventive subject matter relates to a lamp (and components for such a lamp) that can provide high efficiency and good CRI Ra over long lamp lifetimes.

BACKGROUND

There is an ongoing effort to develop systems that are more energy-efficient. A large proportion (some estimates are as high as twenty-five percent) of the electricity generated in the United States each year goes to lighting, a large portion of which is general illumination (e.g., downlights, flood lights, spotlights and other general residential or commercial illumination products). Accordingly, there is an ongoing need to provide lighting that is more energy-efficient.

Solid state light emitters (e.g., light emitting diodes) are receiving much attention due to their energy efficiency. It is well known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient than solid state light emitters, such as light emitting diodes.

In addition, as compared to the normal lifetimes of solid state light emitters, e.g., light emitting diodes, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes than incandescent lights (e.g., fluorescent bulbs typically have lifetimes of 10,000-20,000 hours), but provide less favorable color reproduction. The typical lifetime of conventional fixtures is about 20 years, corresponding to a light-producing device usage of at least about 44,000 hours (based on usage of 6 hours per day for 20 years). Where the light-producing device lifetime of the light emitter is less than the lifetime of the fixture, the need for periodic change-outs is presented. The impact of the need to replace light emitters is particularly pronounced where access is difficult (e.g., vaulted ceilings, bridges, high buildings, highway tunnels) and/or where change-out costs are extremely high.

General illumination devices are typically rated in terms of their color reproduction. Color reproduction is typically measured using the Color Rendering Index (CRI Ra). CRI Ra is a modified average of the relative measurements of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator.

Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways—driver response time, however, significantly decreases with lower CRI Ra values (for any given brightness, legibility decreases with lower CRI Ra).

The color of visible light output by a light emitter, and/or the color of blended visible light output by a plurality of light emitters can be represented on either the 1931 CIE (Commission International de l'Eclairage) Chromaticity Diagram or the 1976 CIE Chromaticity Diagram. Persons of skill in the art are familiar with these diagrams, and these diagrams are readily available (e.g., by searching "CIE Chromaticity Diagram" on the internet).

The CIE Chromaticity Diagrams map out the human color perception in terms of two CIE parameters x and y (in the case of the 1931 diagram) or u' and v' (in the case of the 1976 diagram). Each point (i.e., each "color point") on the respective Diagrams corresponds to a particular color hue. For a technical description of CIE chromaticity diagrams, see, for example, "Encyclopedia of Physical Science and Technology", vol. 7, 230-231 (Robert A Meyers ed., 1987). The spectral colors are distributed around the boundary of the outlined space, which includes all of the hues perceived by the human eye. The boundary represents maximum saturation for the spectral colors.

The 1931 CIE Chromaticity Diagram can be used to define colors as weighted sums of different hues. The 1976 CIE Chromaticity Diagram is similar to the 1931 Diagram, except that similar distances on the 1976 Diagram represent similar perceived differences in color.

In the 1931 Diagram, deviation from a point on the Diagram (i.e., "color point") can be expressed either in terms of the x, y coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues that would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2 + \Delta v'^2)^{1/2}$. This formula gives a value, in the scale of the u' v' coordinates, corresponding to the distance between points. The hues defined by a locus of points that are each a common distance from a specified color point consist of hues that would each be perceived as differing from the specified hue to a common extent.

A series of points that is commonly represented on the CIE Diagrams is referred to as the blackbody locus. The chromaticity coordinates (i.e., color points) that lie along the blackbody locus obey Planck's equation: $E(\lambda) = A \lambda^{-5} / (e^{(B/T)} - 1)$, where E is the emission intensity, $\lambda$ is the emission wavelength, T is the color temperature of the blackbody and A and B are constants. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants that produce light that is on or near the blackbody locus can thus be described in terms of their color temperature.

The most common type of general illumination is white light (or near white light), i.e., light that is close to the blackbody locus, e.g., within about 10 MacAdam ellipses of the blackbody locus on a 1931 CIE Chromaticity Diagram. Light with such proximity to the blackbody locus is referred to as "white" light in terms of its illumination, even though some light that is within 10 MacAdam ellipses of the blackbody locus is tinted to some degree, e.g., light from incandescent bulbs is called "white" even though it sometimes has a golden or reddish tint; also, if the light having a correlated color temperature of 1500 K or less is excluded, the very red light along the blackbody locus is excluded.

The emission spectrum of any particular light emitting diode is typically concentrated around a single wavelength (as dictated by the light emitting diode's composition and structure), which is desirable for some applications, but not desirable for others, (e.g., for providing general illumination, such an emission spectrum by itself would provide a very low CRI Ra).

Light that is perceived as white can be made by blending light of two or more colors (or wavelengths).

"White" solid state light emitting lamps have been produced by providing devices that mix different colors of light, e.g., by using light emitting diodes that emit light of differing respective colors and/or by converting some or all of the light emitted from the light emitting diodes using luminescent material. For example, as is well known, some lamps (referred to as "RGB lamps") use red, green and blue light emitting diodes, and other lamps use (1) one or more light emitting diodes that generate blue light and (2) luminescent material (e.g., one or more phosphor materials) that emits yellow light in response to excitation by light emitted by the light emitting diode, whereby the blue light and the yellow light, when mixed, produce light that is perceived as white light. While there is a need for more efficient white lighting, there is in general a need for more efficient lighting in all hues.

LEDs are increasingly being used in lighting/illumination applications, such as traffic signals, color wall wash lighting, backlights, displays and general illumination, with one ultimate goal being a replacement for the ubiquitous incandescent light bulb. In order to provide a broad spectrum light source, such as a white light source, from a relatively narrow spectrum light source, such as an LED, the relatively narrow spectrum of the LED may be shifted and/or spread in wavelength.

For example, a white LED may be formed by coating a blue emitting LED with an encapsulant material, such as a resin or silicon, that includes therein a wavelength conversion material, such as a YAG:Ce phosphor, that emits yellow light in response to stimulation with blue light. Some, but not all, of the blue light that is emitted by the LED is absorbed by the phosphor, causing the phosphor to emit yellow light. The blue light emitted by the LED that is not absorbed by the phosphor combines with the yellow light emitted by the phosphor, to produce light that is perceived as white by an observer. Other combinations also may be used. For example, a red emitting phosphor can be mixed with the yellow phosphor to produce light having better color temperature and/or better color rendering properties. Alternatively, one or more red LEDs may be used to supplement the light emitted by the yellow phosphor-coated blue LED. In other alternatives, separate red, green and blue LEDs may be used. Moreover, infrared (IR) or ultraviolet (UV) LEDs may be used. Finally, any or all of these combinations may be used to produce colors other than white.

LED lighting systems can offer a long operational lifetime relative to conventional incandescent and fluorescent bulbs. LED lighting system lifetime is typically measured by an "L70 lifetime", i.e., a number of operational hours in which the light output of the LED lighting system does not degrade by more than 30%. Typically, an L70 lifetime of at least 25,000 hours is desirable, and has become a standard design goal. As used herein, L70 lifetime is defined by Illuminating Engineering Society Standard LM-80-08, entitled *"IES Approved Method for Measuring Lumen Maintenance of LED Light Sources"*, Sep. 22, 2008, ISBN No. 978-0-87995-227-3, also referred to herein as "LM-80", the disclosure of which is hereby incorporated herein by reference in its entirety as if set forth fully herein.

LEDs also may be energy efficient, so as to satisfy ENERGY STAR® program requirements. ENERGY STAR program requirements for LEDs are defined in *"ENERGY STAR® Program Requirements for Solid State Lighting Luminaires, Eligibility Criteria—Version 1.1"*, Final: Dec. 19, 2008, the disclosure of which is hereby incorporated herein by reference in its entirety as if set forth fully herein.

Heat is a major concern in obtaining a desirable operational lifetime for solid state light emitters. As is well known, an LED also generates considerable heat during the generation of light. The heat is generally measured by a "junction temperature", i.e., the temperature of the semiconductor junction of the LED. In order to provide an acceptable lifetime, for example, an L70 of at least 25,000 hours, it is desirable to ensure that the junction temperature should not be above 85° C. In order to ensure a junction temperature that is not above 85° C., various heat sinking schemes have been developed to dissipate at least some of the heat that is generated by the LED. See, for example, Application Note: CLD-APO6.006, entitled Cree® XLamp® XR Family & 4550 LED Reliability, published at cree.com/xlamp, September 2008.

In order to encourage development and deployment of highly energy efficient solid state lighting (SSL) products to replace several of the most common lighting products currently used in the United States, including 60-Watt A19 incandescent and PAR 38 halogen incandescent lamps, the Bright Tomorrow Lighting Competition (L Prize™) has been authorized in the Energy Independence and Security Act of 2007 (EISA). The L Prize is described in *"Bright Tomorrow Lighting Competition (L Prize™)"*, May 28, 2008, Document No. 08NT006643, the disclosure of which is hereby incorporated herein by reference in its entirety as if set forth fully herein. The L Prize winner must conform to many product requirements including light output, wattage, color rendering index, correlated color temperature, expected lifetime, dimensions and base type.

One of the most common incandescent lamps in use today is the "A lamp" (often simply referred to as a "household light bulb"), which is widely employed in the United States.

FIG. 16 shows an example of an A lamp incandescent bulb 100, a Philips 75 Watt (W) 120 volt (V) A 19 medium screw (E26) base frosted incandescent, having part number PL234153. Bulb 100 has a screw base 102 for screwing into a 120V lighting fixture and sealed glass bulb 104. Bulb 100 also has a nominal height, h, of 4.1 inches and a nominal width, w, of 2.4 inches. The upper portion of bulb 100 is generally hemispherical and the lower portion necks down to the screw base 102. In Europe and elsewhere, other standard incandescent bulb mounting arrangements are employed. In general, incandescent lamps are among the least energy efficient designs in use. A typical Philips bulb provides 1100 lumens using 75 Watts of energy or 14.67 lumens per Watt. As a result, some jurisdictions are mandating the phase out of such bulbs, and many consumers are beginning to phase out their use on their own.

Compact fluorescent lamps have been developed as retrofit replacement bulbs for use in standard incandescent sockets. Although they are typically more efficient, these fluorescent lamps present their own issues, such as environmental concerns related to the mercury employed therein, and in some cases questions of reliability and lifetime.

FIG. 17 shows an example of a compact fluorescent bulb 200 employing a GU-24 lamp base 202. GU describes the pin shape and 24 the spacing of the pins, which is 24 mm in a GU-24 lamp. Pins 204 and 206 in base 202 are inserted into a socket such as socket 210 of FIG. 17 and then the device can be twisted to lock bulb 200 in place. Power is connected to base 202 by electrical wiring 214.

A number of light emitting diode (LED) based A lamp replacement products have been introduced to the market. FIG. 18 illustrates an exploded view of a Topco Technologies Corp. LED lamp 300 having a lamp housing 310 comprising screw in plug 302, first cap 304, second cap 306, and lampshade 308. Lamp 300 also includes LED light source 320, heat sink 330, and control circuit 340. In another embodiment, a cooling fan can be employed. Further details of lamp 300 are found in U.S. Patent Application Publication No. 2009/0046473A1 which is incorporated herein by reference in its entirety as if set forth fully herein. Such products typically utilize some sort of upper hemisphere shaped body for emitting light at the top of the lamp. A lower or bottom portion of the lamp, the portion which transitions to the neck and screw base, is utilized for thermal management and to enclose a power supply.

BRIEF SUMMARY

There is therefore a need for high efficiency solid-state light sources that combine the efficiency and long life of solid state light emitters with an acceptable color temperature and good color rendering index, good contrast, a wide gamut and/or simple control circuitry.

Accordingly, for these and other reasons, efforts have been ongoing to develop ways by which solid state light emitters, which may or may not include luminescent material(s), can be used in place of incandescent lights, fluorescent lights and other light-generating devices in a wide variety of applications.

It would be desirable to provide a lamp (and/or a component for use in making a lamp) that comprises one or more solid state light emitters (and in which some or all of the light produced by the lamp is generated by solid state light emitters), where the lamp can be easily substituted (i.e., retrofitted or used in place of initially) for a conventional lamp (e.g., an incandescent lamp, a fluorescent lamp or other conventional types of lamps, including lamps that include solid state light emitters). For example, it would be desirable to provide a lamp (that comprises one or more solid state light emitters) that can be engaged with the same socket that the conventional lamp is engaged (a representative example of retrofitting being simply unscrewing an incandescent lamp from an Edison socket and threading in the Edison socket, in place of the incandescent lamp, a lamp that comprises one or more solid state light emitters). In some aspects of the present inventive subject matter, such lamps are provided.

A challenge with solid state light emitters is that many solid state light emitters do not operate as well as possible when they are subjected to elevated temperatures. For example, many light emitting diode light sources have average operating lifetimes of decades (as opposed to just months or 1-2 years for many incandescent bulbs), but some light emitting diodes' lifetimes can be significantly shortened if they are operated at elevated temperatures. A common manufacturer recommendation is that the junction temperature of a light emitting diode should not exceed 70 degrees C. if a long lifetime is desired.

In addition, the brightness of light emitted from some solid state light emitters varies based on ambient temperature, and the variance in brightness resulting from changes in ambient temperature can be more pronounced for solid state light emitters that emit light of one color than for solid state light emitters that emit light of another color. For example, light emitting diodes that emit red light often have a very strong temperature dependence (e.g., AlInGaP light emitting diodes can reduce in optical output by ~20% when heated up by ~40 degrees C., that is, approximately −0.5% per degree C.; and blue InGaN+YAG:Ce light emitting diodes can reduce by about −0.15%/degree C.).

In many instances where lamps include solid state light emitters as light sources (e.g., general illumination devices that emit white light in which the light sources consist of light emitting diodes), a plurality of solid state light emitters are provided that emit light of different colors which, when mixed, are perceived as the desired color for the output light (e.g., white or near-white).

As noted above, the brightness of light emitted by many solid state light emitters, when supplied with a given current, can vary as a result of temperature change. The desire to maintain a relatively stable color of light output is therefore an important reason to try to reduce temperature variation of solid state light emitters.

In accordance with an aspect of the present inventive subject matter, there are provided solid state light emitter lamps, i.e., lamps that comprise one or more solid state light emitters (and in some embodiments, lamps in which all or substantially all of the light generated by the lamp is generated by one or more solid state light emitters).

In some aspects of the present inventive subject matter, there is provided a lighting element (that can be used in making a lamp) that comprises a foldable (or folded) heat sink structure, a circuit board and a plurality of solid state light emitters, in which the heat sink structure comprises a plurality of heat sink regions (that together extend around an internal space) and optionally a plurality of heat dissipation elements (e.g., fin elements) that extend from the heat sink structure into the internal space, in which the circuit board is mounted on two or more of the heat sink regions, on surfaces opposite from surfaces that face the internal space, and in which the solid state light emitters are mounted on the circuit board (and on different heat sink regions, with portions of the circuit board intervening between the solid state light emitters and the respective heat sink regions), whereby ambient fluid (e.g., air) can travel through the internal space to assist in removing heat generated by the solid state light emitters and/or other components of the lighting element or lamp.

In some aspects of the present inventive subject matter, there is provided a lighting element (that can be used in making a lamp) that comprises a flexible circuit board, a plurality of heat sink regions and a plurality of solid state light emitters, in which respective heat sink regions (at least some of the plurality of heat sink regions) are on respective regions of the flexible circuit board, where the heat sink regions (some or all of which can be integral with one another or separate from one another, and which can be held in place relative to one another by virtue of being attached to the flexible circuit board) together extend around an internal space, with respective solid state light emitters (at least some of the plurality of solid state light emitters) on respective circuit board regions facing away from the internal space, whereby ambient fluid (e.g., air) can travel through the internal space to assist in removing heat generated by the solid state light emitters and/or other components of the lighting element or lamp. Lighting devices in accordance with such aspects can further comprise one or more heat dissipation elements (e.g., fin elements) that extend from respective heat sink regions into the internal space.

In accordance with an aspect of the present inventive subject matter, there is provided a lamp that has size and shape that correspond to the size and shape of a conventional lamp (e.g., an A lamp) and/or that fits within the envelope of a conventional lamp, such as an A lamp (i.e., which meets the dimensional constraints for a lamp to be characterized as the specified type of lamp, such as an A lamp), and/or a lighting element, a heat sink structure, or other components that can be used in making such a lamp.

An infinite number of varieties of lamps can be provided that fall within the definition of A lamps. For example, a number of different varieties of conventional A lamps exist and include those identified as A 15 lamps, A 17 lamps, A 19 lamps, A 21 lamps and A 23 lamps. The expression "A lamp" as used herein includes any lamp that satisfies the dimensional characteristics for A lamps as defined in ANSI C78.20-2003, including the conventional A lamps identified in the preceding sentence. The lamps according to the present inventive subject matter can satisfy (or not satisfy) any or all of the other characteristics for A lamps (defined in ANSI C78.20-2003).

As noted above, in some embodiments according to the present inventive subject matter, the lamp can have shape and size corresponding to a conventional shape other than any of the A lamps, e.g., in the shape and/or size of any of B-10 lamps, BR lamps, C-7 lamps, C-15 lamps, ER lamps, F lamps, G lamps, K lamps, MB lamps, MR lamps, PAR lamps, PS lamps, R lamps, S lamps, S-11 lamps, T lamps, Linestra 2-base lamps, AR lamps, ED lamps, E lamps, BT lamps, Linear fluorescent lamps, U-shape fluorescent lamps, circline fluorescent lamps, single twin tube compact fluorescent lamps, double twin tube compact fluorescent lamps, triple twin tube compact fluorescent lamps, A-line compact fluorescent lamps, screw twist compact fluorescent lamps, globe screw base compact fluorescent lamps, reflector screw base compact fluorescent lamps, etc. Alternatively, the lamps can be of any suitable shape and size that does not conform to any of the A lamps or any of the types described above in this paragraph.

In accordance with another aspect of the present inventive subject matter, there is provided a lamp that comprises at least one heat sink structure and at least a first solid state light emitter (e.g., one or more light emitting diodes).

In accordance with another aspect of the present inventive subject matter, there is provided a lamp that comprises at least one heat sink structure, at least a first solid state light emitter and at least one circuit board.

In accordance with another aspect of the present inventive subject matter, there is provided a lamp that comprises at least one heat sink structure, at least a first solid state light emitter and at least one flexible circuit board.

In accordance with another aspect of the present inventive subject matter, there is provided a method of making a lighting element, comprising mounting a first solid state light emitter on a first heat sink region of a first heat sink structure, and mounting a second solid state light emitter on a second heat sink region of the first heat sink structure.

In accordance with another aspect of the present inventive subject matter, there is provided a lighting element that comprises at least a first heat sink structure that comprises at least a first internal flow guide structure that defines a first internal flow conduit.

In accordance with another aspect of the present inventive subject matter, there is provided a lighting element that comprises a heat sink structure that comprises at least first and second heat sink regions and at least a first circuit board.

In accordance with another aspect of the present inventive subject matter, there is provided a heat sink structure that comprises at least first and second heat sink regions and at least a first internal flow guide structure that defines a first internal flow conduit.

In accordance with another aspect of the present inventive subject matter, there is provided a lighting element that comprises at least a first heat sink structure, at least a first solid state light emitter and at least a first encapsulant.

In accordance with another aspect of the present inventive subject matter, there is provided a lamp that comprises at least a first heat sink structure, at least a first power supply, and at least a first solid state light emitter.

In accordance with another aspect of the present inventive subject matter, there is provided a lamp that comprises at least a first heat sink structure, at least a first power supply, at least a first solid state light emitter, and at least a first base structure.

In accordance with another aspect of the present inventive subject matter, there is provided a lamp that comprises a base structure, a lighting element, a lens, an electrical connector (e.g., an Edison plug) and a power supply, in which:
the base structure comprises legs, a base element, a base element cover, a dish structure and a heat transfer medium; and
the lighting element comprises a heat sink structure (which comprises fin elements, heat sink regions and an internal flow guide structure), a circuit board, solid state light emitters and encapsulant.

In accordance with a first aspect of the present inventive subject matter, there is provided a lighting element that comprises at least a first heat sink structure and at least first and second solid state light emitters, in which:
the first heat sink structure comprises at least first and second heat sink regions and at least a first fold region between the first and second heat sink regions,
at least the first solid state light emitter is on the first heat sink region, and
at least the second solid state light emitter is on the second heat sink region. The expression "fold region", as used herein, means a region on a structure that is between first and second portions of the structure, the fold region being of rigidity that is lower than the rigidity of the first and second portions of the structure, whereby the first portion of the structure can be rotated about the fold region and relative to the second portion of the structure, with less force than would be required to rotate a first region of the first portion of the structure relative to a second region of the first portion of the structure about a line (which is not along a fold region) that is located between the first portion of the structure and the second region of the first portion of the structure. In some embodiments according to this aspect of the present inventive subject matter, (1) the first fold region is substantially linear and has a thickness that is less than a thickness of every portion of each of the first and second heat sink regions, (2) the first fold region comprises a hinge structure (e.g., the first heat sink region is rotatable, to some degree, relative to the second heat sink region and/or the first heat sink region has been rotated at least once, and in some cases many times, relative to the second heat sink region, and/or (3) the material stiffness of the heat sink structure is reduced, relative to other locations on the first heat sink region and on the second heat sink region, along the first fold region. In some embodiments according to this aspect of the present inventive subject matter, the first heat sink structure can comprise one or more heat dissipation elements (e.g., one or more fin elements) attached to the first heat sink region. In some embodiments according to this aspect of the present inventive subject matter, the lighting element can further comprise at least a first circuit board that extends across the first fold region.

In accordance with a second aspect of the present inventive subject matter, there is provided a method of making a lighting element, comprising:

mounting a first solid state light emitter on a first heat sink region of a first heat sink structure; and mounting a second solid state light emitter on a second heat sink region of the first heat sink structure, the first heat sink structure comprising at least a first fold region between the first and second heat sink regions. A method according to the second aspect of the present inventive subject matter can in some instances be part of a method that comprises subsequently (1) supplying power to at least the first and second solid state light emitters (e.g., to test whether the first and second solid state light emitters are functioning properly), and/or (2) bending the first heat sink structure substantially along the first fold region (and in some cases, bending, the first heat sink structure along one or more additional fold regions so that first and second edges of the first heat sink structure are in contact with each other). In some embodiments according to this aspect of the present inventive subject matter, the first heat sink structure can comprise one or more heat dissipation elements (e.g., one or more fin elements) attached to the first heat sink region. Tn some embodiments according to this aspect of the present inventive subject matter, the method can further comprise mounting at least a first circuit board on the first heat sink structure so that a first region of the first circuit board is on the first heat sink region and a second region of the first circuit board is on the second heat sink region, and the first region of the first circuit board and the second region of the first circuit board are integral with each other.

In accordance with a third aspect of the present inventive subject matter, there is provided a lighting element that comprises at least a first flexible circuit board, at least first and second heat sink regions, and at least first and second solid state light emitters, in which:

the first flexible circuit board has at least first and second circuit board regions, the first heat sink region is on the first circuit board region, the second heat sink region is on the second circuit board region, the first solid state light emitter is on the first circuit board region, and the second solid state light emitter is on the second circuit board region.

In some embodiments in accordance with the third aspect of the present inventive subject matter, (1) the first and second heat sink regions are separate from one another (i.e., they are not integral with each other), (2) the lighting element further comprises at least a third heat sink region (and in some of such embodiments, the first, second and third heat sink regions together define at least a first internal space and/or the first, second and third heat sink regions are each substantially flat), and/or (3) a major surface of the first heat sink region has a plane of symmetry in a first plane, a major surface of the second heat sink region has a plane of symmetry in a second plane, a major surface of the third heat sink region has a plane of symmetry in a third plane, the first plane defines an angle of at least 20 degrees relative to each of the second plane and the third plane, and the second plane defines an angle of at least 20 degrees relative to the third plane.

In some embodiments in accordance with the third aspect of the present inventive subject matter, (1) the first and second heat sink regions are both part of a first integral heat sink structure, and/or the heat sink structure comprises at least a first fold region between the first and second heat sink regions.

In some embodiments in accordance with the third aspect of the present inventive subject matter, at least a first heat dissipation element is attached to the first heat sink region.

In accordance with a fourth aspect of the present inventive subject matter, there is provided a method of making a lighting element, comprising:

mounting a first solid state light emitter on a first heat sink region; and mounting a second solid state light emitter on a second heat sink region, the first heat sink region on a first circuit board region of a first flexible circuit board, the second heat sink region on a second circuit board region of the first flexible circuit board.

In some embodiments in accordance with the fourth aspect of the present inventive subject matter, the first and second heat sink regions can be separate from one another, and in some embodiments in accordance with the fourth aspect of the present inventive subject matter, the first and second heat sink regions can both be part of a first integral heat sink structure.

A method according to the fourth aspect of the present inventive subject matter can in some instances be part of a method that comprises subsequently (1) supplying power to at least the first and second solid state light emitters (e.g., to test whether the first and second solid state light emitters are functioning properly), and/or (2) folding the first flexible circuit board along a first conceptual line segment extending between the first circuit board region and the second circuit board region (and in some cases, bending the first flexible circuit board along one or more additional conceptual fold regions).

A method according to the fourth aspect of the present inventive subject matter can in some instances be part of a method that further comprises mounting a third solid state light emitter on a third heat sink region (the third heat sink region on a third circuit board region of the first flexible circuit board), and folding the first flexible circuit board along a second line segment extending between the second circuit board region and the third circuit board region.

A method according to the fourth aspect of the present inventive subject matter can in some instances be part of a method that further comprises supplying power to at least the first and second solid state light emitters, and then folding the first flexible circuit board along a first line segment extending between the first circuit board region and the second circuit board region.

In some embodiments according to the fourth aspect of the present inventive subject matter, the first heat sink structure can comprise one or more heat dissipation elements (e.g., one or more fin elements) attached to the first heat sink region.

In accordance with a fifth aspect of the present inventive subject matter, there is provided a heat sink structure that comprises at least first and second heat sink regions, and at least a first circuit board, in which:
  the first heat sink region has a first major surface that extends in a first plane of substantial symmetry,
  the second heat sink region has a second major surface that extends in a second plane of substantial symmetry,
  the first plane of substantial symmetry defines an angle of at least 20 degrees relative to the second plane of substantial symmetry,
  the first circuit board comprises at least a first circuit board region (which is on the first heat sink region) and a second circuit board region (which is on the second heat sink region), and the first circuit board region is integral with the second circuit board region.

In some embodiments according to this aspect of the present inventive subject matter, each of the heat sink regions has two opposite edges that each abut (and/or are integral with) other heat sink regions of the heat sink structure. The present inventive subject matter also provides a lighting element that comprises at least a first heat sink structure according to the fifth aspect of the present inventive subject matter, at least a first solid state light emitter (on the first circuit board region) and a second solid state light emitter (on the second circuit board region). In some embodiments according to this aspect of the present inventive subject matter, the first heat sink structure can comprise one or more heat dissipation elements (e.g., one or more fin elements) attached to the first heat sink region.

In accordance with a sixth aspect of the present inventive subject matter, there is provided a heat sink structure that comprises at least first and second heat sink regions and at least a first internal flow guide structure (which can be of any suitable shape, e.g., tubular with round or any other suitable regular or irregular cross-sectional shape) that defines a first internal flow conduit, in which the heat sink regions together define an internal space, and at least a portion of the first internal flow guide structure is in the internal space. In some embodiments according to this aspect of the present inventive subject matter, one or more heat dissipation elements (e.g., one or more fin elements) extend from the first heat sink region to the internal flow guide structure.

In accordance with another aspect of the present inventive subject matter, there is provided a lighting element that comprises a heat sink structure according to the sixth aspect of the present inventive subject matter, and at least a first circuit board on the heat sink structure.

In accordance with another aspect of the present inventive subject matter, there is provided a lighting element that comprises at least one heat sink structure according to the sixth aspect of the present inventive subject matter, and at least a first solid state light emitter, in which at least the first solid state light emitter is on a surface of the first heat sink structure that is opposite from a surface of the first heat sink structure that faces the internal space. In some embodiments according to this aspect of the present inventive subject matter, the lighting element can further comprise at least a first circuit board on the first heat sink structure.

In accordance with a seventh aspect of the present inventive subject matter, there is provided a lighting element that comprises at least a first heat sink structure, at least a first solid state light emitter, and at least a first encapsulant, in which:
  the first heat sink structure defines at least a first internal space,
  the first solid state light emitter is on a first surface of the first heat sink structure that is opposite from a second surface of the first heat sink structure that faces the internal space, and
  the first encapsulant covers at least a portion of the first solid state light emitter and extends more than twice as far in at least one direction along an emission plane of the first solid state light emitter as it extends in a direction perpendicular to the emission plane of the first solid state light emitter.

In accordance with an eighth aspect of the present inventive subject matter, there is provided a lamp that comprises at least a first heat sink structure, at least a first power supply element, and at least a first solid state light emitter, in which:
  the first heat sink structure defines at least a first internal space,
  the first solid state light emitter is on a first surface of the first heat sink structure that is opposite from a second surface of the first heat sink structure that faces the internal space, and
  at least the first power supply element is on the first heat sink structure.

In accordance with a ninth aspect of the present inventive subject matter, there is provided a lamp that comprises at least a first heat sink structure, at least a first power supply element, at least a first solid state light emitter, and at least a first base structure, in which:
  the first heat sink structure defines at least a first internal space,
  the first solid state light emitter is on a first surface of the first heat sink structure that is opposite from a second surface of the first heat sink structure that faces the internal space,
  the base structure comprises a base element, a base element cover, at least a first leg and a dish structure,
  the base element and the base element cover together define at least a first chamber,
  at least a portion of the first power supply element is inside the first chamber,
  at least a portion of the first leg is between the base element cover and the dish structure,
  the first heat sink structure is supported by the dish structure,
  portions of the base element cover along a first periphery (defined by regions of the base element cover that are in contact with the base element) are farther from the heat sink structure than portions of the base element cover that are spaced from the first periphery.

In accordance with a tenth aspect of the present inventive subject matter, there is provided a lighting element that comprises at least a first means for dissipating heat and at least first and second solid state light emitters.

In accordance with an eleventh aspect of the present inventive subject matter, there is provided a heat sink structure that comprises means for dissipating heat and at least a first means for supporting at least a first electronic component.

In accordance with a twelfth aspect of the present inventive subject matter, there is provided a lamp that comprises at least a first heat sink structure, at least a first power supply element, at least a first solid state light emitter and at least a first base structure, in which:

the first heat sink structure defines at least a first internal space, the first solid state light emitter is on a first surface of the first heat sink structure that is opposite from a second surface of the first heat sink structure that faces the internal space, the base structure comprises means for defining a first base chamber, at least a first leg and a dish structure, at least a portion of the first power supply element is inside the first base chamber, at least a portion of the first leg is between the means for defining a first base chamber and the dish structure, the first heat sink structure is supported on the dish structure, portions of the base element cover along a periphery of the means for defining a first base chamber are farther from the heat sink structure than portions of the means for defining a first base chamber that are spaced from the periphery.

The inventive subject matter may be more fully understood with reference to the accompanying drawings and the following detailed description of the inventive subject matter.

BRIEF DESCRIPTION OF THE DRAWING FIGURES

FIG. 3 depicts a portion of a circuit board 43, a solid state light emitter 44 and an encapsulant 45 in an embodiment according to the present inventive subject matter.

FIG. 4 is an exploded sectional view of a lamp 46 according to the present inventive subject matter.

Figure 5:
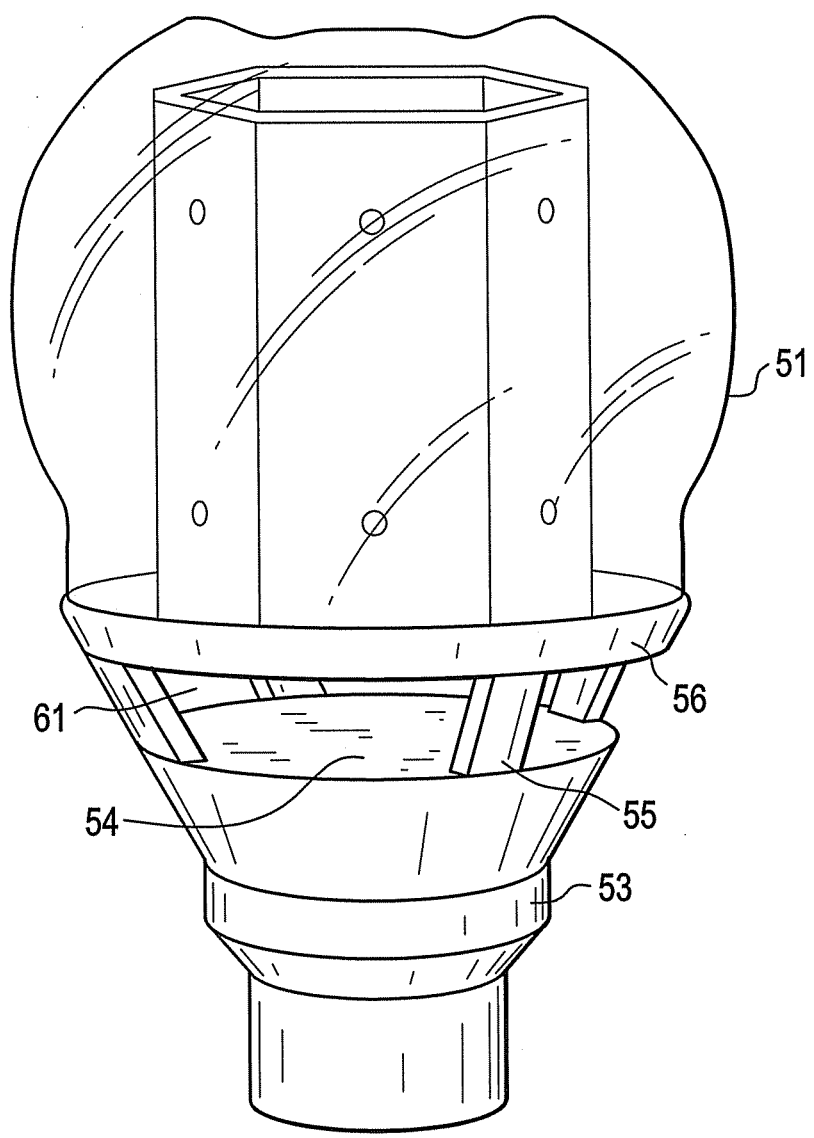
Figure 6:
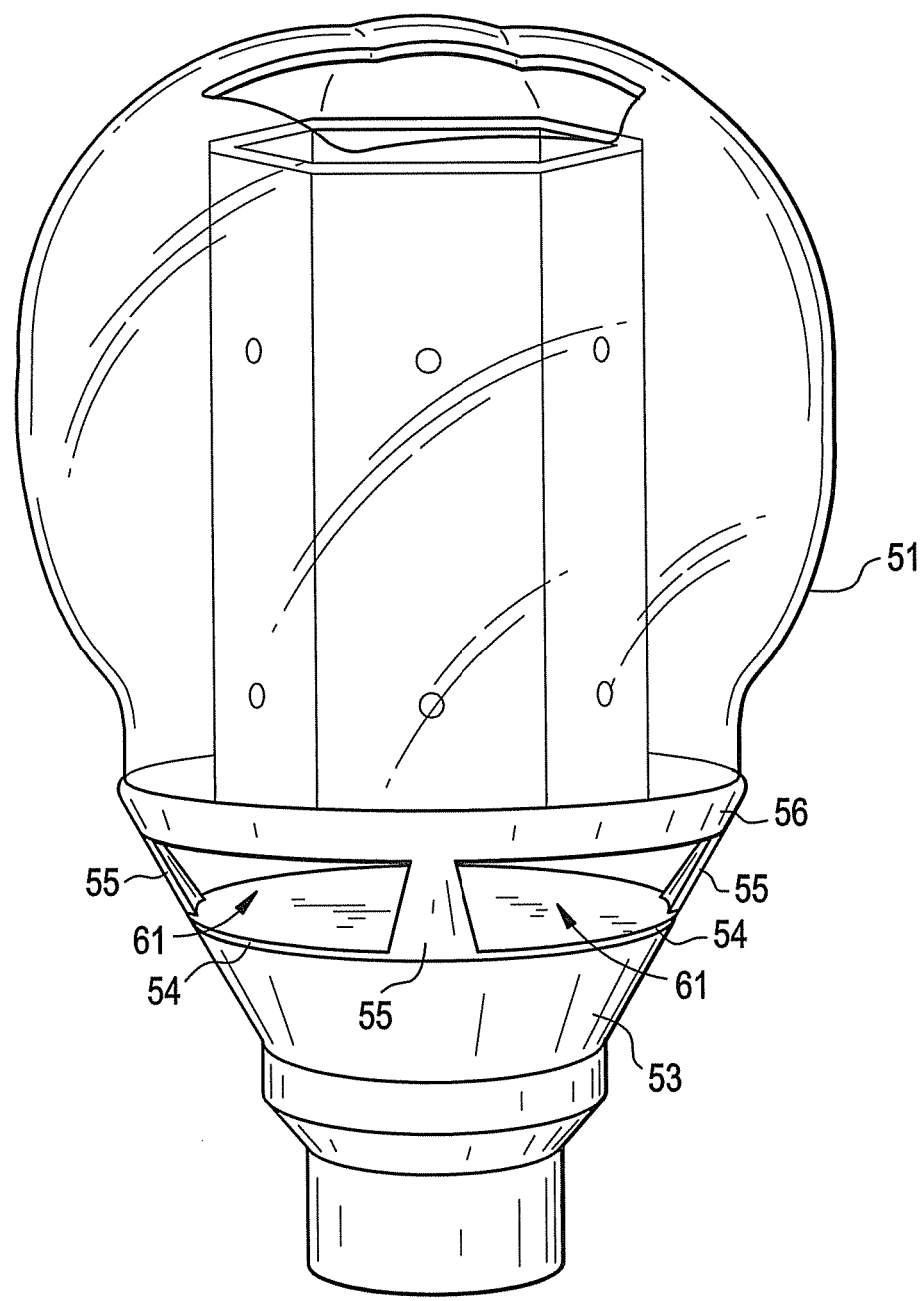

FIGS. 5 and 6 are perspective (non-exploded) views of the lamp 46.

Figure 7:
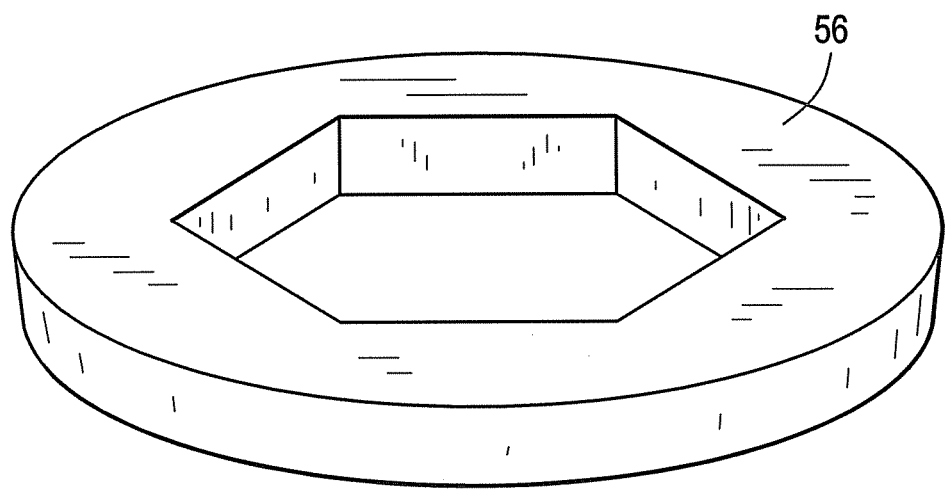

FIG. 7 is a perspective view of a dish structure 56.

Figure 8:
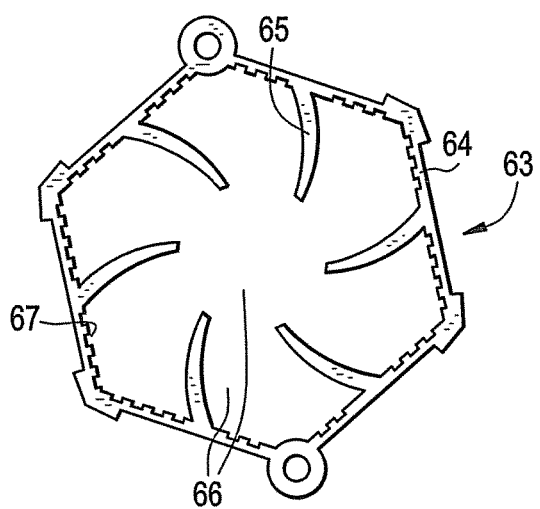

FIG. 8 is a top view of another heat sink structure 63 according to the present inventive subject matter.

Figure 9:
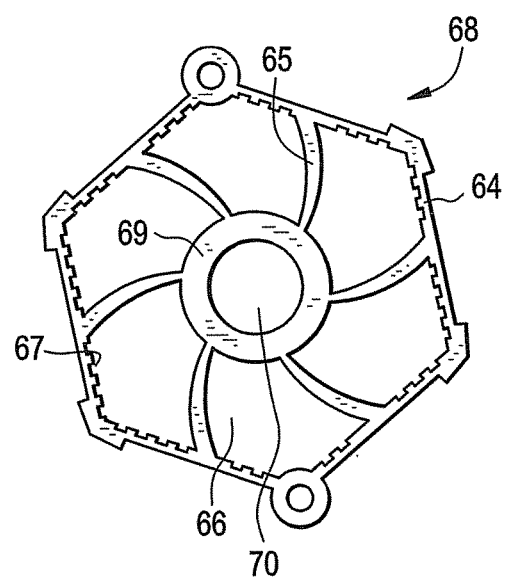

FIG. 9 is a top view of another heat sink structure 68 according to the present inventive subject matter.

Figure 10:
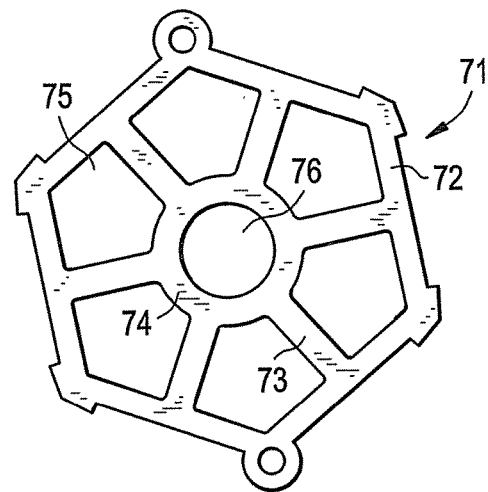

FIG. 10 is a top view of another heat sink structure 71 according to the present inventive subject matter.

Figure 11:
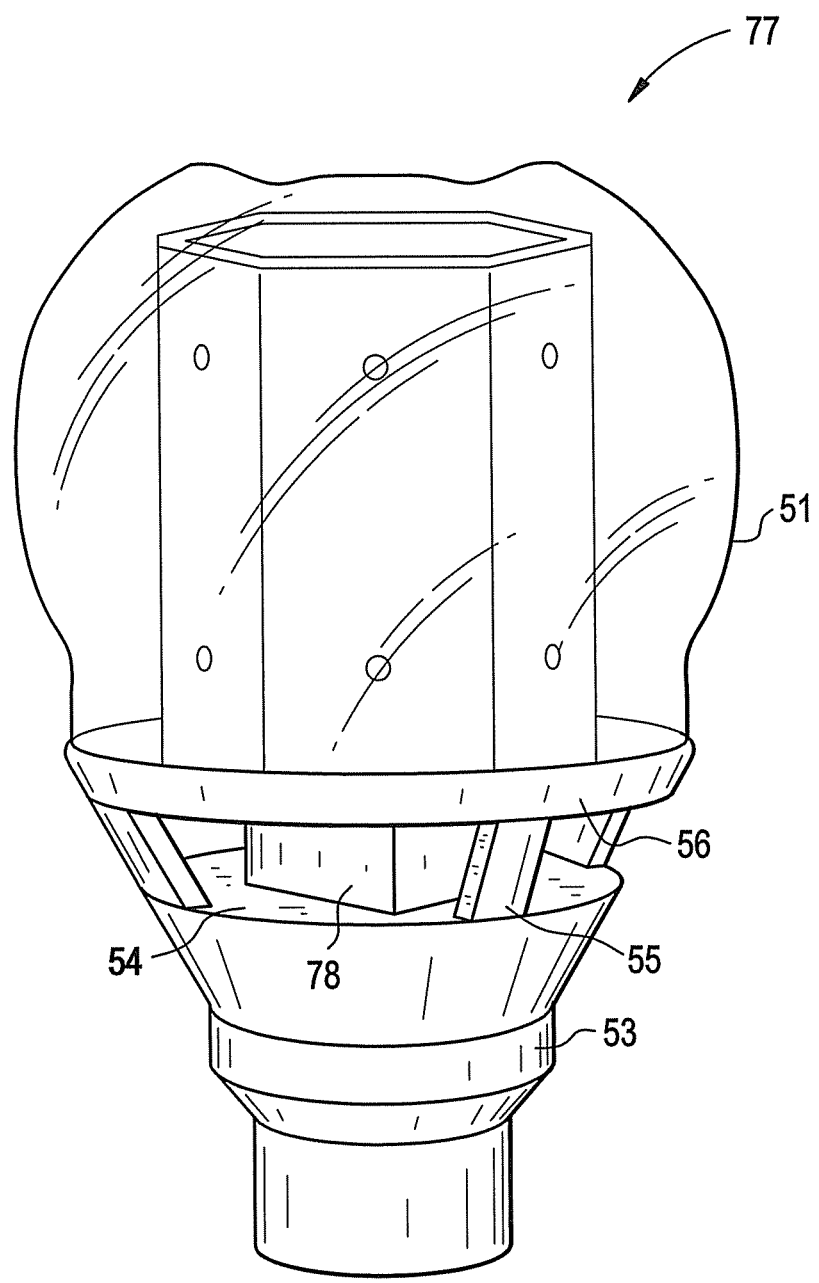

FIG. 11 depicts another lamp 77 according to the present inventive subject matter.

Figure 12:
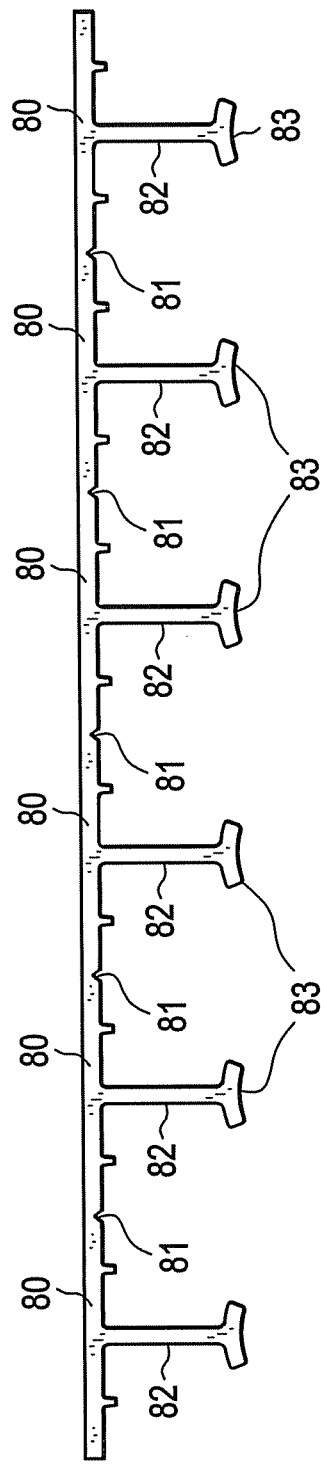
Figure 13:
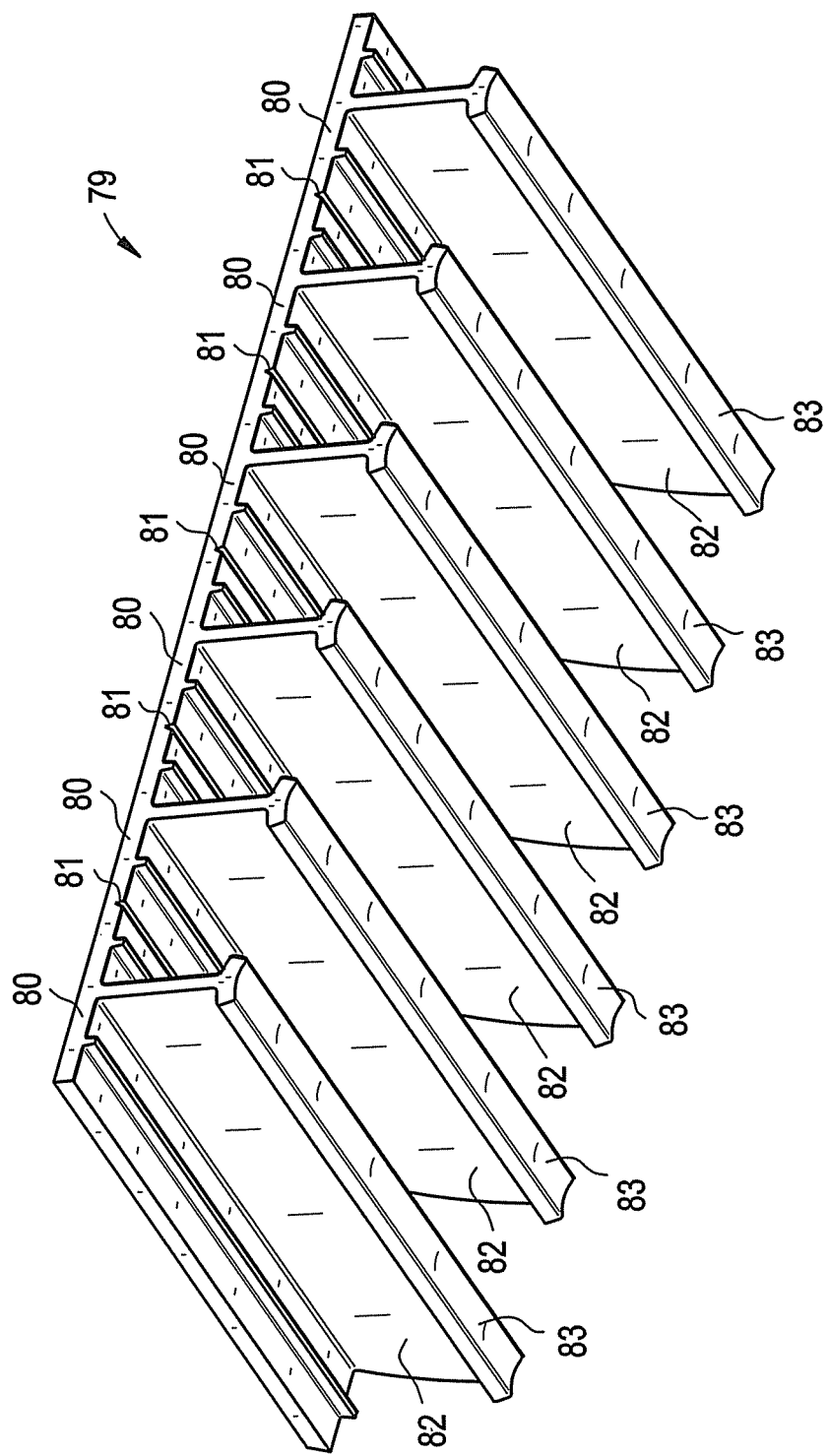

FIGS. 12 and 13 depict an element that comprises two or more heat sink regions in a stage during the making of a heat sink structure.

Figure 14:
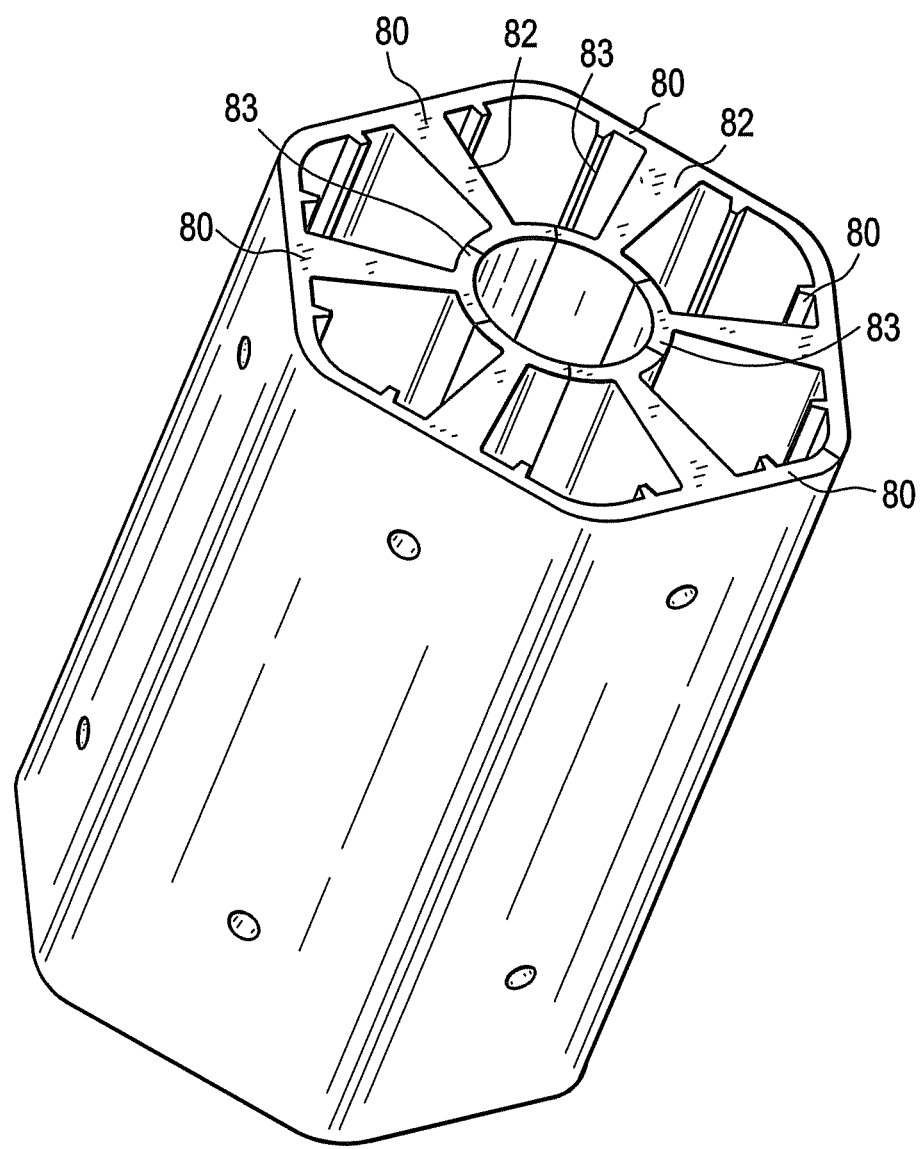

FIG. 14 depicts a heat sink structure according to the present inventive subject matter.

Figure 15:
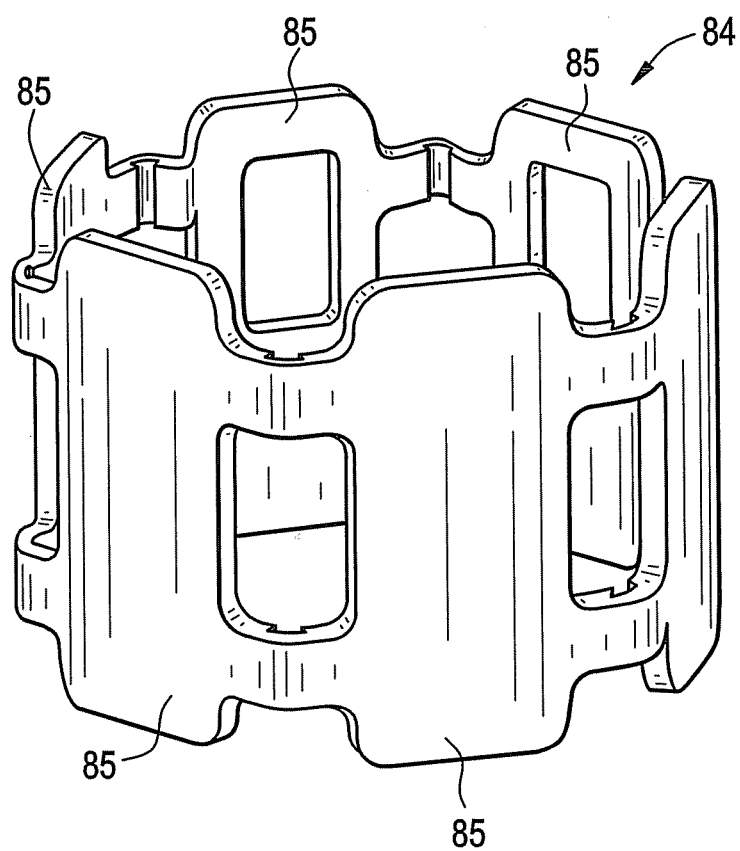

FIG. 15 depicts a circuit board according to the present inventive subject matter.

Figure 16:
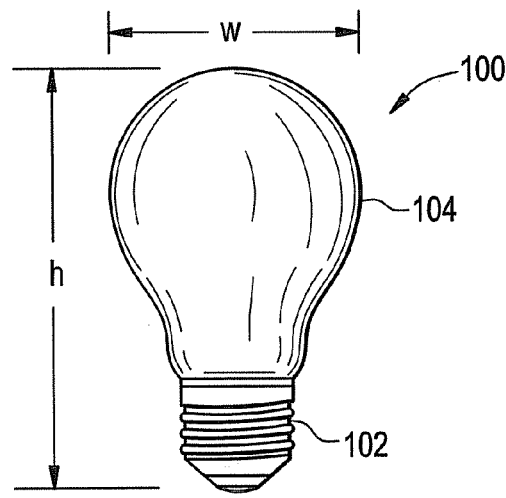
Figure 17:
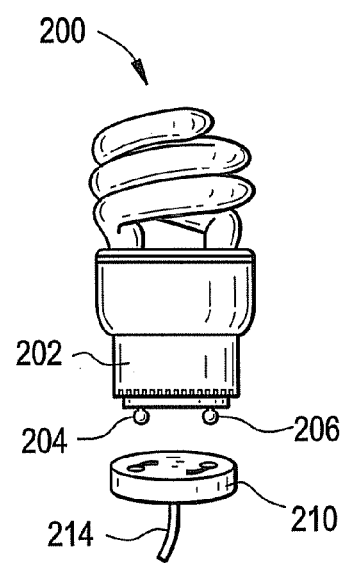
Figure 18:
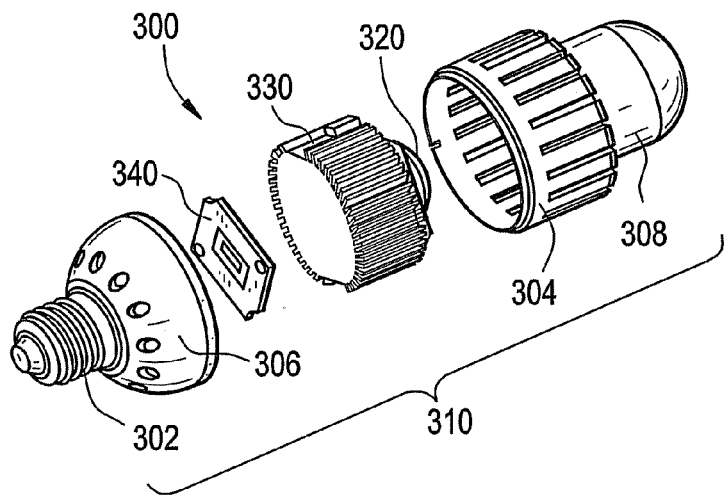
Figure 19:
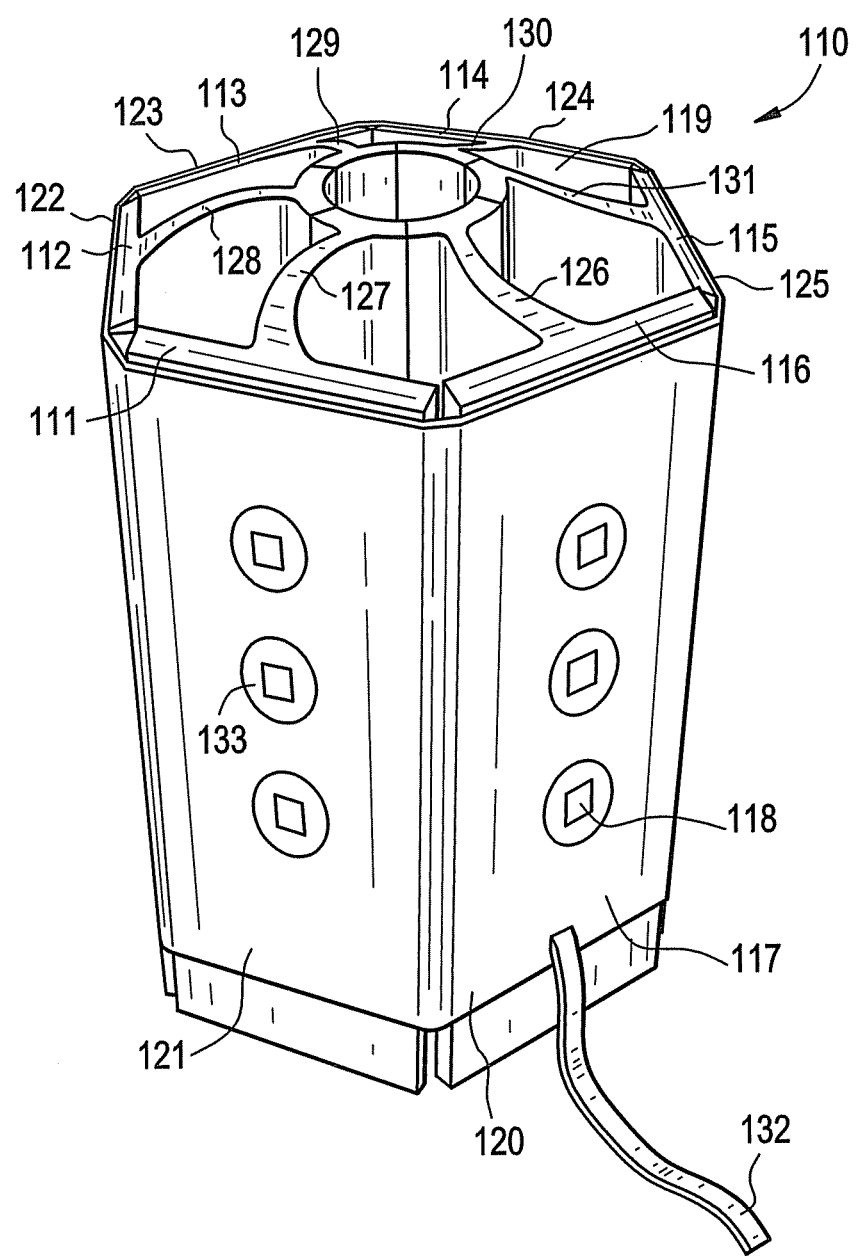

FIG. 16 shows an example of an incandescent light bulb;

FIG. 17 shows an example of a compact fluorescent light bulb;

FIG. 18 shows an example of an LED lamp;

FIG. 19 is a top perspective view of a lighting element 110 according to the present inventive subject matter.

Figure 20:
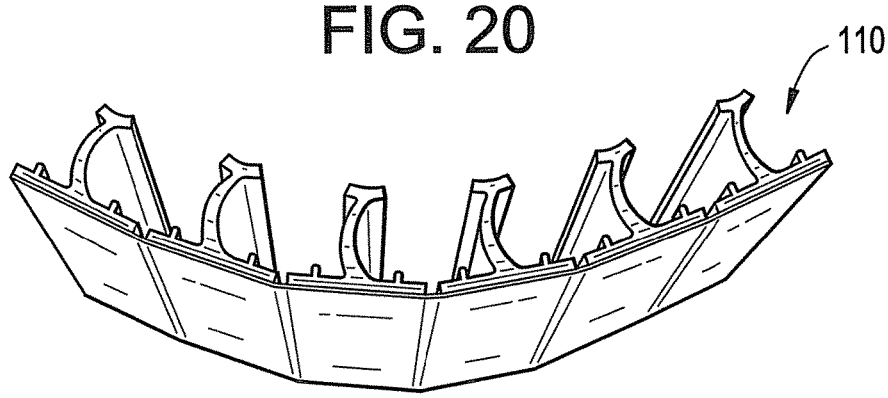

FIG. 20 is a top perspective view of the lighting element 110 in a different arrangement.

Figure 21:
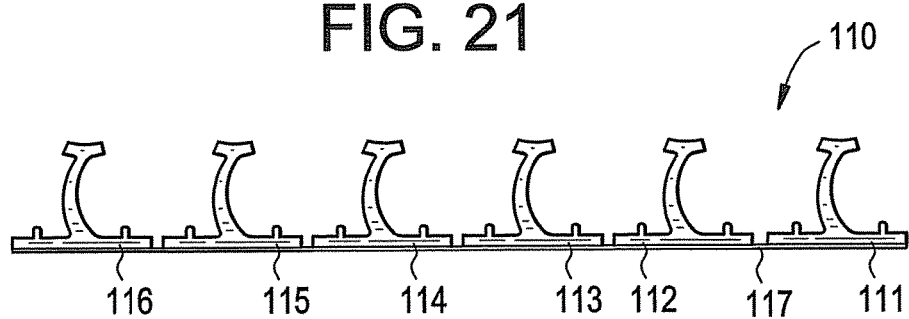

FIG. 21 is a top view of the lighting element 110 in a different arrangement.

Figure 22:
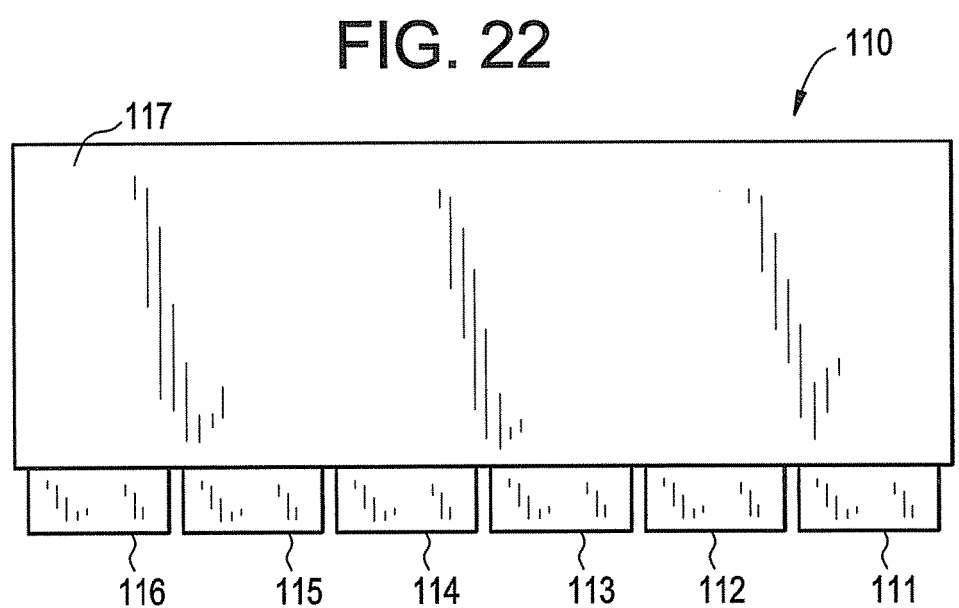

FIG. 22 is a front perspective view of the lighting element 110 in the arrangement depicted in FIG. 21.

Figure 23:
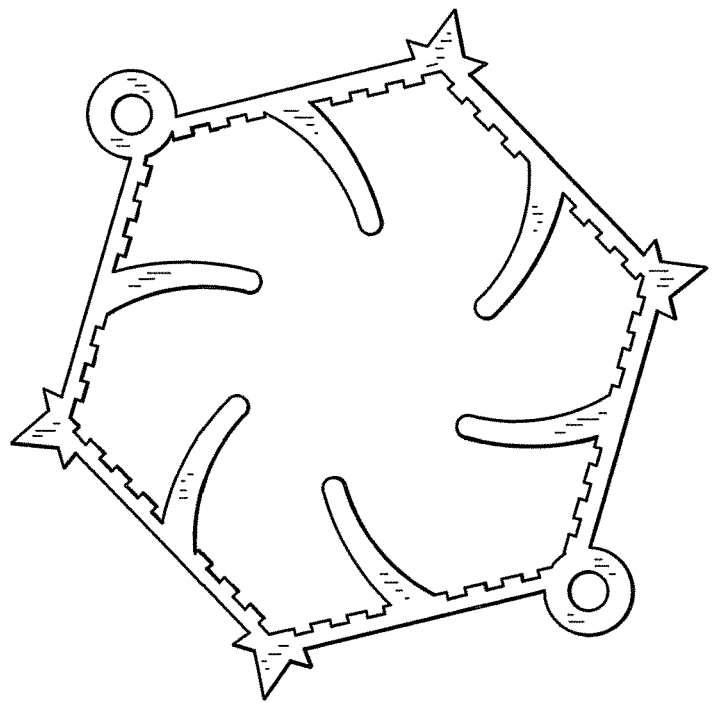

FIG. 23 is a top view of another heat sink structure according to the present inventive subject matter.

Figure 24:
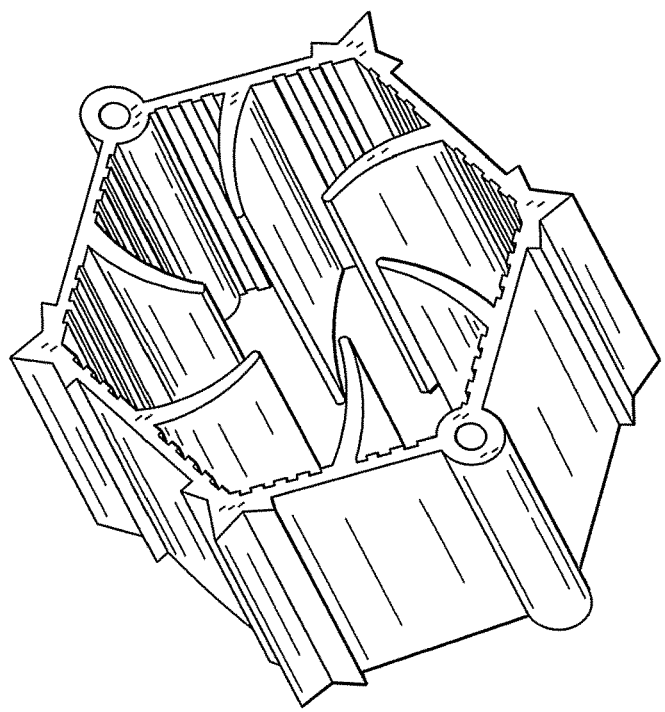

FIG. 24 is a perspective view of the heat sink structure depicted in FIG. 23.

Figure 25:
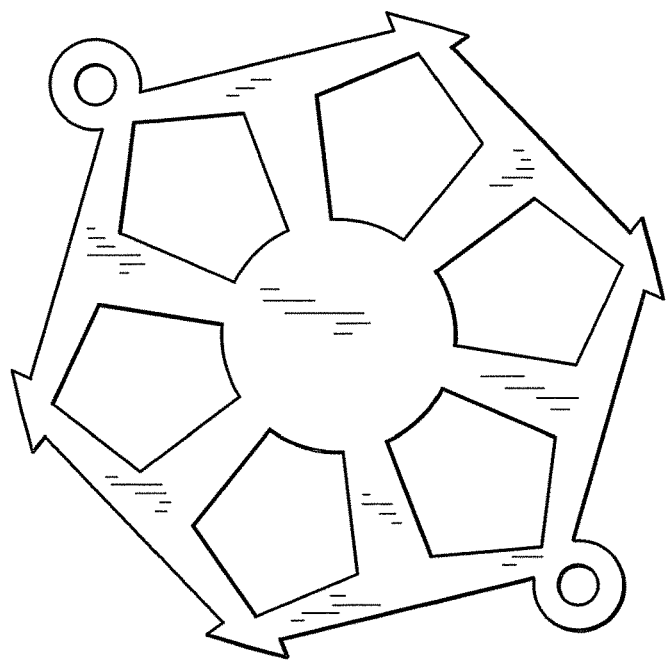

FIG. 25 is a top view of another heat sink structure according to the present inventive subject matter.

Figure 26:
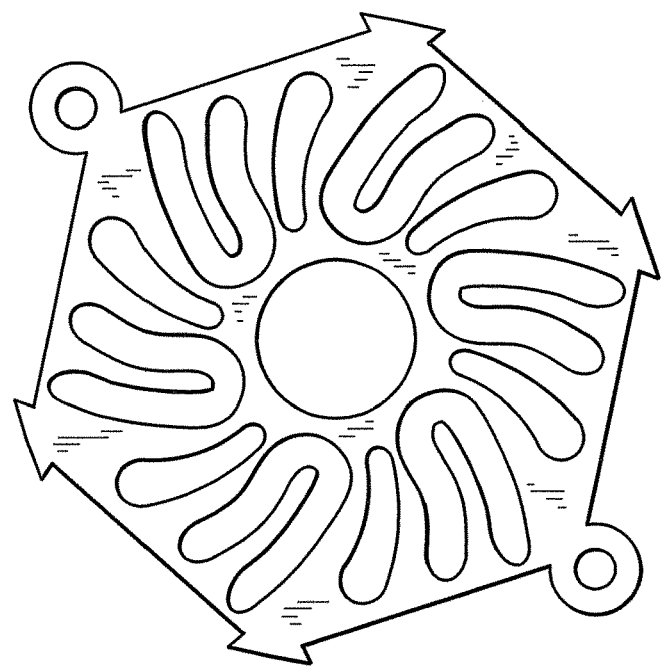

FIG. 26 is a top view of another heat sink structure according to the present inventive subject matter.

Figure 27:
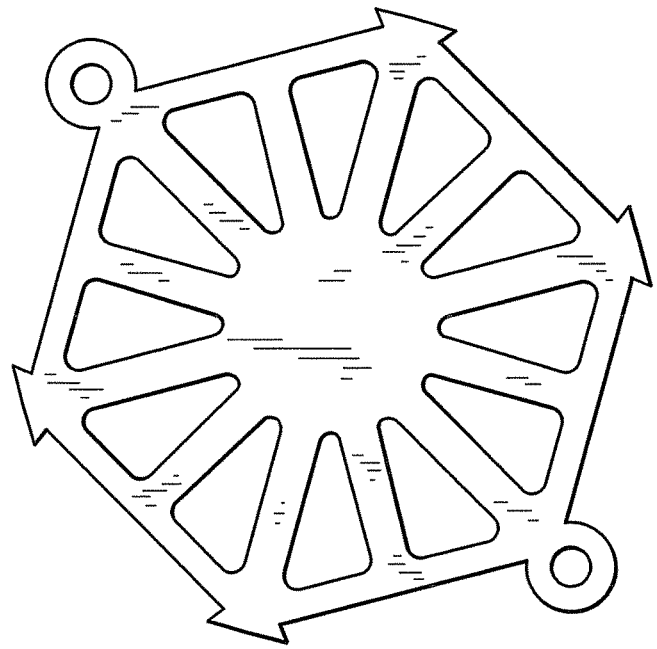

FIG. 27 is a top view of another heat sink structure according to the present inventive subject matter.

Figure 28:
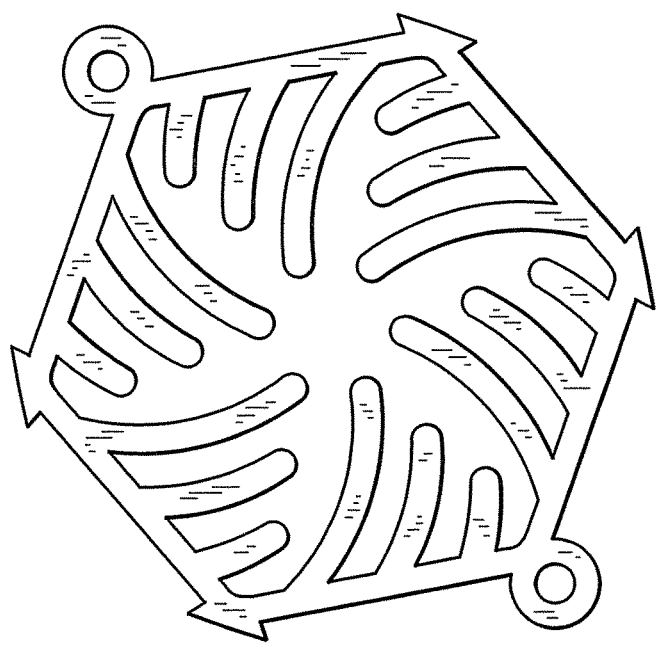

FIG. 28 is a top view of another heat sink structure according to the present inventive subject matter.

Figure 29:
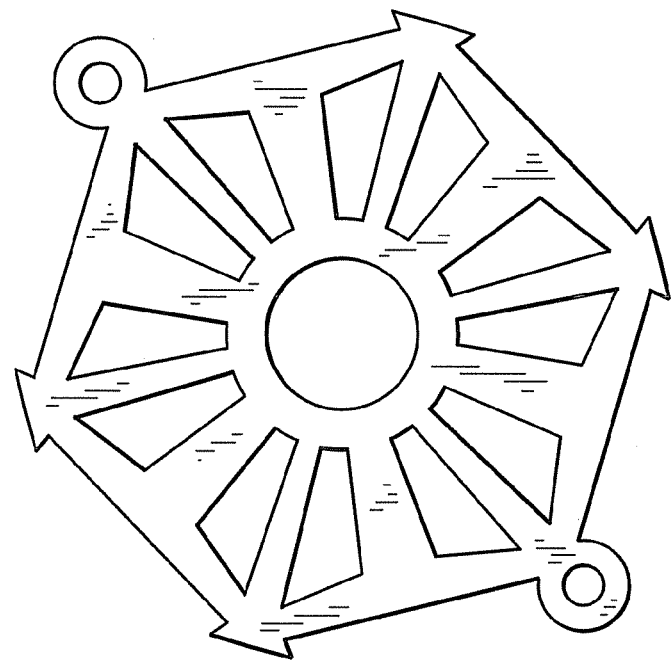

FIG. 29 is a top view of another heat sink structure according to the present inventive subject matter.

Figure 30:
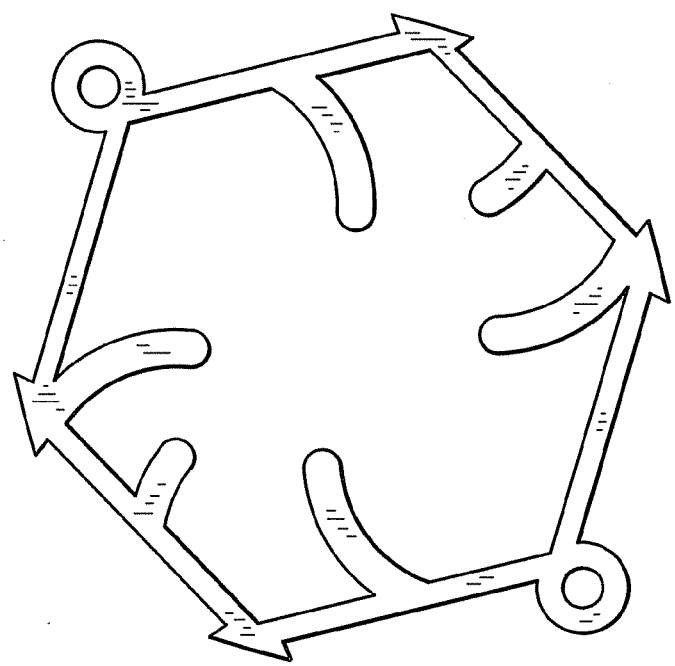

FIG. 30 is a top view of another heat sink structure according to the present inventive subject matter.

Figure 31:
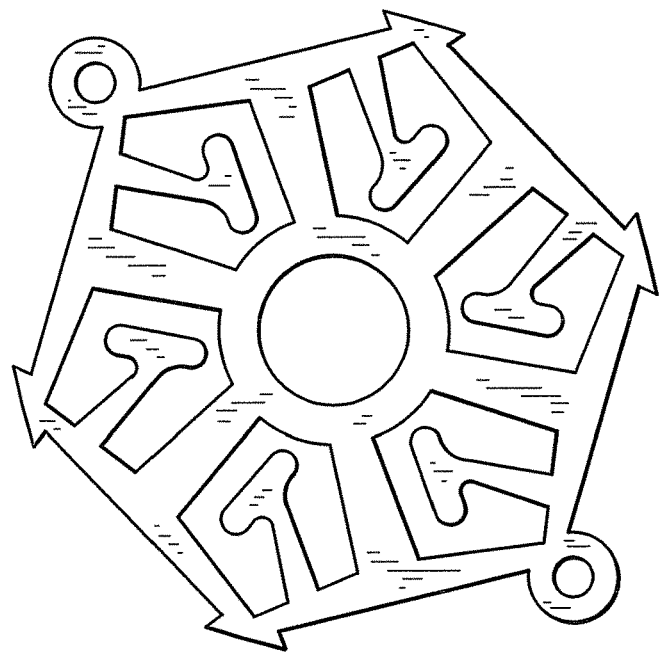

FIG. 31 is a top view of another heat sink structure according to the present inventive subject matter.

Figure 32:
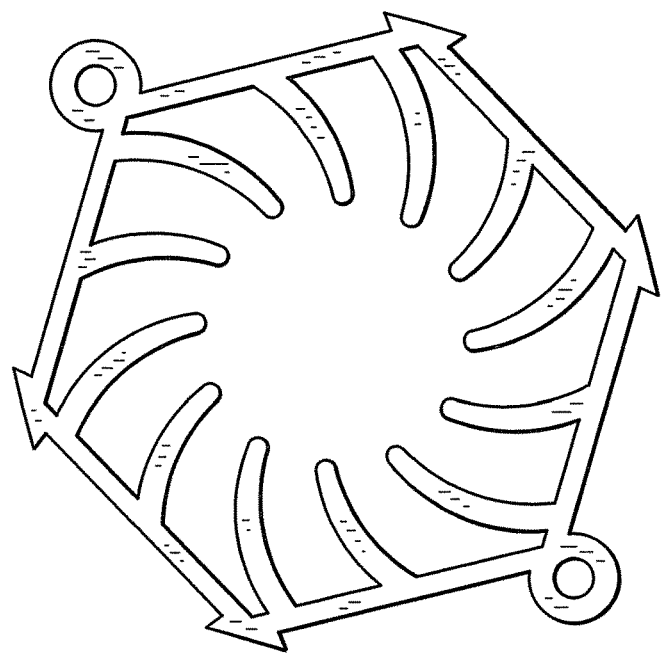

FIG. 32 is a top view of another heat sink structure according to the present inventive subject matter.

Figure 33:
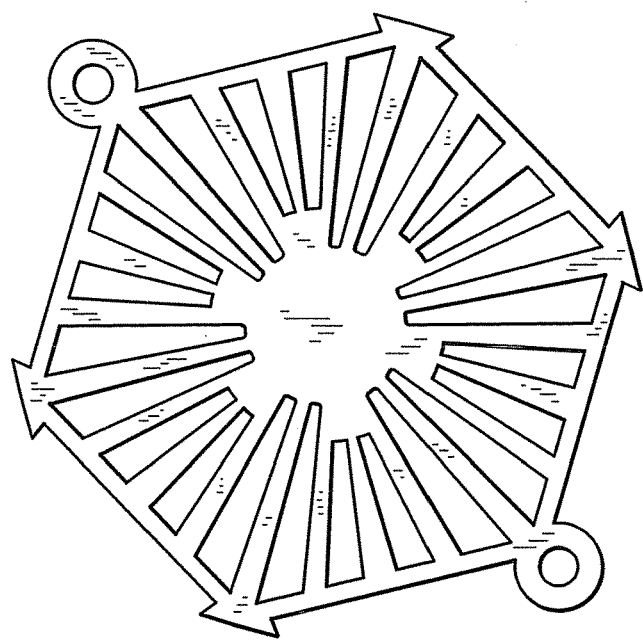

FIG. 33 is a top view of another heat sink structure according to the present inventive subject matter.

Figure 34:
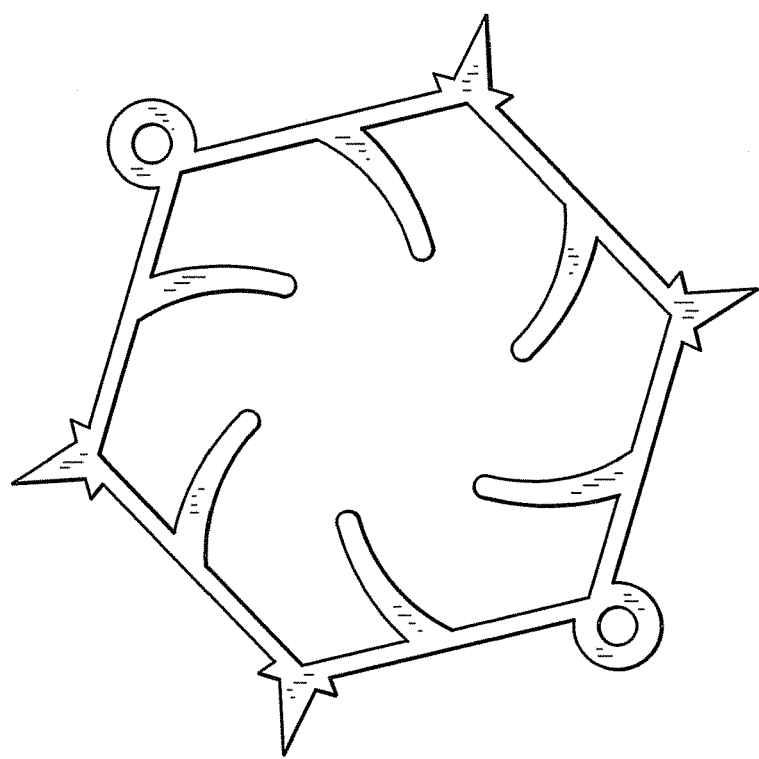

FIG. 34 is a top view of another heat sink structure according to the present inventive subject matter.

Figure 35:
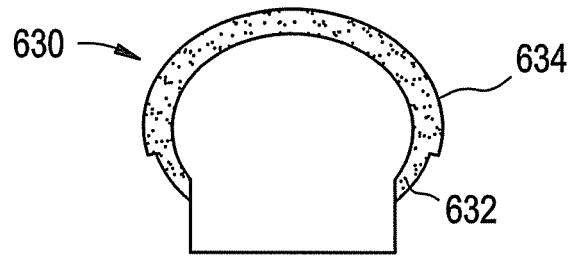

FIG. 35 is a schematic view depicting a diffuser dome 630.

Figure 36:
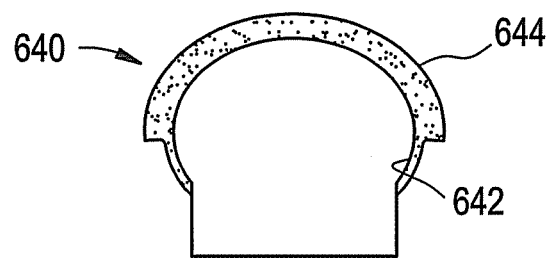

FIG. 36 is a schematic view depicting a diffuser dome 640.

Figure 37:
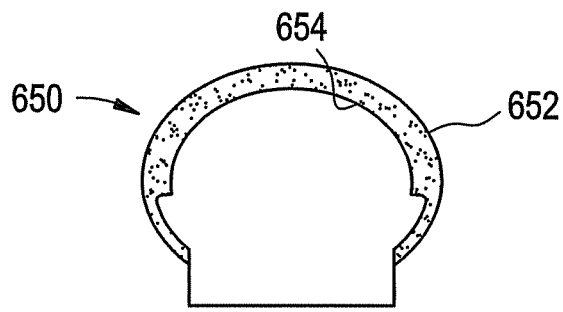

FIG. 37 is a schematic view depicting a diffuser dome 650.

Figure 38:
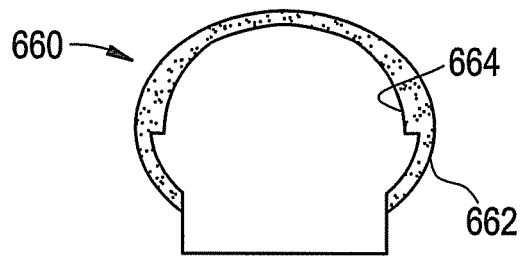

FIG. 38 is a schematic view depicting a diffuser dome 660.

Figure 39:
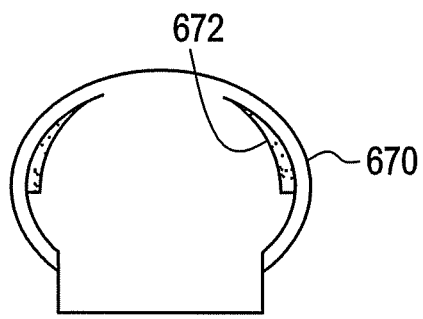

FIG. 39 is a schematic view depicting a diffuser dome 670.

Figure 40:
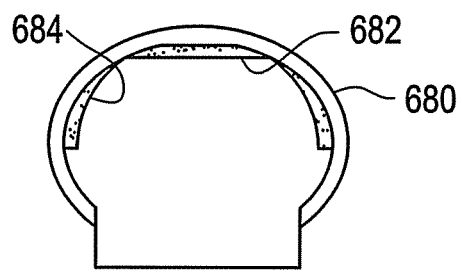

FIG. 40 is a schematic view depicting a diffuser dome 680.

DETAILED DESCRIPTION

The present inventive subject matter now will be described more fully with reference to the accompanying drawings, in which embodiments of the inventive subject matter are shown. However, this inventive subject matter should not be construed as being limited to the embodiments set forth herein. Rather, these embodiments are provided so that this disclosure will be thorough and complete, and will fully convey the scope of the inventive subject matter to those skilled in the art. Like numbers refer to like elements throughout.

As used herein the term "and/or" includes any and all combinations of one or more of the associated listed items.

All numerical quantities described herein are approximate and should not be deemed to be exact unless so stated.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When an element such as a layer, region or substrate is referred to herein as being "on", being mounted "on", being mounted "to", or extending "onto" another element, it can be in or on the other element, and/or it can be directly on the other element, and/or it can extend directly onto the other element, and it can be in direct contact or indirect contact with the other element (e.g., intervening elements may also be present). In contrast, when an element is referred to herein as being "directly on" or extending "directly onto" another element, there are no intervening elements present. Also, when an element is referred to herein as being "connected" or "coupled" to another element, it can be directly connected or coupled to the other element, or intervening elements may be present. In contrast, when an element is referred to herein as being "directly connected" or "directly coupled" to another element, there are no intervening elements present. In addition, a statement that a first element is "on" a second element is synonymous with a statement that the second element is "on" the first element.

The expression "in contact with", as used herein, means that the first structure that is in contact with a second structure is in direct contact with the second structure or is in indirect contact with the second structure. The expression "in indirect contact with" means that the first structure is not in direct contact with the second structure, but that there are a plurality of structures (including the first and second structures), and each of the plurality of structures is in direct contact with at least one other of the plurality of structures (e.g., the first and second structures are in a stack and are separated by one or more intervening layers). The expression "direct contact", as used in the present specification, means that the first structure which is "in direct contact" with a second structure is touching the second structure and there are no intervening structures between the first and second structures at least at some location.

A statement herein that two components in a device are "electrically connected," means that there are no components electrically between the components that affect the function or functions provided by the device. For example, two components can be referred to as being electrically connected, even though they may have a small resistor between them which does not materially affect the function or functions provided by the device (indeed, a wire connecting two components can be thought of as a small resistor); likewise, two components can be referred to as being electrically connected, even though they may have an additional electrical component between them which allows the device to perform an additional function, while not materially affecting the function or functions provided by a device which is identical except for not including the additional component; similarly, two components which are directly connected to each other, or which are directly connected to opposite ends of a wire or a trace on a circuit board, are electrically connected. A statement herein that two components in a device are "electrically connected" is distinguishable from a statement that the two components are "directly electrically connected", which means that there are no components electrically between the two components.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Relative terms, such as "lower", "bottom", "below", "upper", "top", "above," "horizontal" or "vertical" may be used herein to describe one element's relationship to another element as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower" can therefore encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can therefore encompass both an orientation of above and below.

The expression "illumination" (or "illuminated"), as used herein when referring to a solid state light emitter, means that at least some current is being supplied to the solid state light emitter to cause the solid state light emitter to emit at least some light. The expression "illuminated" encompasses situations where the solid state light emitter emits light continuously, or intermittently at a rate such that a human eye would perceive it as emitting light continuously or intermittently, or where a plurality of solid state light emitters of the same color or different colors are emitting light intermittently and/or alternatingly (with or without overlap in "on" times) in such a way that a human eye would perceive them as emitting light continuously or intermittently (and, in some cases where different colors are emitted, as separate colors or as a mixture of those colors).

The expression "excited", as used herein when referring to luminescent material, means that at least some electromagnetic radiation (e.g., visible light, UV light or infrared light) is contacting the luminescent material, causing the luminescent material to emit at least some light. The expression "excited" encompasses situations where the luminescent material emits light continuously, or intermittently at a rate such that a human eye would perceive it as emitting light continuously or intermittently, or where a plurality of luminescent materials that emit light of the same color or different colors are emitting light intermittently and/or alternatingly (with or without overlap in "on" times) in such a way that a human eye would perceive them as emitting light continuously or intermittently (and, in some cases where different colors are emitted, as a mixture of those colors).

The expression "lamp", as used herein, is not limited, except that it indicates a device that is capable of emitting light. That is, a lamp can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting, work lights, etc., mirrors/vanity lighting, or any other light emitting device.

The present inventive subject matter further relates to an illuminated enclosure (the volume of which can be illuminated uniformly or non-uniformly), comprising an enclosed space and at least one lamp according to the present inventive subject matter, wherein the lamp illuminates at least a portion of the enclosed space (uniformly or non-uniformly).

Some embodiments of the present inventive subject matter comprise at least a first power line, and some embodiments of the present inventive subject matter are directed to a structure comprising a surface and at least one lamp corresponding to any embodiment of a lamp according to the present inventive subject matter as described herein, wherein if current is supplied to the first power line, and/or if at least one solid state light emitter in the lamp is illuminated, the lamp would illuminate at least a portion of the surface.

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lamp as described herein.

The expression "substantially linear", as used herein, means that (1) a line connecting any pair of points which are both located in the region which is substantially linear and which points are spaced by at least one fifth of the length of the region, and (2) a line connecting any other pair of points in the region which is substantially linear and which points are spaced by at least one fifth of the length of the region, define an angle not greater than 5 degrees.

The expression "plane of substantial symmetry", as used herein, when referring to a structure (e.g., "the first heat sink region has a first major surface that extends in a first plane of substantial symmetry") can refer to a plane relative to which the structure is substantially symmetrical. In instances where the structure is not substantially symmetrical relative to any plane, the expression "plane of substantial symmetry" can refer to (1) a plane relative to which two or more like sub-structures (or structures that provide like functions) are equidistant, (2) a plane in which the mass of the structure on opposite sides of the plane is substantially the same (3) a plane that passes through a center of gravity of the structure, and/or (4) a plane that is perpendicular to a line about which rotation of the structure would be substantially balanced and on which the mass of the structure on opposite sides of the plane is substantially the same.

The expression "major surface" as used herein, means a surface which has a surface area which comprises at least 25% of the surface area of the entire structure, and in some cases at least 40% of the surface area of the entire structure (e.g., each of the top and bottom surfaces of a substantially flat thin structure having substantially parallel top and bottom surfaces).

The expression "thickness" as used herein with respect to a structure that has opposite major surfaces, means a minimum distance from a point on one major surface to a point on an opposite major surface.

The expression "substantially transparent", as used herein, means that the structure which is characterized as being substantially transparent allows passage of at least 90% of incident visible light.

The expression "substantially translucent", as used herein, means that at least 95% of the structure which is characterized as being substantially translucent allows passage of at least some light.

The expression "substantially co-planar", as used herein, in connection with a first surface and a second surface, means that:
　at least 90% of the points in the first surface are located on one first surface plane or between a pair of first surface planes which are parallel and which are spaced from each other by a distance of not more than 5% of the largest dimension of the first surface;
　at least 90% of the points in the second surface are located on one second surface plane or between a pair of second surface planes which are parallel and which are spaced from each other by a distance of not more than 5% of the largest dimension of the second surface; and
　the first surface plane or planes define an angle (or angles) of not more than 10 degrees relative to the second surface plane or planes.

The expression "emission plane" (e.g., "emission plane of a solid state light emitter"), as used herein, means (1) a plane that is perpendicular to an axis of the light emission from the solid state light emitter (e.g., in a case where light emission is hemispherical, the plane would be along the flat part of the hemisphere; in a case where light emission is conical, the plane would be perpendicular to the axis of the cone), (2) a plane that is perpendicular to a direction of maximum brightness of light emission from the solid state light emitter (e.g., in a case where the maximum light emission is vertical, the plane would be horizontal), (3) a plane that is perpendicular to a mean direction of light emission (in other words, if the maximum brightness is in a first direction, but a brightness in a second direction ten degrees to one side of the first direction is larger than a brightness in a third direction ten degrees to an opposite side of the first direction, the mean direction of light emission would be moved somewhat toward the second direction as a result of the brightnesses in the second direction and the third direction).

Unless otherwise defined, all terms (including technical and scientific teems) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As indicated above, some aspects of the present inventive subject matter relate to heat sink structures, and some embodiments in accordance with the present inventive subject matter comprise one or more heat sink structures.

In some embodiments in accordance with the present inventive subject matter, which can include or not include any of the other features and/or aspects described herein, a heat sink structure can comprise any suitable material and can be of any suitable shape and size. In some embodiments in accordance with the present inventive subject matter, the heat sink structure(s) can be made of any suitable thermally conductive material or combination of materials. Representative examples of suitable thermally conductive materials include extruded aluminum, forged aluminum, copper, thermally conductive plastics or the like. As used herein, a thermally conductive material refers to a material that has a thermal conductivity greater than air. In some embodiments, the heat sink structure(s) can be made of a material with a thermal conductivity of at least about 1 W/(m K), in some cases at least about 10 W/(m K), and in some cases at least about 100 W/(m K).

In some embodiments in accordance with the present inventive subject matter, which can include or not include any of the other features and/or aspects described herein, a heat sink structure can comprise at least first and second heat sink regions. For example, in the embodiment depicted in FIG. 1 (as well as in the embodiments depicted in FIGS. 2-11, 14, 19 and 23-34), the heat sink structure comprises six heat sink regions (i.e., first, second, third, fourth, fifth and sixth heat sink structures). The present inventive subject matter encompasses heat sink structures that have any suitable number of heat sink regions (e.g., three heat sink regions, four heat sink regions, five, six, seven, eight, nine, ten, etc. heat sink regions), and the inventive subject matter also encompasses lighting elements that comprise such heat sink structures, and methods of making such heat sink structures and/or such lighting elements. The present inventive subject matter encompasses heat sink structures in which heat sink regions are arranged to form regular shapes (e.g., regular hexagons, equilateral triangles, regular squares, regular pentagons, regular heptagons, regular octagons, etc.) or irregular shapes (e.g., irregular hexagons, non-equilateral triangles, irregular squares, irregular pentagons, irregular heptagons, irregular octagons, etc.), and the inventive subject matter also encompasses lighting elements that comprise such heat sink structures, and methods of making such heat sink structures and/or such lighting elements.

In some embodiments in accordance with the present inventive subject matter that comprise one or more heat sink regions, a heat sink region can be of any suitable shape and size. A heat sink region (if included) can be made of any suitable thermally conductive material or combination of materials (see the discussion above of thermally conductive materials and representative examples of suitable thermally conductive materials).

Figure 1:
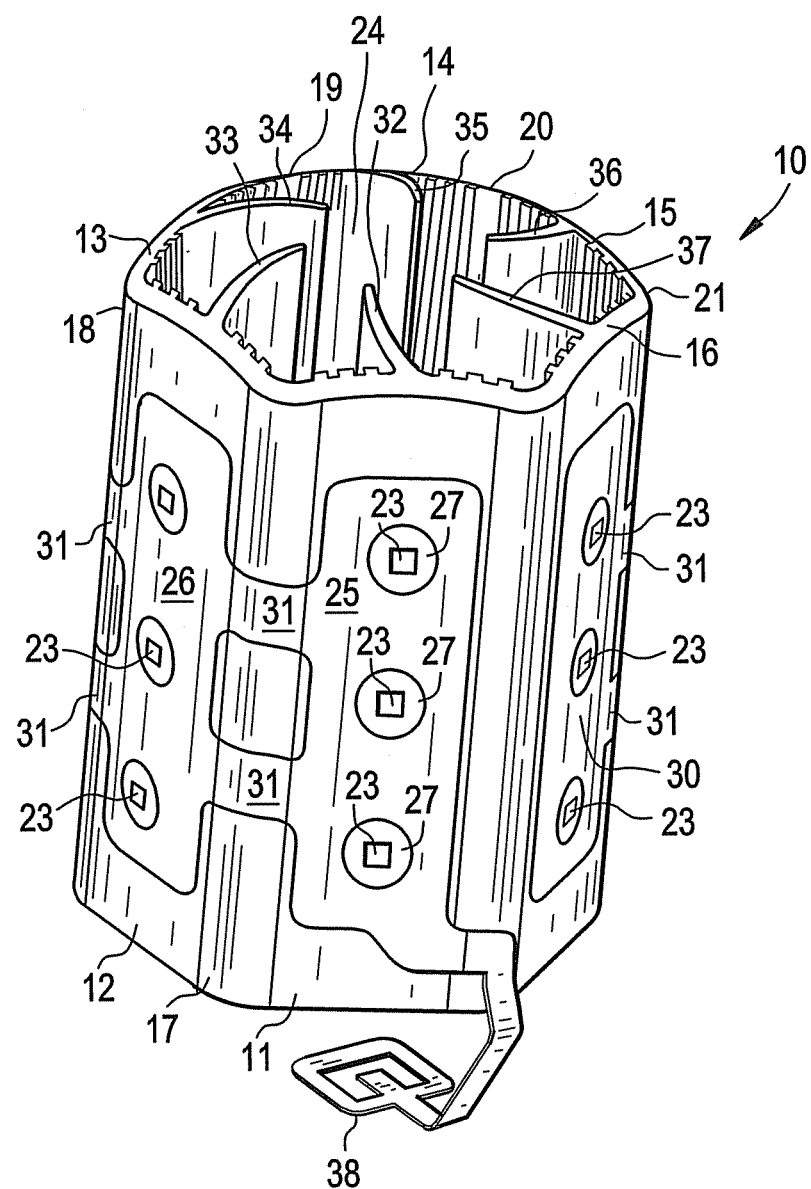
FIG. 1 depicts a heat sink structure according to the present inventive subject matter.

For example, in the embodiment depicted in FIG. 1, the heat sink structure comprises first, second, third, fourth, fifth and sixth heat sink regions 11-16 that together define an internal space 24, with fold regions 17-21 between each pair of adjacent heat sink regions, and each of the heat sink regions is substantially flat and has major surfaces that have planes of symmetry in planes that differ by about 60 degrees from the planes of symmetry defined by the major surfaces of other heat sink regions (i.e., the intersection between (1) a plane defined perpendicular to the planes defined by the major surfaces and (2) the heat sink regions 11-16 would define a six-sided (hexagonal) ring. Opposite edges of each of the heat sink regions (i.e., the edges that extend along the respective fold regions) each abut edges of adjacent heat sink regions (e.g., in the arrangement shown in FIG. 1 in the orientation shown in FIG. 1, the left edge of the heat sink region 11 abuts the right edge of the heat sink region 12 along the fold region 17.

One or more heat sink regions, if included, can comprise any suitable texturing, e.g., ridges, valleys, roughened regions, nodules, protrusions, indentations, etc., e.g., to increase the surface area of heat dissipation and/or to increase the turbulence of flow of ambient fluid through the heat sink structure, so as to achieve increased heat transfer from the walls of the heat sink structure.

As suitable, any heat sink region can be integral with any other heat sink region or regions, and/or can be attached to any other heat sink region or heat sink regions in any suitable way or ways (e.g., by melting, welding, with adhesive, with screws, with bolts, with rivets, with staples, etc.).

In some embodiments in accordance with the present inventive subject matter, which can include or not include any of the other features and/or aspects described herein, a heat sink structure can comprise at least, a first internal flow guide structure that can define an internal flow conduit. An internal flow guide structure (if included) can be of any suitable shape and size. An internal flow guide structure (if included) can be made of any suitable thermally conductive material or combination of materials (see the discussion above of thermally conductive materials and representative examples of suitable thermally conductive materials).

Figure 2:
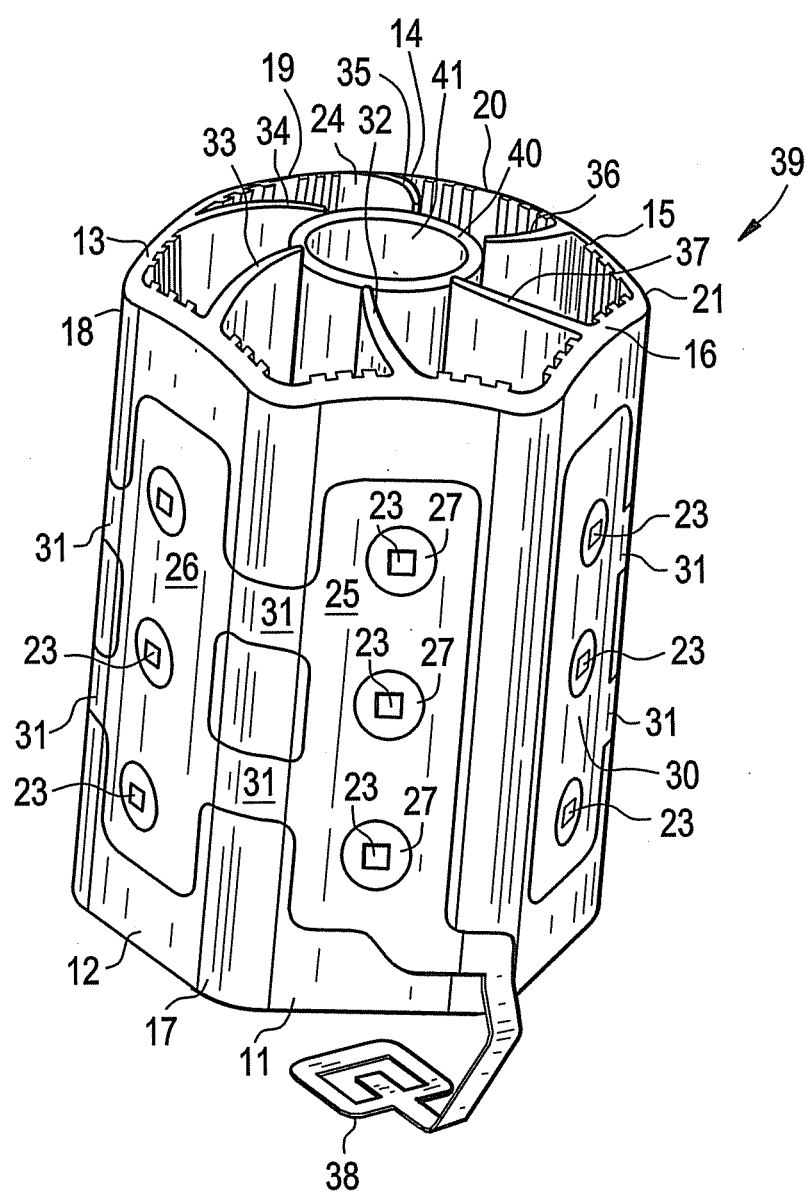
FIG. 2 depicts a heat sink structure according to the present inventive subject matter.

For example, the embodiment depicted in FIG. 2 comprises an internal flow guide structure 40 that defines an internal flow conduit 41. The internal flow guide structure 40 is tubular, and it extends through the internal space 24 defined by the heat sink regions 11-16.

One or more internal flow guide structures, if included, can comprise any suitable texturing, e.g., ridges, valleys, roughened regions, nodules, protrusions, indentations, etc., e.g., to increase the surface area of heat dissipation and/or to increase the turbulence of flow of ambient fluid through the heat sink structure, so as to achieve increased heat transfer from the walls of the heat sink structure.

In some embodiments in accordance with the present inventive subject matter, which can include or not include any of the other features and/or aspects described herein, a heat sink structure can comprise at least a first heat dissipation element.

A heat dissipation element (if included) can be of any suitable shape and size. For example, a heat dissipation element can be a relatively flat and straight structure of relatively uniform thickness, or it can refer to a structure of any other suitable shape. In some embodiments, one or more heat dissipation elements can be provided in the form of one or more fins, and/or one or more pins. In some embodiments, e.g., in embodiments where the general direction of flow of ambient fluid can be predicted, fins might be preferred (especially where ambient fluid flow is convective), whereas in situations where the general direction of flow of ambient fluid cannot be predicted (e.g., it might be front to back, or it might be left to right, or in some cases it might be in some other direction), pins might be very useful (e.g., to avoid excessive inhibition of flow of the ambient fluid and/or to provide a high ratio of surface area for heat exchange per unit volume).

A heat dissipation element (if included) can be made of any suitable thermally conductive material or combination of materials (see the discussion above of thermally conductive materials and representative examples of suitable thermally conductive materials). A heat dissipation element (if included) can be integral with one or more heat sink regions, and/or can be attached to one or more heat sink regions in any suitable way or ways (e.g., by melting, welding, with adhesive, with screws, with bolts, with rivets, with staples, etc.), and/or can be integral with one or more internal flow guide structures and/or other heat dissipation element(s) (if included), and/or can be attached to one or more internal flow guide structures and/or other heat dissipation element(s) in any suitable way or ways.

For example, the embodiment depicted in FIG. 1 comprises six heat dissipation elements 32-37 that each curl in two dimensions (i.e., in the shape that would be obtained by curling a rectangular shape relative to a line parallel to a plane in which the rectangular shape was present prior to curling it), in which each of the heat dissipation elements 32-37 is integral with one of the heat sink regions 11-16, respectively.

In another example, the embodiment depicted in FIG. 2 comprises six heat dissipation elements 32-37 that each curl in two dimensions, in which a first end of each of the heat dissipation elements 32-37 is integral with one of the heat sink regions 11-16, respectively, and in which a second end of each of the heat dissipation elements 32-37 is integral with the internal flow guide structure 40.

Similarly, the embodiment depicted in FIG. 8 comprises six heat dissipation elements that each curl in two dimensions, in which each of the heat dissipation elements is integral with one of the heat sink regions, respectively, and the embodiment depicted in FIG. 9 comprises six heat dissipation elements that each curl in two dimensions, in which a first end of each of the heat dissipation elements is integral with one of six heat sink regions, respectively, and in which a second end of each of the heat dissipation elements is integral with an internal flow guide structure.

In another example, the embodiment depicted in FIG. 10 comprises six heat dissipation elements 73 that are not curled, in which a first end of each of the heat dissipation elements 73 is integral with one of six heat sink regions 72, respectively, and in which a second end of each of the heat dissipation elements 73 is integral with an internal flow guide structure 74.

One or more heat dissipation elements, if included, can comprise any suitable texturing, e.g., ridges, valleys, roughened regions, nodules, protrusions, indentations, etc., e.g., to increase the surface area of heat dissipation and/or to increase the turbulence of flow of ambient fluid through the heat sink structure, so as to achieve increased heat transfer from the walls of the heat sink structure.

In some embodiments of lamps according to the present inventive subject matter, which may include or not include any other feature described herein, when power is supplied to a lamp (or lighting element), one or more solid state light emitters generate heat that is dissipated in ambient medium located inside an internal space defined by a heat sink structure, causing convective flow, i.e., causing the ambient medium located inside the internal space to absorb heat, which causes the ambient medium located inside the internal space to rise and exit through at least a first opening (e.g., an upper opening), which thereby generates negative pressure within the internal space and which causes ambient medium that is outside the internal space to enter at least a second opening (e.g., a lower opening) into the internal space. In some cases where convective flow occurs, the fluid flow comprises a comparatively cool central core and warmer outer regions closer to and contacting comparatively warm (or hot) walls of the heat sink structure and/or heat dissipation elements (or other structures from which heat is being removed).

In some embodiments in accordance with the present inventive subject matter, which can include or not include any of the other features and/or aspects described herein, a heat sink structure can be provided that provides space (e.g., one or more plenums) for ambient fluid in any suitable shape. For example, some embodiments of the present inventive subject matter can include an internal space that comprises at least one plenum that is substantially straight, and into which one or more fins protrude (e.g., in some embodiments of the present inventive subject matter, a plurality of sections taken through respective planes, that are each perpendicular to an axis of heat sink structure, would all look like the view depicted in FIG. 8 (or the view depicted in FIG. 9, or the view depicted in FIG. 10)). Some embodiments can include an internal space that comprises one or more plenums that is/are other than straight. For example, in some embodiments, one or more plenums can be provided that have a venturi shape (i.e., a shape that is commonly used to create a venturi effect), particularly in embodiments where ambient (or other) fluid flow is very fast. Persons of skill in the art are familiar with a wide variety of possible plenum shapes that might be employed (e.g., tapering in to smaller diameter from an inlet end to an outlet end, tapering out to larger diameter from an inlet end to an outlet end, convex, concave, tapered islands in the flow path, partially frustoconical and partially straight, etc. In embodiments where convective flow is desired, it might be useful for the plenum (or plenums) to be shaped so as to minimize turbulence and create substantially laminar, substantially uniform flow. Persons of skill in the art are familiar with testing various shapes to seek particular types of flow, and are readily able to do so. In many embodiments, the heat sink structure will be provided for use in any of a variety of orientations, so it will not necessarily be known which end of a plenum will be up and/or the degree of tilt. These factors can be important in determining the desired shape of one or more plenum (e.g., if the heat sink structure might be installed in an upright orientation or in an inverted orientation (i.e., rotated 180 degrees so the lowest point becomes the highest point and the highest point becomes the lowest point)), it can be beneficial for each end of the plenum (or each plenum) to be roughly the same size as the other end (and for the plenum to be at least as large along its length), as discussed above.

In other representative examples, some embodiments of the present inventive subject matter can include a heat sink structure that comprises plurality of plenums (and optionally one or more heat dissipation elements that protrude into one or more plenums) in a honeycomb structure, i.e., a structure in which a number of plenums are closely packed together and are separated from one another by plenum walls. In some of such honeycomb structures, the plenums can be substantially straight (e.g., a plurality of sections, that are each perpendicular to an axis of the lamp and that are taken through respective planes that are spaced from each other, would all look similar, showing a plurality of open plenum regions separated from each other by plenum walls).

In other representative examples, some embodiments of the present inventive subject matter can include a heat sink structure that comprises one or more spiral plenums, e.g., a heat sink structure that includes one or more plenums that are twisted (i.e., that can be envisioned by starting with one or more straight plenums and then twisting one or more portions of the heat sink structure—the degree of twisting per unit distance in the axial direction can be substantially uniform or non-uniform). The provision of a spiral plenum (or plenums) might inhibit ambient fluid flow through the heat sink structure (particularly in embodiments that do not include any active cooling components), but can provide increased surface area for heat exchange between the walls of the heat dissipation region and the ambient fluid passing through the heat sink structure.

In other representative examples, some embodiments of the present inventive subject matter can include a heat sink structure that comprises an open pore structure, a sponge-like structure (e.g., a solid-metal sponge), or any other structure through which fluid can pass in respective pathways that are not straight or regular. Persons of skill in the art are familiar with a wide variety of open pore structures, sponge-like structures and other structures through which fluid can pass in respective pathways, and any of such structures can be employed in the devices according to the present inventive subject matter.

In some embodiments of the present inventive subject matter, one or more of the surfaces of the heat sink structure, or one or more portions thereof, can be patterned so as to reduce turbulence and/or to otherwise assist in generating convective flow of ambient fluid (and/or to allow forced air to flow with less resistance). Persons of skill in the art are familiar with a variety of patterning that can be employed to reduce turbulence and/or to otherwise assist in generating convective flow, and any of such patterning can be employed in the devices according to the present inventive subject matter.

As indicated above, some embodiments in accordance with the present inventive subject matter can comprise one or more circuit boards. A circuit board (if included) can be of any suitable shape and size. A circuit board (if included) can be made of any suitable material or combination of materials (as is well known, a circuit board typically includes some regions that are non-conducting as well as structures that conduct electricity). Persons of skill in the art are familiar with a wide variety of circuit boards, and any such circuit boards can be employed in the devices according to the present inventive subject matter. One representative example of a circuit board with a relatively high heat conductivity is a metal core printed circuit board, with conductive traces (comprising, e.g., copper) printed thereon.

In some embodiments in accordance with the present inventive subject matter, which can include or not include any of the other features and/or aspects described herein, there can be provided at least one circuit board that comprises two or more circuit board regions. In some of such embodiments, at least a first circuit board region can be at least partially on a first heat sink region and at least a second circuit board region can be at least partially on a second heat sink region, with the first and second circuit board regions integral with each other (e.g., via one or more connection regions). For example, in the embodiment depicted in FIG. 1, the circuit board comprises first, second, third, fourth, fifth and sixth circuit board regions, each on one of the respective heat sink regions 11-16 with connection regions 31 connecting the first circuit board region 25 with the second circuit board region 26, the second circuit board region 26 with the third circuit board region, the third circuit board region with the fourth circuit board region, the fourth circuit board region with the fifth circuit board region, and the fifth circuit board region with the sixth circuit board region 30, so that the first, second, third, fourth, fifth and sixth circuit board regions are integral.

In some embodiments that comprise two or more circuit board regions, electricity supplied to one of the circuit board regions can be conducted, through circuitry (e.g., traces) in the circuit board, to one or more other circuit board regions (for example, in the embodiment depicted in FIG. 1, electricity supplied to the first circuit board region 25 can be conducted to the sixth circuit board region 30 via the second, third, fourth and fifth circuit board regions).

A circuit board (if included) can be flexible, so that in some embodiments, as discussed below, a circuit board can be mounted flat on a flat heat sink structure that comprises two or more heat sink regions (any or all of which can be separate from or integral with one or more neighboring heat sink regions), with two or more circuit board regions on two or more respective heat sink regions, and at a later time (e.g., after solid state light emitters are mounted on the circuit board and after testing the solid state light emitters), (1) the heat sink regions can be pivoted relative to one another (e.g., one or more heat sink regions can be pivoted relative to one or more respective line segments that each extend between two heat sink regions or along which two heat sink regions abut), thereby bending the flexible circuit board along such line segment(s), or (2) the heat sink structure can be bent (along with the circuit board) along one or more fold line segments, causing the heat sink regions as well as the circuit board regions to pivot relative to one another, without destroying or degrading the circuit board, any components thereon, or the performance or integrity thereof. For example, in some embodiments, a flexible circuit board can be bent along one or more line segments, whereby two or more heat sink regions (which are not integral with one another) that are attached to the flexible circuit board (e.g., by being bonded or otherwise attached to the flexible circuit board) pivot relative to each other along the one or more line segments (e.g., a flexible circuit board can be bent into a hexagonal shape with six circuit board regions, and respective pairs of discrete heat sink regions (six in total, each one attached to one of the six circuit board regions) pivot relative to one another along five line segments that extend between the respective pairs of adjacent heat sink regions and are held in place relative to one another by virtue of their being attached to the flexible circuit board). In other embodiments, for example, two or more heat sink regions are provided in a single integral heat sink structure that can be attached to a flexible circuit board, and the flexible circuit board and the heat sink structure are bent together along line segments that extend between respective heat sink regions and circuit board regions, with the heat sink structure being bent along one or more fold regions (e.g., a flexible circuit board and a heat sink structure can together be bent along five line segments (coinciding with five fold regions of the heat sink structure) to form a hexagonal structure).

The expression "flexible" as used herein with respect to a circuit board (or other structure), means that the structure can be bent along at least one line segment without causing it to be unable to perform its intended function. For example, a flexible circuit board can be capable of being bent so that regions on opposite sides of a conceptual line segment can pivot relative to one another by 20 degrees or more without disrupting or altering the performance of circuitry on each of the regions on opposite sides of the conceptual line segment (and in some embodiments, the flexible circuit board can be bent in such a way 20 times or more without disrupting or altering the performance of circuitry on each of the regions on opposite sides of the conceptual line segment, and/or circuitry on both sides of the conceptual line segment is electrically connected to each other across the conceptual line segment where the folding occurs, and/or such bending can be carried out along a plurality of conceptual line segments in different locations, and/or if the flexible circuit board is held horizontally with ten or more inches of standout (i.e., it extends at least ten inches from where it is being held), gravity alone will cause at least a portion of the remote end to move to a location that defines, together with the location where the flexible circuit board is being held, a plane that defines an angle of at least 15 degrees relative to horizontal.

Persons of skill in the art are familiar with and have access to a variety of flexible circuit boards ("flex circuit boards") that are commercially available, and persons of skill in the art can readily make flexible circuit boards. Representative examples of materials that persons of skill in the art recognize can be used in making flexible circuit boards include polyimide materials (e.g., Kapton® from DuPont), polyimide laminates (e.g., Pyralux® from DuPont), polyester (e.g., Mylar® from DuPont), and flexible thermal substrates (e.g., flexible thermal substrates for metal core printed circuit boards, such as Coolam™ from DuPont). Copper is an example of a conductive material that can used in making flexible circuit boards, and that can be provided in a thickness such that it is conductive, yet flexible and robust. Representative examples of flexible circuit boards can be found at http://www.flexcircuitsinc.com/index.html?gclid=COCMlejbvKQCFQ5O2godfjrW0Q and at http://www.allianceflextech.com/products_detail.php?ProID=3.

Some embodiments can comprise one or more structures that facilitate making electrical connection with a circuit board (if included) at some stage during assembly or operation thereof, e.g., one or more flex tails (one flex tail can have plural electrical connections, e.g., positive and negative or three or more connections, e.g., to provide for any suitable electrical arrangement of solid state light emitters on plural circuit board regions; and the flex tail (or each of the flex tails) can be readily inserted into a receiving structure, e.g., a locking mechanism) or wires, etc., e.g., a power supply element can be electrically connected to a circuit board with a single connection or with any other suitable number of connections.

As indicated above, some embodiments in accordance with the present inventive subject matter can comprise one or more solid state light emitters.

In some embodiments that comprise two or more solid state light emitters and two or more heat sink regions, a first solid state light emitter can be on a first heat sink region (e.g., mounted on a first circuit board region that is on the first heat sink region) and a second solid state light emitter can be on a second heat sink region (e.g., mounted on a second circuit board region that is on the second heat sink region). For example, in the embodiment depicted in FIG. 1, three solid state light emitters 23 are mounted on each of the six circuit board regions (which are in turn on the heat sink regions 11-16, respectively), on surfaces of the heat sink regions 11-16 that are opposite from surfaces of the heat sink regions 11-16 heat sink structure that face the internal space 24.

Persons of skill in the art are familiar with, and have ready access to, a wide variety of solid state light emitters, and any suitable solid state light emitter (or solid state light emitters) can be employed in the lamps and lighting elements according to the present inventive subject matter. A variety of solid state light emitters are well known, and any of such light emitters can be employed according to the present inventive subject matter. Representative examples of solid state light emitters include light emitting diodes (inorganic or organic, including polymer light emitting diodes (PLEDs)) with or without luminescent materials.

Persons of skill in the art are familiar with, and have ready access to, a variety of solid state light emitters that emit light having a desired peak emission wavelength and/or dominant emission wavelength, and any of such solid state light emitters (discussed in more detail below), or any combinations of such solid state light emitters, can be employed in embodiments that comprise a solid state light emitter.

Light emitting diodes are semiconductor devices that convert electrical current into light. A wide variety of light emitting diodes are used in increasingly diverse fields for an ever-expanding range of purposes. More specifically, light emitting diodes are semiconducting devices that emit light (ultraviolet, visible, or infrared) when a potential difference is applied across a p-n junction structure. There are a number of well known ways to make light emitting diodes and many associated structures, and the present inventive subject matter can employ any such devices.

A light emitting diode produces light by exciting electrons across the band gap between a conduction band and a valence band of a semiconductor active (light-emitting) layer. The electron transition generates light at a wavelength that depends on the band gap. Thus, the color of the light (wavelength) (and/or the type of electromagnetic radiation, e.g., infrared light, visible light, ultraviolet light, near ultraviolet light, etc., and any combinations thereof) emitted by a light emitting diode depends on the semiconductor materials of the active layers of the light emitting diode.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

Lamps and lighting elements according to the present inventive subject matter (and/or solid state light emitters used therein) can, if desired, further comprise one or more luminescent materials.

A luminescent material is a material that emits a responsive radiation (e.g., visible light) when excited by a source of exciting radiation. In many instances, the responsive radiation has a wavelength that is different from the wavelength of the exciting radiation.

Luminescent materials can be categorized as being down-converting, i.e., a material that converts photons to a lower energy level (longer wavelength) or up-converting, i.e., a material that converts photons to a higher energy level (shorter wavelength).

One type of luminescent material are phosphors, which are readily available and well known to persons of skill in the art. Other examples of luminescent materials include scintillators, day glow tapes and inks that glow in the visible spectrum upon illumination with ultraviolet light.

Persons of skill in the art are familiar with, and have ready access to, a variety of luminescent materials that emit light having a desired peak emission wavelength and/or dominant emission wavelength, or a desired hue, and any of such luminescent materials, or any combinations of such luminescent materials, can be employed, if desired.

One or more luminescent materials (if included) can be provided in any suitable form. For example, luminescent material can be embedded in a resin (i.e., a polymeric matrix), such as a silicone material, an epoxy material, a glass material or a metal oxide material, and/or can be applied to one or more surfaces of a resin, to provide a lumiphor.

One or more solid state light emitters (if included) can be arranged in any suitable way.

In general, light of any number of colors can be mixed by the lamps and lighting elements according to the present inventive subject matter.

As indicated above, some embodiments in accordance with the present inventive subject matter can comprise one or more encapsulant. An encapsulant (if included) can be of any suitable shape and size. An encapsulant (if included) can be made of any suitable material or combination of materials.

In some embodiments that comprise one or more solid state light emitters and one or more encapsulant, at least one encapsulant can cover at least a portion of at least one solid state light emitter. For example, in the embodiment depicted in FIG. 1, each of the solid state light emitters 23 is covered by an encapsulant 27; in the embodiment depicted in FIG. 3, the solid state light emitter 44 is covered by an encapsulant 45; and in the embodiment depicted in FIG. 4, each of the solid state light emitters 49 is covered by an encapsulant 50.

In some embodiments that comprise one or more solid state light emitters and one or more encapsulant, an encapsulant can cover at least a portion of at least one solid state light emitter, and can extend more than twice as far in at least one direction along an emission plane of the solid state light emitter as it extends in a direction perpendicular to the emission plane of the solid state light emitter. By providing such an encapsulant, light emitted from the solid state light emitter(s) can be directed in a wider range of directions, and/or a greater proportion of such light can be directed in directions closer to parallel to the emission plane, and/or a wider viewing angle can be obtained. For example, in the embodiment depicted in FIG. 3, the solid state light emitter 44 has an emission plane that is substantially parallel to the upper surface of the circuit board 43, and the encapsulant 45 is substantially dome-shaped, and it extends more than twice as far in a horizontal direction along the emission plane of the solid state light emitter 44 as it extends in a direction perpendicular to the emission plane of the solid state light emitter 44 (i.e., upward in the orientation shown in FIG. 3).

As indicated above, some embodiments in accordance with the present inventive subject matter can comprise a base structure that comprises a base element, a base element cover, at least a first leg and a dish structure, the base element and the base element cover defining at least a first base chamber, at least a portion of the first leg between the base element cover and the dish structure, the first heat sink structure supported on the dish structure. In embodiments that comprise such a base structure, any two or more of the base element, the base element cover, the one or more leg and the dish structure can be integral or attached to one another in any suitable way or ways (e.g., by melting, welding, with adhesive, with screws, with bolts, with rivets, with staples, etc., and the base element, the base element cover, the one or more leg and the dish structure can individually be of any suitable shape and size, and can individually be made of any suitable material or combination of materials (e.g., representative examples of materials that any such components can comprise include thermally conductive materials (e.g., thermally conductive plastics), thermoplastic materials, polycarbonate materials, ceramic materials, aluminum and other metals). In some embodiments in accordance with the present inventive subject matter, which can include or not include any of the other features and/or aspects described herein, at least a portion of a dish structure can be translucent or substantially transparent, in order to allow light (e.g., light emitted by one or more solid state light emitter) to pass therethrough.

Some embodiments in accordance with the present inventive subject matter can comprise one or more heat transfer media. A heat transfer medium, if included, can comprise any suitable material, (or combination of materials) a variety of which are well known (and readily accessible) to persons skilled in the art. Representative examples of materials that can be used (alone or in combination) as heat transfer media or to make heat transfer media include materials commonly referred to as potting compounds. Representative examples of suitable materials that can be used (alone or in combination) as heat transfer media or to make heat transfer media include epoxies (e.g., 2-part epoxies, UV-cured epoxies, heat cured epoxies), silicone rubbers (e.g., RTV (room temperature vulcanizing) silicone rubbers), polyurethanes, etc., optionally with one or more thermally conductive fillers (e.g., $AlO_2$, calcium carbonate, etc.). A representative example of a material that can be used (alone or with one or more other materials) is Dow Corning Sylgard160, a silicone elastomer containing quartz, dimethyl siloxane and dimethyl methylhydrogen siloxane. Other representative examples of such materials can be found at http://www.mgchemicals.com/downloads/pdf/specsheets/832TC.pdf? (2-part epoxy with aluminum oxide), http://www.mgchemicals.com/products/3331.html#specs (RTV silicone rubber compound), http://www.epoxies.com/tech/20-2366FR.pdf (polyurethane compound), http://www.epicresins.com/electrical_relays.asp (2-part epoxy system), etc.

Some embodiments in accordance with the present inventive subject matter can comprise one or more heat transfer media within a base chamber (if included).

As indicated above, some embodiments in accordance with the present inventive subject matter can comprise a power supply (which can comprise one or more power supply elements) or one or more power supply elements.

In some embodiments in accordance with the present inventive subject matter that comprise a power supply (or at least a first power supply element), a power supply (or a power supply element) can comprise any electronic component (or components) that are suitable for a lighting element or a lamp, for example, any of (1) one or more electrical components employed in converting electrical power (e.g., from AC to DC and/or from one voltage to another voltage), (2) one or more electronic components employed in driving one or more light source (such as one or more solid state light emitters), e.g., running one or more light source intermittently and/or adjusting the current supplied to one or more light sources in response to a user command, a detected change in brightness or color of light output, a detected change in an ambient characteristic such as temperature or background light, etc., and/or a signal contained in input power (e.g., a dimming signal in AC power supplied to the lighting device), etc., (3) one or more circuit boards (e.g., a metal core circuit board) for supporting and/or providing current to any electrical components, and/or (4) one or more wires connecting any components (e.g., connecting an Edison socket to a circuit board), etc., e.g. electronic components such as linear current regulated supplies, pulse width modulated current and/or voltage regulated supplies, bridge rectifiers, transformers, power factor controllers, etc.

For example, solid state lighting systems have been developed that include a power supply that receives the AC line voltage and converts that voltage to a voltage (e.g., to DC and to a different voltage value) and/or current suitable for driving solid state light emitters. Power supplies as discussed above can be employed.

Many different techniques have been described for driving solid state light sources in many different applications, including, for example, those described in U.S. Pat. No. 3,755,697 to Miller, U.S. Pat. No. 5,345,167 to Hasegawa et al, U.S. Pat. No. 5,736,881 to Ortiz, U.S. Pat. No. 6,150,771 to Perry, U.S. Pat. No. 6,329,760 to Bebenroth, U.S. Pat. No. 6,873,203 to Latham, II et al, U.S. Pat. No. 5,151,679 to Dimmick, U.S. Pat. No. 4,717,868 to Peterson, U.S. Pat. No. 5,175,528 to Choi et al, U.S. Pat. No. 3,787,752 to Delay, U.S. Pat. No. 5,844,377 to Anderson et al, U.S. Pat. No. 6,285,139 to Ghanem, U.S. Pat. No. 6,161,910 to Reisenauer et al, U.S. Pat. No. 4,090,189 to Fisler, U.S. Pat. No. 6,636,003 to Rahm et al, U.S. Pat. No. 7,071,762 to Xu et al, U.S. Pat. No. 6,400,101 to Biebl et al, U.S. Pat. No. 6,586,890 to Min et al, U.S. Pat. No. 6,222,172 to Fossum et al, U.S. Pat. No. 5,912,568 to Kiley, U.S. Pat. No. 6,836,081 to Swanson et al, U.S. Pat. No. 6,987,787 to Mick, U.S. Pat. No. 7,119,498 to Baldwin et al, U.S. Pat. No. 6,747,420 to Barth et al, U.S. Pat. No. 6,808,287 to Lebens et al, U.S. Pat. No. 6,841,947 to Berg-johansen, U.S. Pat. No. 7,202,608 to Robinson et al, U.S. Pat. No. 6,995,518, U.S. Pat. No. 6,724,376, U.S. Pat. No. 7,180,487 to Kamikawa et al, U.S. Pat. No. 6,614,358 to Hutchison et al, U.S. Pat. No. 6,362,578 to Swanson et al, U.S. Pat. No. 5,661,645 to Hochstein, U.S. Pat. No. 6,528,954 to Lys et al, U.S. Pat. No. 6,340,868 to Lys et al, U.S. Pat. No. 7,038,399 to Lys et al, U.S. Pat. No. 6,577,072 to Saito et al, and U.S. Pat. No. 6,388,393 to Illingworth.

In some embodiments that comprise at least one base structure (that comprises at least a first base chamber) and at least a first power supply element (and/or at least a first power supply), at least a portion of the first power supply element (or the first power supply) can be inside the first base chamber. In some of such embodiments:
  the base structure further comprises a base element and a base element cover, and portions along a first periphery of the base element cover (defined by regions of the base element cover that are in contact with the base element) are farther from the heat sink structure than portions of the base element cover that are spaced from the first periphery; and/or
  the portion (or more) of the first power supply element that is inside the first base chamber is embedded (or immersed) in heat transfer medium within the first base chamber.

For example, in the embodiment depicted in FIG. 4, the lamp 46 comprises a base structure (that comprises a base element 53, a base element cover 54, a plurality of legs 55, and a dish structure 56), and a power supply (that comprises a first power supply element 57 and a second power supply element 58). In addition, in the embodiment depicted in FIG. 4, the first power supply element 57 is embedded in heat transfer medium 59 within a base chamber 60 defined by the base element 53 and the base element cover 54, and the first power supply element 57 receives AC power (via the electrical connector 52), and outputs DC power to the second power supply element 58. In addition, as shown in FIG. 4, the middle of the base element cover 54 is dome-shaped, so that portions of the base element cover 54 along a periphery of the base element cover 54 (defined by regions of the base element cover 54 that are in contact with the base element 53) are farther from the heat sink structure 47 than portions of the base element cover 54 that are spaced from its periphery. As a result of the middle of the base element cover 54 being dome-shaped, additional volume is provided within the base chamber 60 for dissipating heat generated in the first power supply element 57.

In some embodiments that comprise at least a first power supply element (or at least a first power supply) and at least a first heat sink structure, at least the first power supply element (or at least the first power supply) can be on the first heat sink structure. For example, in the embodiment depicted in FIG. 4, the second power supply element 58 is on the heat sink structure 47 (mounted on one of the circuit board regions 48), and the second power supply element 58 receives DC power via the first power supply element 57, and outputs DC power which is sent to the solid state light emitters 49.

In some embodiments that comprise a base structure comprising a base chamber with at least one power supply element positioned therein, the base structure (or one or more components thereof) can comprise non-conductive thermoplastic to provide isolation of the one or more power supply element positioned within the base chamber. On the other hand, in some embodiments that comprise a base structure comprising a base chamber with at least one power supply element positioned therein, the base structure can comprise one or metal, such as aluminum, to provide additional heat dissipation and may optionally or alternatively be thermally coupled to a heat sink structure in any suitable way, for example, using a thermal interface gasket.

In some embodiments in accordance with the present inventive subject matter, only the portion of a power supply that converts AC power to DC power is in a base chamber, and the remainder of the power supply is on a single heat sink region of a heat sink structure.

The expression "thermally coupled", as used herein, means that heat transfer occurs between (or among) the two (or more) items that are thermally coupled. Such heat transfer encompasses any and all types of heat transfer, regardless of how the heat is transferred between or among the items. That is, the heat transfer between (or among) items can be by conduction, convection, radiation, or any combinations thereof, and can be directly from one of the items to the other, or indirectly through one or more intervening elements or spaces (which can be solid, liquid and/or gaseous) of any shape, size and composition. The expression "thermally coupled" encompasses structures that are adjacent to one another. In some situations/embodiments, the majority of the heat transferred from a lamp (or a lighting element) is transferred by conduction; in other situations/embodiments, the majority of the heat that is transferred from a lamp (or lighting element) is transferred by convection; and in some situations/embodiments, the majority of the heat that is transferred from a lamp (or lighting element) is transferred by a combination of conduction and convection.

Some embodiments in accordance with the present inventive subject matter can include one or more lenses (in some embodiments, a lens can provide diffusion). Persons of skill in the art are familiar with a wide variety of lenses, can readily envision a variety of materials out of which a lens can be made (e.g., polycarbonate materials, acrylic materials, blown glass), and are familiar with and/or can envision a wide variety of shapes that lenses can be. Any of such materials and/or shapes can be employed in a lens in an embodiment that includes a lens. As will be understood by persons skilled in the art, a lens in a lamp according to the present inventive subject matter can be selected to have any desired effect on incident light (or no effect), such as focusing, diffusing, etc.

In some embodiments in accordance with the present inventive subject matter, it was observed that some overall shapes for heat sink structures provided better optical properties for lamps (e.g., in some embodiments, it was observed that changing from an overall square shape (cross-sectional, perpendicular to an axis, e.g., a vertical axis in the orientation depicted in FIG. 4) to an overall hexagonal shape alleviated some optical issues (e.g., bright/dark banding).

In embodiments in accordance with the present inventive subject matter that include a lens (or plural lenses) that provide diffusion, the portion (or portions) that provide diffusion can be in any suitable location and orientation.

In embodiments in accordance with the present inventive subject matter that include a lens (or plural lenses), the lens (or lenses) can be positioned in any suitable location and orientation.

In some embodiments, one or more lenses can be provided to define a mixing cavity (or mixing cavities) in which one or more light emitters (e.g., solid state light emitters) can be provided. Any such mixing cavity (or mixing cavities) may act as a mixing chamber to combine light from the light emitters disposed within the mixing cavity, and any such lens (or lenses) may be transparent or diffusive. In some embodiments, a diffuser film (e.g., from Fusion Optix of Woburn, Mass., BrightView Technologies of Morrisville, N.C., Luminit of Torrance, Calif. or other diffuser film manufacturers) can be provided between light emitters and a lens (or lenses). Alternatively or additionally, a lens (or lenses), if included, may be diffusive, for example, by incorporating scattering material, patterning a diffusion structure on the lens(es) (e.g., by spraying one or more diffusers on an inside surface and/or an outside surface of a lens) or providing a diffusive film disposed within a mixing cavity or on a lens (or lenses). Diffuser structures having diffusive material within the lens may also be utilized. Diffusive materials that may be molded to form a desired lens shape and incorporate a diffuser are available from Bayer Material Science or SABIC. A mixing chamber (if included), or any other portion of any device described herein, may be lined with a reflector (specular or diffuse), such as a reflector plate, or may be made reflective (specular or diffuse) itself for any reason, e.g., to reflect any light that reaches or may reach a surface or region. A reflective interior of a cavity, if provided, may be diffuse to enhance mixing. Diffuse reflector materials are available from Furukawa Electric in Japan (e.g., under the name MCPET, i.e., white foamed sheets made of extra-fine, foamed polyethylene terephthalate (PET)), and/or from Furukawa Industries, and/or from Dupont Nonwovens. In some embodiments, by providing a mixing chamber that utilizes refractive and reflective mixing, spatial separation between light emitters (e.g., solid state light emitters) and a lens (or lenses) may be sufficient to allow for near field mixing of the light. In some embodiments, light emitters (e.g., solid state light emitters) may be obscured from view by a diffuser structure as described above such that the light emitters do not appear as point sources when the lamp is illuminated.

In some embodiments in which a lens is provided, the lens can be a unitary structure or can be in two or more pieces, which can be joined together or held together in any suitable way (e.g., by melting, welding, with adhesive, with screws, with bolts, with rivets, with staples, etc.).

Lamps in accordance with the present inventive subject matter can have any of a wide variety of components and/or materials, and arrangements of components and/or materials, to provide or to affect suitable properties, e.g., uniformity or pattern of color emission, uniformity or pattern of brightness of emission, CRI Ra, efficiency, product or component lifetime, rate and/or pattern of heat dissipation, etc.

For example, in some embodiments, one or more phosphor carriers and/or one or more diffusers can be provided which comprise any of a wide variety of materials and/or components, and can be positioned relative to other components in any suitable way. U.S. patent application Ser. No. 13/034,501 (filed Feb. 24, 2011) (U.S. Patent Publication No. 2012-0057327 A1) (now U.S. Pat. No. 9,057,511) and U.S. patent application Ser. No. 13/028,946 (filed Feb. 16, 2011) (U.S. Patent Publication No. 2011-0215699 A1)(now U.S. Pat. No. 9,062,830), the entireties of which are hereby incorporated by reference, disclose a variety of structures and components, including phosphor carriers, diffusers and other layers and components, any of which (or any combination of which) can be employed in lamps in accordance with the present inventive subject matter.

U.S. patent application Ser. No. 13/034,501 discloses embodiments in which a phosphor carrier is included on a heat sink, over and spaced apart from a light source, and in which a diffuser is also included on the heat sink, over and spaced apart from the phosphor carrier. The phosphor carrier and the diffuser can be substantially frusto-spherical, such that the phosphor carrier and diffuser provide a double-dome structure, so that the lamp fits within a standard size profile, and emits a substantially uniform emission pattern.

U.S. patent application Ser. No. 13/034,501 also discloses embodiments that comprise solid state emitters with remote conversion materials (or phosphors) and remote diffusing elements or diffuser(s). In some embodiments, the diffuser not only serves to mask the phosphor from the view by the lamp user, but can also disperse or redistribute the light from the remote phosphor and/or the lamp's light source into a desired emission pattern. In some embodiments, the diffuser dome can be arranged to disperse forward directed emission pattern into a more omnidirectional pattern useful for general lighting applications. The diffuser can be used in embodiments having two-dimensional as well as three-dimensional shaped remote conversion materials, with a combination of features capable of transforming forward directed emission from a light source (e.g., one or more light emitting diodes) into a beam profile comparable with standard incandescent bulbs.

U.S. patent application Ser. No. 13/034,501 also discloses embodiments of lamps that can have a dome-shaped (or frusto-spherical shaped) three dimensional conversion material (phosphor carrier) over and spaced apart from the light source(s). A dome-shaped diffuser can also be included that is spaced apart from and over the conversion material, such that the lamp exhibits a double-dome structure. The spaces between the various structures can comprise light mixing chambers that can promote not only dispersion of, but also color uniformity of the lamp emission. The space between the light source and conversion material, as well as the space between the conversion material, can serve as light mixing chambers. Other embodiments can comprise additional conversion materials or diffusers that can form additional mixing chambers. The order of the dome conversion materials and dome shaped diffusers can be different such that some embodiments can have a diffuser inside a conversion material, with the spaces between forming light mixing chambers. These are only a few of the many different possible conversion material and diffuser arrangements.

U.S. patent application Ser. No. 13/034,501 also discloses embodiments in which a conversion layer or region can comprise a phosphor carrier having a thermally conductive material that is at least partially transparent to light from the light source, and at least one phosphor material each of which absorbs light from the light source and emits a different wavelength of light. The diffuser can comprise a scattering film/particles and associated carrier such as a glass enclosure, and can serve to scatter or re-direct at least some of the light emitted by the light source and/or phosphor carrier to provide a desired beam profile. The properties of the diffuser, such as geometry, scattering properties of the scattering layer, surface roughness or smoothness, and spatial distribution of the scattering layer properties may be used to control various lamp properties such as color uniformity and light intensity distribution as a function of viewing angle. By masking the phosphor carrier and other internal lamp features the diffuser can provide a desired overall lamp appearance when the lamp or bulb is not illuminated.

U.S. patent application Ser. No. 13/034,501 also discloses embodiments that can emit light with a luminous intensity distribution that varies by not more than 10% from 0 to 150 degrees from the top of the lamp. In other embodiments, lamps can emit light with a luminous intensity distribution that varies by not more than 20% from 0 to 135 degrees. In some embodiments, at least 5% of the total flux from the lamps can be in the 135-180 degree zone. Other embodiments can emit light having a luminous intensity distribution that varies by not more than 30% from 0 to 120 degrees. In some embodiments, the LED lamp has a color spatial uniformity of such that chromaticity with change in viewing angle varies by no more than 0.004 from a weighted average point. Other lamps can conform to the operational requirements for luminous efficacy, color spatial uniformity, light distribution, color rendering index, dimensions and base type for a 60-watt incandescent replacement bulb.

U.S. patent application Ser. No. 13/034,501 also discloses embodiments in which some light sources, e.g., light emitting diodes, may have adjacent or contacting phosphor layers or regions, while others may have either adjacent phosphor layers of different composition or no phosphor layer at all.

U.S. patent application Ser. No. 13/034,501 also discloses embodiments that comprise a remote phosphor and a separate remote diffuser arrangement, with some being in a double dome arrangement. It is understood that in other embodiments, there can be a single dome like structure having both the conversion and diffusing properties, or there can be more than two domes with different combinations of conversion materials and diffusers. The conversion material and diffusers can be provided in respective domes, or the conversion material and diffusers can be together on one or more of the domes. The term dome should not be construed as limited to any particular shape. The term can encompass many different three dimensional shapes, including but not limited to bullet or globe shaped, or elongated.

U.S. patent application Ser. No. 13/034,501 also discloses that partial and/or non-uniform coatings have been found, in some instances, to produce broad beam intensity profiles which are desirable for incandescent replacement and satisfy ENERGY STAR® compliance for a uniform luminous intensity distribution. Such non-uniform coatings can in some instances also offer the capability to achieve ENERGY STAR® compliance regardless of the heat sink and diffuser globe geometry. The proper placement of a sufficient, partial coating on either a clear or uniformly-coated diffuser dome can in some instances manipulate the scattering and intensity profile of light photons passing through the diffuser dome to preferred angles.

U.S. patent application Ser. No. 13/034,501 also discloses an embodiment in which a diffuser dome has a uniform coating covering the majority of its surface and a thicker band coating having more diffusing material. In this embodiment, the thicker band coating spans around the diffuser dome at a particular range of viewing angles, with the band coating preventing more light from escaping in that specific region, causing it to depart at either higher or lower angles.

U.S. patent application Ser. No. 13/034,501 also discloses an embodiment of a lamp that has a diffuser with a non-uniform coating (i.e. bands or areas of greater diffusers). U.S. patent application Ser. No. 13/034,501 discloses that some lamps with uniform coating can reach a minimum-to-average ratio (relevant to ENERGY STAR® compliance) near 26%, while an embodiment according to U.S. patent application Ser. No. 13/034,501 is able to achieve a value around 17%, complying with the "less than 20%" requirement. Placement of the band coating with additional diffusing material in the correct position on or within the diffuser dome, which is between 45 and 105 degrees, in this case, provides the desired broadened emission profile.

U.S. patent application Ser. No. 13/034,501 also discloses embodiments in which additional diffusers can be provided in many different bands or areas on a diffuser dome. Another embodiment comprises a non-uniform coating that can include multiple partial coats. The partial coats can be applied using any of a variety of methods, one method being spray-coating onto a diffuser dome. One coat of an additional diffuser can be deposited near the middle of the diffuser globe, such as in a viewing angle range of approximately 45 to 105 degrees. A second coat of an additional diffuser can then be deposited at the top of the diffuser dome to cover viewing angles of 0 to approximately 45 degrees. These combined coatings block most of the light photons between 0 and 105 degrees, allowing more light to pass through the diffuser dome at higher angles. This two part non-uniform configuration can achieves ENERGY STAR® compliance.

U.S. patent application Ser. No. 13/034,501 also discloses embodiments which can comprise varying scattering properties along any direction of the interior and exterior surfaces. In some embodiments, the diffuser can comprise a transparent material (substrate) comprising a scattering film on its inside surface having varying scattering properties. Others can comprise a transparent globe having a scattering film on its interior and/or exterior surface and/or embedded within a diffuser element. The scattering films can have many different thicknesses depending at least partially on the film/binder material used, type of scattering material, and the density of scattering material in the film. In some embodiments, the transparent globe can have a scattering film thickness ranging from 0.1 to 1000 microns, with the film being on the interior and/or exterior of the globe. In embodiments using a cellulose-based binder, the film thicknesses can range from 0.1 to 100 microns, with the film being on the interior and/or exterior of the globe. In some embodiments using cellulose based binders, alumina based scattering particles can be used with some particles having a diameter of 0.1 to 4.0 microns.

U.S. patent application Ser. No. 13/034,501 also discloses embodiments in which a diffuser can comprise a transparent globe and scattering films can comprise a methyl silicone based binder, with the films being on the interior and/or the exterior of the globe. The films in these embodiments can range in thickness from 0.1 to 700 microns, and can comprise scattering particles made of different materials. Some embodiments can comprise alumina scattering particles, with these embodiments having particle thicknesses in the range of 0.1 to 4.0 microns.

FIGS. 35 through 40 show embodiments disclosed in U.S. patent application Ser. No. 13/034,501 which comprise diffuser domes having different diffuser layers arranged in different ways. These are only provided as examples and it is understood that many different arrangements can be provided.

FIG. 35 shows a diffuser dome 630 having a uniform external diffuser coating 632, and an external partial coating 634 on the uniform coating 632. The partial coating 634 can be applied using many different methods such as by spraying or dip-coating. FIG. 36 shows a diffuser dome 640 with a uniform internal diffusing coating 642 and a partial external coating 644 that can be applied using different methods such as spraying or dip-coating. FIG. 37 shows a diffuser dome 650 having a uniform external coating 652, and a partial internal coating 654. FIG. 38 shows a diffuser dome 660 with a uniform external coating 662 and a partial internal coating 664 with varying thicknesses. FIG. 39 shows a clear or transparent diffuser dome 670 having a partial internal coating 672 having varying thicknesses. FIG. 40 also shows a clear or transparent diffuser dome 680 having multiple internal coatings 682,684 all or some of which can have varying thicknesses.

Although much of the discussion above regarding U.S. patent application Ser. No. 13/034,501 is directed to varying the diffusing characteristics in areas of the diffuser dome, it is understood that the remote phosphor (phosphor carrier) can have areas of differing concentrations of conversion material. This can also assist in producing the desired emission profile as well as the desired light characteristics. In some embodiments, the phosphor carrier can have increased conversion material at or around the top, although the increase can be in other areas. It is also understood that like the diffuser coating, the conversion material can be applied in or on the phosphor carrier in any of the different internal and external coating combinations described above.

In the embodiments in accordance with U.S. patent application Ser. No. 13/034,501, for both the diffuser dome and the phosphor carrier, the coating material can be mixed in to the material that forms the dome. This can allow for fabrication of the diffuser dome or phosphor carrier without the steps of depositing a diffuser or phosphor material. Both can be formed to the desired shape with the desired material integral to the dome. This can be particularly applicable to forming a diffuser dome and/or phosphor carrier from readily available and easy to use materials such as plastics. This diffusing material and/or conversion material can also be arranged in different concentrations in different areas the dome material, and can also comprise different diffusing or conversion materials in different regions.

The description herein refers to the possible inclusion of conversion materials, wavelength conversion materials, remote phosphors, phosphors, phosphor layers and related terms. The use of these terms should not be construed as limiting. It is understood that the use of the term remote phosphors, phosphor or phosphor layers encompasses and be equally applicable to all wavelength conversion materials.

The description herein refers to the possibility for one or more conversion materials, phosphor layers, phosphor carriers and/or diffusers being remote from one another. The expression "remote" in this context refers to being spaced apart from and/or to not being in direct contact or, in some instances, not being in direct thermal contact.

Some embodiments in accordance with the present inventive subject matter can include one or more electrical connectors. Various types of electrical connectors are well known to those skilled in the art, and any of such electrical connectors can be attached within (or attached to) the lighting devices according to the present inventive subject matter. Representative examples of suitable types of electrical connectors include wires (for splicing to a branch circuit), Edison plugs (which are receivable in Edison sockets) and GU24 pins (which are receivable in GU24 sockets). Other well known types of electrical connectors include 2-pin (round) GX5.3, can DC bay, 2-pin GY6.35, recessed single contact R7s, screw terminals, 4 inch leads, 1 inch ribbon leads, 6 inch flex leads, 2-pin GU4, 2-pin GU5.3, 2-pin G4, turn & lock GU7, GU10, G8, G9, 2-pin Pf, min screw E10, DC bay BA15d, min card E11, med screw E26, mog screw E39, mogul bipost G38, ext. mog end pr GX16d, mod end pr GX16d and med skirted E26/50x39 (see https://www.gecatalogs.com/lighting/software/GELightingCatalogSetup.exe).

An electrical connector, if included, can be attached to one or more other components of the lamp in any suitable way, e.g., by screw-threading into another component, with screws (or bolts or rivets), with clips, with adhesive (e.g., thermal paste), by compression, by press fitting, by a ridge and groove, or by an arrangement in which a tab on one element fits into a slot on the other element and then the elements are moved relative to one another (e.g., one element is slid or rotated relative to the other).

The present inventive subject matter also provides methods of making lighting elements, lamps, heat sink structures and components for use in lighting elements, lamps and heat sink structures.

In some embodiments in accordance with the present inventive subject matter, which can include or not include any of the other features and/or aspects described herein, a heat sink structure can be made by:

making an element that comprises two or more heat sink regions (some or all of which can be separate from each other and/or integral with each other) (in some situations, with major surfaces of the heat sink regions being substantially co-planar, e.g., as shown in FIGS. 12 and 13) and optionally also one or more fold regions, each between a pair of adjacent heat sink regions;

then applying circuitry to one or more of the heat sink regions (e.g., by applying to the element that comprises two or more heat sink regions a circuit board (which, as indicated above, can be flexible or can be non-flexible) that comprises two or more circuit board regions (some or all of which can be separate from each other and/or integral with each other), with one or more circuit board regions on each of at least two of the heat sink regions (or with one or more heat sink regions on each of two or more circuit board regions), and mounting to the circuit board (before or after the circuit board and the two or more heat sink regions are brought into contact with each other) solid state light emitters and optionally other electrical components;

then the element that comprises two or more heat sink regions and circuitry can be tested to see whether the circuitry operates correctly;

then the element that comprises two or more heat sink regions, with the circuit board regions and optionally other circuitry mounted thereon, can be folded into a different shape (e.g., into a hexagonal structure as depicted in FIG. 1), e.g., the shape in which it will be in the finished lamp or lighting element.

In some embodiments in accordance with the present inventive subject matter, which can include or not include any of the other features and/or aspects described herein, an element that comprises two or more heat sink regions (in some embodiments, with major surfaces of the heat sink regions being substantially co-planar) and optionally also one or more fold regions each between a pair of adjacent heat sink regions can be made in any suitable way, e.g., by extrusion or by molding.

As noted above, in some embodiments in accordance with the present inventive subject matter, there can be included one or more internal flow guide structures in a heat sink structure. In some of such embodiments, one or more such internal flow guide structures can be made separately from the heat sink structure and can be joined (in any suitable way, e.g., by engaging key slots in the internal flow guide structure with complementary structures on one or more heat dissipation elements, by compression, by melt-bonding, etc.) with one or more heat sink regions at any suitable time during the making of the heat sink structure. For example, in some embodiments, there can be provided (e.g., by molding or by extrusion) an element that comprises two or more heat sink regions, one or more heat dissipation elements extending from one or more heat sink regions, and one or more flow guide structure regions attached to the one or more heat dissipation elements (e.g., as shown in FIGS. 12 and 13), and the element can be folded to provide a final shape, whereby opposite sides of each flow guide structure region each come into contact with a side of an adjacent flow guide structure region to form an internal flow guide structure (and, if desired, the flow guide structure regions can be joined together in any suitable way, e.g., by melt bonding, gluing, etc., and/or, if desired, heat transfer from one or more flow guide structure regions to one or more other flow guide structure regions can be enhanced in any suitable way, e.g., by applying thermal grease, thermal adhesive, thermal bonding agent, etc.)(in such embodiments, contact between the flow guide structure regions that arises during folding can assist in avoiding over-bending the heat sink regions relative to one another).

In some embodiments in accordance with the present inventive subject matter, which can include or not include any of the other features and/or aspects described herein, a heat sink structure that comprises two or more heat sink regions, optionally one or more heat dissipation elements and optionally one or more internal flow guide structure can be formed in substantially its final shape (e.g., as shown in any of FIGS. 8-10) in any suitable way, e.g., by extrusion or molding. In any such embodiment, circuitry can be added in any suitable way, e.g., by mounting individual circuit board regions on individual heat sink regions and mounting electrical components (including one or more solid state light emitters) on the circuit board regions either before or after mounting the circuit board regions on the heat sink regions, or by forming a circuit board (with two or more circuit board regions) in a shape that can be mounted on a heat sink structure that is substantially in its final shape, e.g., a shape as shown in FIG. 15, and optionally mounting electrical components on the circuit board (1) before shaping the circuit board (e.g., with it substantially flat, followed by bending it), or (2) with the circuit board shaped, e.g., as in FIG. 15, and either before or after the circuit board is mounted on the heat sink structure.

In embodiments in which an element comprising two or more heat sink regions is folded, such folding can be accomplished with or without the assistance of a mandrel to guide the folding and, in some cases, to make the bending more precise (and, in some cases, to ensure that one or more geometrical feature, e.g., bottom edges, of the structure being folded are substantially flat). In some embodiments, an extruded heat sink structure can serve as a mandrel for folding a circuit board (e.g., by attaching a circuit board to a heat sink structure one circuit board region at a time (and applying adhesive to at least a portion of one heat sink region at a time to attach each circuit board region one at a time).

In some embodiments in accordance with the present inventive subject matter, which can include or not include any of the other features and/or aspects described herein, a base structure can be made in any suitable way, e.g., within a sequence of making a lamp by electrically connecting an electrical connector (e.g., an Edison shell) with a first power supply element (e.g., by soldering) and connecting the electrical connector to a base element, then pouring a heat transfer medium into the base element, then attaching a base element cover (with one or more integral legs) to the base element, then attaching a dish structure to the one or more legs, then electrically connecting the first power supply element to a second power supply element on a lighting element, then attaching the lighting element to the dish structure, and then attaching a lens to the dish structure.

In some embodiments, power is supplied to a power supply, the power supply ultimately supplies power to at least one solid state light emitter, at least some heat generated by the one or more solid state light emitter is dissipated by a heat sink structure, at least some heat generated by the power supply (or at least one power supply element) is dissipated from a base structure at a location that is spaced from the heat sink structure, and not more than 10 percent of the heat generated by the at least one solid state light emitter is dissipated from the base structure.

Some embodiments of lamps according to the present inventive subject matter (including any of the devices described and/or depicted herein) can, if desired, include one or more slots or other types of openings to allow for flow of ambient fluid. For example, if it is known that a lamp (e.g., as depicted in FIGS. 4-7) will be oriented sideways (i.e., such that an axis extending through the connector 52 and through the center of the lens 51 is horizontal), one or more slots could be provided in the heat sink structure 47 to assist in providing convective flow of ambient fluid (and/or to enhance flow by one or more active cooling elements), for example, one or more slots (or other opening or openings) could be provided in a wall (of the heat sink structure) that will be facing down, and/or one or more slots (or other opening or openings) could be provided in a wall (of the heat sink structure) that will be facing upward.

Any discussions herein of inlet and outlet openings is dependent on the orientation of the lamp. For example, in the event that a lamp that employs passive cooling and that is oriented such that one or more openings are inlet openings and one or more openings are outlet openings, and then the lamp is inverted (top to bottom and bottom to top), the inlet opening(s) may become outlet opening(s) and the outlet opening(s) may become inlet opening(s), since warmer ambient medium rises (in the absence of other effects).

In some embodiments in accordance with the present inventive subject matter, it was observed that more open space in an internal space defined by a heat sink structure promoted greater ambient fluid velocity, which in turn provided better performance, but that such more open space meant less heat sink area to transfer heat. In some embodiments, a ridged structure can be added to interior walls of a heat sink structure, thereby increasing surface area without presenting additional obstructions to rapid ambient fluid flow. In some situations, the addition of such features can improve the performance of the heat sink structure by nearly 5 degrees under heavy loads.

Some embodiments of lamps according to the present inventive subject matter have only passive cooling. On the other hand, some embodiments of lamps according to the present inventive subject matter can have active cooling (and can optionally also have any of the passive cooling features described herein).

The expression "active cooling" is used herein in a manner that is consistent with its common usage to refer to cooling that is achieved through the use of some form of energy, as opposed to "passive cooling", which is achieved without the use of energy (i.e., while energy is supplied to the one or more solid state light emitters, passive cooling is the cooling that would be achieved without the use of any component(s) that would require additional energy in order to function to provide additional cooling).

In some embodiments of the present inventive subject matter, therefore, cooling is achieved with only passive cooling, while in other embodiments of the present inventive subject matter, active cooling is provided (and any of the features described herein that provide or enhance passive cooling can optionally be included).

In embodiments where active cooling is provided, any type of active cooling can be employed, e.g., blowing or pushing (or assisting in blowing) an ambient fluid (such as air) across or near one or more heat sink structures, heat sink regions, heat dissipation elements and/or internal flow guide structures, thermoelectric cooling, phase change cooling (including supplying energy for pumping and/or compressing fluid), liquid cooling (including supplying energy for pumping, e.g., water, liquid nitrogen or liquid helium), magnetoresistance, etc.

In some embodiments where active cooling is provided, a given maximum junction temperature can be maintained while a larger magnitude of lumens can be provided (i.e, than would otherwise be the case if the active cooling were not provided). Alternatively, in some embodiments where active cooling is provided, a given magnitude of lumens can be maintained while a lower maximum junction temperature can be achieved (than would otherwise be the case if the active cooling were not provided). Alternatively, in some embodiments where active cooling is provided, the overall dimensions of the heat sink structures) (or other structure or structures that provide or assist in providing a thermal solution) can be reduced (as a result of the inclusion of active cooling), e.g., in order to better fit within mechanical outlines or to provide better diffuser to solid state light emitter spacing for improved uniformity and color mixing. Alternatively, in some embodiments where active cooling is provided, a greater magnitude of lumens can be maintained (than would otherwise be the case if the active cooling were not provided), a lower maximum junction temperature can be achieved (than would otherwise be the case if the active cooling were not provided), and/or the overall dimensions of the heat sink structure(s) (or other structure or structures that provide or assist in providing a thermal solution) can be reduced.

In some embodiments where active cooling is provided, the option might exist to provide greater surface area for heat dissipation than might otherwise be desirable if the active cooling were not provided (and the increase in surface area might provide enhanced cooling capabilities). That is, in some embodiments of lamps according to the present inventive subject matter, increasing the surface area of the heat dissipation structure (or structures) might constrict the flow path through the heat dissipation structure (or structures) enough that ambient medium would not flow through the heat dissipation structure (or structures), but if active cooling were included to assist in generating ambient medium flow, such flow would occur despite such constriction.

In some embodiments according to the present inventive subject matter that include one or more active cooling components, any of the one or more active cooling components can be in operation whenever the lamp is being illuminated, or only during certain times when the lamp is being illuminated. For example, in some of such embodiments: any of the one or more active cooling components can be energized intermittently (e.g., a set period of time on, followed by a set period of time off, etc.), any of the one or more active cooling components can be energized only when the lamp is operating at a high lumen level, any of the one or more active cooling components can be energized only when a sensor detects high junction temperature, etc.). Moreover, the amount of cooling provided by the one or more active cooling components can be varied according to any suitable scheme, e.g., the energy supplied to one or more active cooling components can be adjusted based on a detected need for enhanced cooling, according to a set pattern, etc.

Any suitable type of active cooling component or components can be employed in the lamps according to the present inventive subject matter, and persons of skill in the art are familiar with and have access to a wide variety of types of active cooling components.

For example, a well known type of active cooling component is a fan. Persons of skill in the art are familiar with and have access to a wide variety of fans, and any of such devices can be employed as an active cooling component in lamps according to the present inventive subject matter. In general, fans operate by supplying energy to a motor which turns a rotor to which one or more fan blades are attached, so that the fan blades rotate about the rotor, the fan blades shaped such that they push ambient fluid as they rotate. Turbines and compressors are other well known examples of active cooling components that function in a similar way.

Another example of a well known type of active cooling component is an electrostatic accelerator. Persons of skill in the art are familiar with and have access to a wide variety of electrostatic accelerators, and any of such devices can be employed as an active cooling component in lamps according to the present inventive subject matter. Electrostatic accelerators operate by generating ions at an electrode (the "corona electrode"), which ions are attracted (and, therefore, accelerated) toward another electrode (the "attracting electrode"). The ions impart momentum, directed toward the attracting electrode, to surrounding air molecules (or other ambient gas or gases) through collisions with such molecules. When the ions collide with other air molecules, not only do such ions impart momentum to such air molecules, but the ions also transfer some of their excess electric charge to these other air molecules, thereby causing additional molecules to be attracted toward the attracting electrode. These combined effects cause "electric wind" (also referred to as "corona wind"). The principle of ionic air propulsion with corona-generated charge particles has been known for many years. Efforts have been made to make these devices relatively quiet (they are sometimes referred to as "silent"). An example of an electrostatic fluid accelerator is the R5D5 device, developed at Purdue University by a founder of Thorm Micro Technologies with support from the National Science Foundation.

Another example of a well known type of active cooling component is a synthetic jet or pulsed air source. Persons of skill in the art are familiar with and have access to a variety of synthetic jets or pulsed air sources (e.g., devices marketed by Nuventix (www.nuventix.com) or Influent (www.influentmotion.com)), and any of such devices can be employed as an active cooling component in lamps according to the present inventive subject matter. For example, synthetic jets marketed by Nuventix as SynJet™ devices operate by periodic suction and ejection of fluid out of an orifice bounding a cavity by the time periodic motion of a diaphragm. During the ejection phase, a vortex, accompanied by a jet, is created and convected downstream from the jet exit. Once the vortex flow has propagated well downstream, ambient fluid from the vicinity of the orifice is entrained. The bulk of the high speed air (or other fluid) moves away from the orifice, avoiding re-entrainment, while quiescent air (or other fluid) from around the orifice is sucked into the orifice. Thus, a synthetic jet is a "zero-mass-flux" jet comprised entirely of the ambient fluid, and can be conveniently integrated with, e.g., surfaces that require cooling without the need for complex plumbing. The time periodic motion of the diaphragm can be achieved using any of a variety of techniques, including piezoelectric, electromagnetic, electrostatic and combustion-driven pistons. Synthetic jets can be used to create turbulent, pulsated air-jets that can be directed precisely to locations where thermal management is needed.

Another example of a well known type of active cooling component is a piezoelectric fan. Persons of skill in the art are familiar with and have access to a wide variety of piezoelectric fans, and any of such devices can be employed as an active cooling component in lamps according to the present inventive subject matter. Piezoelectric fans generally have at least a piezoelectric element and a fan element, in which at least one dimension of the piezoelectric element changes when it is stressed electrically by a voltage, and the dimensional change causes the fan element to bend.

As mentioned above, another example of a well known type of active cooling is achieved using magnetoresistance (e.g., high-field magnetoresistance (HMR), giant magnetoresistance (GMR) or colossal magnetoresistance). Persons of skill in the art are familiar with and have access to a wide variety of devices that can use magnetoresistance to provide cooling, and any of such devices can be employed as an active cooling component in lamps according to the present inventive subject matter.

As noted above, another example of a well known type of cooling is thermoelectric cooling. Persons of skill in the art are familiar with and have access to a wide variety of devices that can achieve thermoelectric cooling (also known as the Peltier effect), and any of such devices can be employed as an active cooling component in lamps according to the present inventive subject matter. Whenever an electric voltage difference is applied to two dissimilar metals that form a junction, a temperature differential is created. The direction of heat transfer is determined by the polarity of the current (if the polarity were reversed, the direction of heat transfer would also be reversed). Devices that operate on this principle to provide cooling are referred to as Peltier coolers or as thermoelectric coolers.

As noted above, another example of a well known type of cooling is phase change cooling. Persons of skill in the art are familiar with and have access to a wide variety of devices that can achieve phase change cooling (e.g., heat pipes, refrigeration devices, etc.), and any of such devices can be employed as an active cooling component in lamps according to the present inventive subject matter.

As noted above, another example of a well known type of cooling is liquid cooling (including supplying energy for pumping fluid material, e.g., water, liquid nitrogen or liquid helium). Persons of skill in the art are familiar with and have access to a wide variety of devices that can achieve liquid cooling, and any of such devices can be employed as an active cooling component in lamps according to the present inventive subject matter.

In embodiments that include one or more active cooling device(s), electricity can be supplied to the active cooling device from the same energy source from which energy is supplied to the one or more solid state light emitters, or some or all of the electricity supplied to the active cooling device can be supplied from some other energy source. For instance, in some embodiments, an active cooling device (or devices) can be supplied with electricity directly from the lamp input voltage without the need for a separate driver.

An active cooling device (if included) may, in some embodiments, be selectively energized, for example, when a thermal sensor reaches a threshold temperature value (possibly as reflected by a voltage level or digital value). Thus, an active cooling device may be selectively actuated to reduce average power consumption while maintaining the operating temperature of the device below a maximum temperature. Such selective cooling may be particularly suitable to solid state lamps where the application of the lamps may be widely varied. For example, the same lamp may be placed in an enclosed fixture, such as ceiling or fan light fixture as would be placed in an open desk or table lamp. These thermal environments may vary such that in some applications, the active cooling is not needed to keep the operating temperature below the maximum and, therefore, the power consumption of the active cooling device may be avoided in those environments. Furthermore, to the extent that an active cooling device does create audible sound, such active cooling may be reduced or avoided in open air environments where the sound may be more noticeable than in an enclosed environment. Circuits for thermostatically controlling active cooling devices are well known to those of skill in the art.

In some embodiments, one or more active cooling device(s) can be positioned close to the portion of the lamp to which electricity is delivered. In some embodiments, one or more active cooling device(s) can be positioned farther from the portion of the lamp to which electricity is delivered.

In embodiments that include one or more active cooling devices, the active cooling device (or each of the devices) can be located in any suitable location (or locations). For instance, in embodiments that include one or more active cooling devices that move ambient fluid (e.g., air) across or near one or more heat dissipation elements or heat sink structures, the active cooling device (or devices) can be placed in any suitable location, e.g., just upstream from the heat sink structure (or one or more of the heat sink structures), within the heat sink structure (or one or more of the heat sink structures), or just downstream of the heat sink structure (or one or more of the heat sink structures). In embodiments that include one or more active cooling devices that move ambient fluid across or near one or more heat sink structures and/or heat sink regions, the active cooling device (or devices) can assist in breaking the boundary layer and improving thermal transfer to the ambient medium.

Additionally, active cooling devices may be suited for use in devices having heat sink structures that define an enclosure where the enclosure can provide confinement of the ambient fluid.

In some embodiments according to the present inventive subject matter, the lamp emits at least 600 lumens (in some embodiments at least 750 lumens, in some embodiments at least 800 lumens, in some embodiments at least 850 lumens, in some embodiments at least 900 lumens, at least 950 lumens, at least 1000 lumens, at least 1050 lumens, at least 1100 lumens, at least 1200 lumens, at least 1300 lumens, at least 1400 lumens, at least 1500 lumens, at least 1600 lumens, at least 1700 lumens, at least 1800 lumens, or even more) when the lamp is energized (e.g., by supplying line voltage to the lamp). In some embodiments that include active cooling, the lumen output can be very high, e.g., in some embodiments, 1600-1800 lumens, or even higher (for example, as discussed above, in some embodiments, a given maximum junction temperature can be maintained while a larger magnitude of lumens can be provided, i.e., than would otherwise be the case if the active cooling were not provided).

Some embodiments according to the present inventive subject matter can comprise at least one solid state light emitter that, if energized, emits BSY light, and at least one solid state light emitter that, if energized, emits light that is not BSY light.

The expression "BSY light", as used herein, means light having x, y color coordinates which define a point which is within (1) an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38, and/or (2) an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53

In some embodiments according to the present inventive subject matter, when the lamp is energized, a mixture of light emitted by the solid state light emitters in the lamp is within about 10 MacAdam ellipses of the blackbody locus on a 1931 CIE Chromaticity Diagram. In some of such embodiments:

(1) the at least one solid state light emitter that, if energized, emits light that is not BSY light emits light that has a dominant wavelength in the range of from about 600 nm to about 630 nm, and/or (2) the at least one solid state light emitter that, if energized, emits BSY light comprises a first group of at least one light emitting diode, the at least one solid state light emitter that, if energized, emits light that is not BSY light comprises a second group of at least one light emitting diode, the first and second groups of light emitting diodes are mounted on at least one circuit board, and an average distance between a center of each light emitting diode in the first group and a closest point on an edge of the circuit board on which that light emitting diode is mounted is smaller than an average distance between a center of each light emitting diode in the second group and a closest point on an edge of the circuit board on which that light emitting diode is mounted.

In some embodiments according to the present inventive subject matter, solid state light emitters are electrically arranged in series with enough solid state light emitters present to match (or to come close to matching) the voltage supplied to the solid state light emitters (e.g., in some embodiments, the DC voltage obtained by rectifying line AC current and supplying it to the solid state light emitters via a power supply). For instance, in some embodiments, sixty-eight solid state light emitters (or other numbers, as needed to match the line voltage) can be arranged in series, so that the voltage drop across the entire series is about 162 volts. Providing such matching can help provide power supply efficiencies and thereby boost the overall efficiency of the lamp. In such lamps, total lumen output can be regulated by adjusting the current supplied to the series of solid state light emitters.

In addition, one or more scattering elements (e.g., layers) can optionally be included in the lamps according to this aspect of the present inventive subject matter. The scattering element can be included in a lumiphor, and/or a separate scattering element can be provided. A wide variety of separate scattering elements and combined luminescent and scattering elements are well known to those of skill in the art, and any such elements can be employed in the lamps of the present inventive subject matter.

Any desired circuitry (including any desired electronic components) can be employed in devices according to the present inventive subject matter (e.g., in order to supply energy to one or more solid state light emitters).

In some embodiments of lamps according to the present inventive subject matter, the lamp is a self-ballasted device. For example, some embodiments provide a lamp that can be directly connected to AC current (e.g., by being plugged into a wall receptacle, by being screwed into an Edison socket, by being hard-wired into a branch circuit, etc.).

Some embodiments of lamps in accordance with the present inventive subject matter can comprise a power line that can be connected to a source of power (such as a branch circuit, a battery, a photovoltaic collector, etc.) and that can supply power to an electrical connector (or directly to the lamp). Persons of skill in the art are familiar with, and have ready access to, a variety of structures that can be used as a power line. A power line can be any structure that can carry electrical energy and supply it to an electrical connector on a fixture element and/or to a lamp according to the present inventive subject matter.

Some embodiments in accordance with the present inventive subject matter can employ at least one temperature sensor. Persons of skill in the art are familiar with, and have ready access to, a variety of temperature sensors (e.g., thermistors), and any of such temperature sensors can be employed in embodiments in accordance with the present inventive subject matter. Temperature sensors can be used for a variety of purposes, e.g., to provide feedback information to current adjusters.

Energy can be supplied to lamps according to the present inventive subject matter from any source or combination of sources, for example, the grid (e.g., line voltage), one or more batteries, one or more photovoltaic energy collection devices (i.e., a device that includes one or more photovoltaic cells that convert energy from the sun into electrical energy), one or more windmills, etc.

The present inventive subject matter is also directed to lamps that may further comprise a fixture element (e.g., in which the lamp is electrically connected to a fixture element, such as by an Edison plug being threaded in an Edison socket on the fixture element). A fixture element (if included) can comprise a housing, a mounting structure, and/or an enclosing structure. Persons of skill in the art are familiar with, and can envision, a wide variety of materials out of which a fixture element, a housing, a mounting structure and/or an enclosing structure can be constructed, and a wide variety of shapes for such a fixture element, a housing, a mounting structure and/or an enclosing structure. A fixture element, a housing, a mounting structure and/or an enclosing structure made of any of such materials and having any of such shapes can be employed in accordance with the present inventive subject matter.

In some embodiments, lamps according to the present inventive subject matter can further comprise elements that help to ensure that the perceived color (including color temperature) of light exiting the lamp is accurate (e.g., within a specific tolerance). A wide variety of such elements and combinations of elements are known, and any of them can be employed in lamps according to the present inventive subject matter.

Some embodiments in accordance with the present inventive subject matter can comprise a controller configured to control a ratio of emitted light of at least a first color point (or range of color points) and emitted light of a second color (or range of colors) such that a combination of emitted light is within a desired area on a CIE Chromaticity Diagram.

Persons of skill in the art are familiar with, have access to, and can readily envision a variety of suitable controllers that can be used to control the above ratio, and any of such controllers can be employed in accordance with the present inventive subject matter.

A controller may be a digital controller, an analog controller or a combination of digital and analog. For example, the controller may be an application specific integrated circuit (ASIC), a microprocessor, a microcontroller, a collection of discrete components or combinations thereof. In some embodiments, the controller may be programmed to control solid state light emitters. In some embodiments, control of solid state light emitters may be provided by the circuit design of the controller and is, therefore, fixed at the time of manufacture. In still further embodiments, aspects of the controller circuit, such as reference voltages, resistance values or the like, may be set at the time of manufacture so as to allow adjustment of the control of solid state light emitters without the need for programming or control code.

In some embodiments, there is provided drive circuitry that comprises a power supply and drive controller that allows for separate control of at least two strings of LEDs, and in some embodiments, at least three strings of LEDs. Providing separate drive control can allow for adjusting string currents to tune the color point of the combined light output of the LEDs.

In some embodiments of the present inventive subject matter, a set of parallel solid state light emitter strings (i.e., two or more strings of solid state light emitters arranged in parallel with each other) can be arranged in series with a power line, such that current is supplied through the power line to each of the respective strings of solid state light emitters. The expression "string", as used herein, means that at least two solid state light emitters are electrically connected in series. In some such embodiments, the relative quantities of solid state light emitters in the respective strings differ from one string to the next, e.g., a first string contains a first percentage of solid state light emitters that emit BSY light and a second string contains a second percentage (different from the first percentage) of solid state light emitters that emit BSY light. As a representative example, first and second strings each contain solely (i.e., 100%) solid state light emitters that emit BSY light, and a third string contains 50% solid state light emitters that emit BSY light and 50% solid state light emitters that emit non-BSY light, e.g., red light (each of the three strings being electrically connected in parallel to each other and in series with a common power line). By doing so, it is possible to easily adjust the relative intensities of the light of the respective wavelengths, and thereby effectively navigate within the CIE Diagram and/or compensate for other changes. For example, the brightness of non-BSY light can be increased, when necessary, in order to compensate for any reduction of the brightness of the light generated by the solid state light emitters that emit non-BSY light. Thus, for instance, in the representative example described above, by increasing or decreasing the current supplied to the third power line, and/or by increasing or decreasing the current supplied to the first power line and/or the second power line (and/or by intermittently interrupting the supply of power to the first power line or the second power line), the x, y coordinates of the mixture of light emitted from the lamp can be appropriately adjusted.

Alternatively, in some embodiments, drive circuitry can be provided which comprises a power supply and single string LED controller. Such an arrangement may reduce cost and size of the drive circuitry.

In some embodiments, drive circuitry can be provided to achieve some degree of power factor correction. In some embodiments, there can be provided a lamp that may have a power factor of greater than 0.7 and in some embodiments a power factor of greater than 0.9. In some embodiments, a lamp can have a power factor of greater than 0.5. Such embodiments may not require power factor correction and, therefore, may be less costly and smaller in size. Additionally, drive circuitry may be provided for dimming a lamp.

As noted above, solid state light emitters (and any luminescent material), if included, can be arranged in any desired pattern. In the embodiment depicted in FIG. 1, for example, three solid state light emitters are positioned on each circuit board region. In some embodiments corresponding to FIG. 1, on each circuit board region, BSY solid state light emitters can be in the upper and lower positions (in the orientation depicted in FIG. 1), and a red solid state light emitter can be in the middle position.

As noted above, some embodiments according to the present inventive subject matter can include solid state light emitters that emit light of a first hue (e.g., light that is not BSY light, for example, red or reddish or reddish orange or orangish, or orange light) and solid state light emitters that emit light of a second hue (e.g., BSY light), where each of the solid state light emitters that emit light of the first hue is surrounded by five or six solid state light emitters that emit light of the second hue.

In some embodiments, solid state light emitters (e.g., where a first group includes solid state light emitters that emit light of a first hue, e.g., non-BSY light, for example, red, reddish, reddish-orange, orangish or orange light, and a second group includes solid state light emitters that emit light of a second hue (e.g., BSY light) may be arranged pursuant to a guideline described below in paragraphs (1)-(5), or any combination of two or more thereof, to promote mixing of light from light sources emitting different colors of light:

(1) an array that has groups of first and second solid state light emitters with the first group of solid state light emitters arranged so that no two of the first group solid state light emitters are directly next to one another in the array;

(2) an array that comprises a first group of solid state light emitters and one or more additional groups of solid state light emitters, the first group of solid state light emitters being arranged so that at least three solid state light emitters from the one or more additional groups is adjacent each of the solid state light emitters in the first group;

(3) an array is mounted on a submount, and the array comprises a first group of solid state light emitters and one or more additional groups of solid state light emitters, and (c) the array is arranged so that less than fifty percent (50%), or as few as possible, of the solid state light emitters in the first group of solid state light emitters are on the perimeter of the array;

(4) an array comprises a first group of solid state light emitters and one or more additional groups of solid state light emitters, and the first group of solid state light emitters is arranged so that no two solid state light emitters from the first group are directly next to one another in the array, and so that at least three solid state light emitters from the one or more additional groups is adjacent each of the solid state light emitters in the first group; and/or (5) an array is arranged so that no two solid state light emitters from the first group are directly next to one another in the array, fewer than fifty percent (50%) of the solid state light emitters in the first group of solid state light emitters are on the perimeter of the array, and at least three solid state light emitters from the one or more additional groups is adjacent each of the solid state light emitters in the first group.

Arrays according to the present inventive subject matter can also be arranged other ways, and can have additional features, that promote color mixing. In some embodiments, solid state light emitters can be arranged so that they are tightly packed, which can further promote natural color mixing. The lamps can also comprise different diffusers and reflectors to promote color mixing in the near and far field.

Solid state light emitters may be provided in a linear arrangement as shown in FIG. 1 or may be provided in other configurations. For example, there can be provided a roughly circular, triangular or square array or even a single packaged device having one or more LEDs, such as an MC device from Cree, Inc., or in any pattern as described above (including, among other arrangements, where each solid state light emitter that emits light in one hue is surrounded by five or six solid state light emitters that emit light in another hue, or in accordance with any of guidelines (1)-(5) described above).

While not illustrated in the figures, to the extent that two components are to be thermally coupled together, thermal interface materials may also be provided. For example, at any such interface, a thermal interface gasket, thermal grease, or any other suitable thermal interface material (a variety of which are well known to those of skill in the art) may be used to improve the thermal connection between the two components.

In some embodiments of lamps in accordance with the present inventive subject matter, one or more components can be included which can cause one or more active cooling devices to activate to cause ambient fluid to move in at least a first direction (relative to the lamp) if the lamp is in one orientation (or any of a number of orientations), and which can cause ambient fluid to move in at least a second direction (relative to the lamp) if the lamp is in another orientation (or any of a number of other orientations). Thus, the orientation of the lamp may be sensed and the direction of flow controlled based on the sensed orientation. For example, one or more tilt switches can be included which (1) cause a fan (or an electrostatic accelerator, a synthetic jet or a piezoelectric fan) to push or pull air in a first direction through a heat sink structure when the lamp is in a first orientation, or tilted from that orientation by not more than 90 degrees, and (2) cause the fan (or the electrostatic accelerator, the synthetic jet or the piezoelectric fan) to push or pull air in a second direction (opposite the first direction) through the heat sink structure when the lamp is inverted from the first orientation, or tilted from that inverted orientation by not more than 90 degrees. Other techniques for sensing the orientation of the lamp may also be utilized. Techniques for sensing orientation are well known to those of skill in the art.

As noted above, dense heat dissipation element packing can detract from heat removal performance in natural convection configurations, but can enhance heat removal performance (in comparison to devices in which heat dissipation elements are spaced farther apart). If (1) the packing of heat dissipation elements is dense, and/or if (2) the size of the plenum or plenums is small (e.g., with a honeycomb-shaped heat sink structure), and/or if (3) the fluid flow pathway(s) through the heat sink structure is/are convoluted (e.g., with an open pore or a sponge-like structure), and/or if (4) one or more of the surfaces of the heat sink structure, or one or more portions thereof is roughened and/or includes one or more irregularities, and/or if (5) any other feature or condition restricts flow of ambient fluid, to such an extent that convective flow does not occur when the solid state light emitter (or the solid state light emitters) is/are illuminated, one or more active cooling device(s) can be provided for assisting in pushing or pulling ambient medium through the heat sink structure. In some embodiments where resistance to flow of fluid through the heat sink structure is particularly high (e.g., with a honeycomb structure or with an open pore structure, or a sponge-like structure), it might be necessary to partially or completely seal the active cooling device(s) that assist in pushing or pulling ambient medium through the heat sink structure to the structure surrounding the heat sink structure, so that ambient fluid being pushed by the active cooling device(s) is prevented from escaping without passing through the heat sink structure (and/or only fluid within the heat sink structure can be pulled by the active cooling device(s).

In some embodiments of the present inventive subject matter, one or more phase change cooling devices can be thermally coupled to a heat sink structure. Any such phase change cooling device can be an active cooling device or a passive cooling device. For instance, an example of a passive phase change cooling device is a heat pipe. In embodiments that include one or more heat pipe(s), for each heat pipe, a first end of the heat pipe can be thermally coupled to a heat sink structure (e.g., to a heat dissipation element or a heat sink region), e.g., to a location on a heat sink structure from which heat needs to be extracted, such as a particularly hot spot that is near a clump of solid state light emitters, and the other end of the heat pipe can be suspended in air (whereby at the first end, heat from the heat dissipation element converts liquid within the heat pipe into gas, the gas flows toward the second end of the heat pipe, heat is dissipated along the length of the heat pipe, and the gas condenses somewhere along the length of the heat pipe between the first end and the second end, and the condensed gas again flows to the first end, where it is again converted back to gas). An example of an active phase change cooling device is a refrigeration cycle, where the heat extraction portion of the cycle is used to extract heat from the heat sink structure.

As noted above, some embodiments of the present inventive subject matter can include solid state light emitters that emit light in at least two different colors. As noted above, the brightness of light emitted from some solid state light emitters varies based on operating temperature, and the variance in brightness resulting from changes in operating temperature can be more pronounced for solid state light emitters that emit light of one color than for solid state light emitters that emit light of another color. For example, solid state light emitters made from two different material systems (such as AlInGaP and InGaN) may output light of different colors and may react differently to variations in operating temperature. Likewise, the negative impact of elevated operating temperature on efficacy (lumens per Watt of input power), light output level (lumens per A of input current) and/or on lifetime can be more pronounced for solid state light emitters that emit light of one color than for solid state light emitters that emit light of another color.

Variations in operating temperature of multiple solid state light emitters may result from different causes. One cause is by operating the solid state light emitters at different current levels so that different amounts of heat are generated by the differing solid state light emitters. Another cause for multiple solid state light emitters having differing operating temperatures is the emitters being operated in different ambient temperatures. A third cause is for the different solid state light emitters having different thermal resistances from the light emitter to ambient so that the ability to dissipate heat generated by the solid state light emitters differs between different emitters or groups of emitters.

In some embodiments of the present inventive subject matter, the operation and/or relative placement of the solid state light emitters that are more sensitive to operating temperature variations to solid state light emitters that are less sensitive to operating temperature may be selected such that operation of the less sensitive solid state light emitters does not exacerbate and, in some embodiments, ameliorates variations in operating temperature of the more sensitive solid state light emitters. In particular, the less sensitive solid state light emitters may be placed so that heat from these emitters is dissipated downstream in the direction of convective flow from where heat from the more sensitive solid state light emitters is dissipated. Thus, heat generated by the less sensitive solid state light emitters will not raise the ambient temperature for the more sensitive solid state light emitters. Additionally, the less sensitive solid state light emitters may be operated at higher temperatures such that the area where heat is dissipated from the less sensitive emitters is elevated to thereby enhance convective flow. Enhancing the convective flow may increase the flow across both the region (or regions) where heat is dissipated from the less sensitive emitters and the region (or regions) where heat is dissipated from the more sensitive emitters. Thus, increasing the operating temperature of some solid state light emitters may actually decrease the operating temperature of other solid state light emitters.

In some embodiments according to the present inventive subject matter that include solid state light emitters that emit light of at least two different colors (i.e., at least one solid state light emitter emits light of a first color and at least one solid state light emitter emits light of a second color), one or more solid state light emitters that emit light of the first color can be operated (after reaching thermal equilibrium) at a temperature that is higher than the temperature at which one or more solid state light emitters that emit light of the second color is/are operated (after reaching thermal equilibrium), and in some of such embodiments, at least some of the solid state light emitters that emit light of the first color and at least some of the solid state light emitters that emit light of the second color can be located so that when the lamp is deployed, at least some of the solid state light emitters that emit light of the first color are higher than at least some of the solid state light emitters that emit light of the second color (whereby the positioning of higher temperature solid state light emitters above the lower temperature solid state light emitters helps to assist in ambient fluid flow upward through the heat sink structure).

In some embodiments according to the present inventive subject matter that include solid state light emitters that emit light of at least two different colors, at least one solid state light emitter that emits light of a first color can be mounted on a first heat sink structure, and at least one solid state light emitter that emits light of a second color can be mounted on a second heat sink structure, and the first heat sink structure can be thermally isolated from the second heat sink structure. For example, in some embodiments according to the present inventive subject matter that include one or more BSY solid state light emitters and one or more red solid state light emitters, one or more BSY solid state light emitters can be mounted on a first heat sink structure that is thermally isolated from a second heat sink structure, on which one or more red solid state light emitters is/are mounted. Thermal isolation can be provided by the first and second heat sink structures being distinct elements (and optionally being spaced from each other), and/or by being separated by one or more regions that conduct heat less effectively (and in some cases, much less effectively) than the first and second heat sink elements. Thermally isolating the different solid state light emitters may reduce thermal cross-talk between the solid state light emitters and, thereby, reduce the impact on performance from operating the solid state light emitters in close proximity.

As discussed above, in many embodiments of lamps according to the present inventive subject matter, ambient fluid passes through or near a heat sink structure that extends through at least a portion of the lamp. In some of such embodiments, light emitted by one or more solid state light emitter included in the lamp can pass through a lens (which may function as a light diffuser). In some embodiments, one or more lenses can be arranged so that ambient fluid (e.g., air) can escape through the lens (or lenses) while substantially all of the light emitted by the one or more solid state light emitters in the lamp passes through at least one lens (i.e., even though air can escape through one or more opening, little or no light can exit through such opening. For example, in some embodiments, portions of a lens (or separate lens elements) are spaced from each other in a direction extending away from the solid state light emitter (or solid state light emitters), but overlap (or abut one another) in angularity from the solid state light emitter (or solid state light emitters).

Some embodiments of the present inventive subject matter can include at least one active cooling device as well as at least one air purifying device. For example, some embodiments can include an electrostatic accelerator that functions both (1) as a device for pushing or pulling air through at least one heat sink structure and (2) as a device for purifying some or all of that air. Persons of skill in the art are familiar with and have access to a wide variety of devices that move air in the course of purifying it, and any of such devices could be employed in such embodiments to provide both air movement and air purification. For instance, a representative example of a device that moves air in the course of purifying it is a device marketed under the name Kronos™, that includes air handlers that, according to literature, propel air at speeds ranging from 0 to over 1,700 feet per minute while scrubbing the air of harmful pollutants including allergens, gases, viruses, mold and bacteria.

In some aspects of the present inventive subject matter, which can include or not include any of the features described elsewhere herein, there are provided lamps (and/or lighting elements, or other components that can be used in making lamps) that provide sufficient lumen output (to be useful as a replacement for a conventional lamp), that provide good efficiency and that are within the size and shape constraints of the lamp for which the solid state light emitter lamp is a replacement. In some cases, "sufficient lumen output" means at least 75% of the lumen output of the lamp (or lighting element) for which the lamp (or lighting element) is a replacement, and in some cases, at least 85%, 90%, 95%, 100%, 105%, 110%, 115%, 120% or 125% of the lumen output of the lamp (or lighting element) for which the lamp (or lighting element) is a replacement.

In some embodiments of this type, there are provided solid state light emitter lamps (and/or lighting elements, or other components that can be used in making lamps) that provide lumen output of at least 600 lumens, and in some embodiments at least 750 lumens, at least 900 lumens, at least 1000 lumens, at least 1100 lumens, at least 1200 lumens, at least 1300 lumens, at least 1400 lumens, at least 1500 lumens, at least 1600 lumens, at least 1700 lumens, at least 1800 lumens (or in some cases at least even higher lumen outputs)

In some aspects of the present inventive subject matter, which can include or not include any of the features described elsewhere herein, there are provided lamps (or lighting elements) that are within the size and shape constraints of the lamp for which the lamp (or lighting element) is a replacement.

In some aspects of the present inventive subject matter, which can include or not include any of the features described elsewhere herein, there are provided lamps (or lighting elements) that provide CRI Ra of at least 70, and in some embodiments at least 80, at least 85, at least 90 or at least 95.

In some aspects of the present inventive subject matter, which can include or not include any of the features described elsewhere herein, there are provided lamps (or lighting elements) that provide wall plug efficiency of at least 60 lumens per Watt (and in some aspects, in some aspects at least 70 lumens per Watt, in some aspects at least 80 lumens per Watt, in some aspects at least 90 lumens per Watt, in some aspects at least 95 lumens per Watt, and in some aspects at least 100 lumens per Watt or at least 104 lumens per Watt.

The expression "wall plug efficiency", as used herein, is measured in lumens per Watt, and means lumens exiting a lamp, divided by all energy supplied to create the light, as opposed to values for individual components and/or assemblies of components. Accordingly, wall plug efficiency, as used herein, accounts for all losses, including, among others, any quantum losses, i.e., losses generated in converting line voltage into current supplied to light emitters, the ratio of the number of photons emitted by luminescent material(s) divided by the number of photons absorbed by the luminescent material(s), any Stokes losses, i.e., losses due to the change in frequency involved in the absorption of light and the re-emission of visible light (e.g., by luminescent material(s)), and any optical losses involved in the light emitted by a component of the lamp actually exiting the lamp. In some embodiments, the lamps in accordance with the present inventive subject matter provide the wall plug efficiencies specified herein when they are supplied with AC power (i.e., where the AC power is converted to DC power before being supplied to some or all components, the lamp also experiences losses from such conversion), e.g., AC line voltage. The expression "line voltage" is used in accordance with its well known usage to refer to electricity supplied by an energy source, e.g., electricity supplied from a grid, including AC and DC.

In some aspects of the present inventive subject matter, which can include or not include any of the features described elsewhere herein, there are provided lamps (or lighting elements) that can direct light in any desired range of directions. For instance, in some embodiments, a lamp can direct light substantially omnidirectionally (i.e., substantially 100% of all directions extending from a center of the lamp), i.e., within a volume defined by a two-dimensional shape in an x, y plane that encompasses rays extending from 0 degrees to 180 degrees relative to the y axis (i.e., 0 degrees extending from the origin along the positive y axis, 180 degrees extending from the origin along the negative y axis), the two-dimensional shape being rotated 360 degrees about the y axis (in some cases, the y axis can be a vertical axis of the lamp). In some embodiments, a lamp can emit light substantially in all directions within a volume defined by a two-dimensional shape in an x, y plane that encompasses rays extending from 0 degrees to 150 degrees relative to the y axis (extending along a vertical axis of the lamp), the two-dimensional shape being rotated 360 degrees about the y axis. In some embodiments, the lamp emits light substantially in all directions within a volume defined by a two-dimensional shape in an x, y plane that encompasses rays extending from 0 degrees to 120 degrees relative to the y axis (extending along a vertical axis of the lamp), the two-dimensional shape being rotated 360 degrees about the y axis. In some embodiments, a lamp can emit light substantially in all directions within a volume defined by a two-dimensional shape in an x, y plane that encompasses rays extending from 0 degrees to 90 degrees relative to the y axis (extending along a vertical axis of the lamp), the two-dimensional shape being rotated 360 degrees about the y axis (i.e., a hemispherical region). In some embodiments, the two-dimensional shape can instead encompass rays extending from an angle in the range of from 0 to 30 degrees (or from 30 degrees to 60 degrees, or from 60 degrees to 90 degrees) to an angle in the range of from 90 to 120 degrees (or from 120 degrees to 150 degrees, or from 150 degrees to 180 degrees). In some embodiments, the range of directions in which a lamp emits light can be non-symmetrical about any axis, i.e., different embodiments can have any suitable range of directions of light emission, which can be continuous or discontinuous (e.g., regions of ranges of emissions can be surrounded by regions of ranges in which light is not emitted). In some embodiments, a lamp can emit light in at least 50% of all directions extending from a center of the lamp (e.g., hemispherical being 50%), and in some embodiments at least 60%, 70%, 80%, 90% or more.

In some embodiments, which may include or not include any other feature described herein, the lamp may have a light output that is substantially symmetric axially, e.g., of from about 0° to about 150° axially symmetric.

In some aspects of the present inventive subject matter, which can include or not include any of the features described elsewhere herein, there are provided lamps (or lighting elements) that can emit light of generally any desired CCT or within any desired range of CCT. In some embodiments, there are provided lamps that emit light having a correlated color temperature (CCT) of between about 2500K and about 4000K. In some embodiments, the CCT may be as defined in the Energy Star Requirements for Solid State Luminaires, Version 1.1, promulgated by the United States Department of Energy.

In some embodiments, there are provided lamps that emit light that has a correlated color temperature (CCT) of about 2700K and that has x, y color coordinates that define a point which is within an area on a 1931 CIE Chromaticity Diagram defined by points having x, y coordinates of (0.4578, 0.4101), (0.4813, 0.4319), (0.4562, 0.4260), (0.4373, 0.3893), and (0.4593, 0.3944).

In some embodiments, there are provided lamps that emit light that has a correlated color temperature (CCT) of about 3000K and that has x, y color coordinates that define a point which is within an area on a 1931 CIE Chromaticity Diagram defined by points having x, y coordinates of (0.4338, 0.4030), (0.4562, 0.4260), (0.4299, 0.4165), (0.4147, 0.3814), and (0.4373, 0.3893).

In some embodiments, there are provided lamps that emit light that has a correlated color temperature (CCT) of about 3500K and that has x, y color coordinates that define a point which is within an area on a 1931 CIE Chromaticity Diagram defined by points having x, y coordinates of (0.4073, 0.3930), (0.4299, 0.4165), (0.3996, 0.4015), (0.3889, 0.3690), (0.4147, 0.3814).

Solid state light emitter lifetime (and/or lamp lifetime) is typically measured by an "L70 lifetime", i.e., a number of operational hours in which the light output of a light emitter (or a lamp or a lighting element) (and therefore also the wall plug efficiency) does not degrade by more than 30%. Typically, an L70 lifetime of at least 25,000 hours is desirable, and has become a standard design goal. As used herein, L70 lifetime is defined by Illuminating Engineering Society Standard LM-80-08, entitled "*IES Approved Method for Measuring Lumen Maintenance of LED Light Sources*", Sep. 22, 2008, ISBN No. 978-0-87995-227-3, also referred to herein as "LM-80", the disclosure of which is hereby incorporated herein by reference in its entirety as if set forth fully herein.

Various embodiments are described herein with reference to "expected L70 lifetime." Because the lifetimes of solid state lighting products are measured in the tens of thousands of hours, it is generally impractical to perform full term testing to measure the lifetime of the product. Therefore, projections of lifetime from test data on the system and/or light source are often used to project the lifetime of the system. Such testing methods include, but are not limited to, the lifetime projections found in the ENERGY STAR Program Requirements cited above or described by the ASSIST method of lifetime prediction, as described in "*ASSIST Recommends . . . LED Life For General Lighting: Definition of Life*", Volume 1, Issue 1, February 2005, the disclosure of which is hereby incorporated herein by reference as if set forth fully herein. Accordingly, the term "expected L70 lifetime" refers to the predicted L70 lifetime of a product as evidenced, for example, by the L70 lifetime projections of ENERGY STAR, ASSIST and/or a manufacturer's claims of lifetime.

In some aspects of the present inventive subject matter, which can include or not include any of the features described elsewhere herein, there are provided lamps (or lighting elements) that can provide an expected L70 lifetime of at least 25,000 hours. Lamps according to some embodiments of the present inventive subject matter can provide expected L70 lifetimes of at least 35,000 hours, and lamps according to some embodiments of the present inventive subject matter can provide expected L70 lifetimes of at least 50,000 hours.

In some aspects of the present inventive subject matter, which can include or not include any of the features described elsewhere herein, there are provided solid state light emitter lamps (and/or lighting elements, heat sink structures, or other components that can be used in making lamps) that provide good heat dissipation (e.g., in some embodiments, sufficient that the solid state light emitter lamp can continue to provide at least 70% of its initial wall plug efficiency for at least 25,000 hours of operation of the lamp, and in some cases for at least 35,000 hours or 50,000 hours of operation of the lamp).

In some embodiments, which may include or not include any other feature described herein, the lamp may have a correlated color temperature of greater than 2500 K and less than 4500 K, the lamp may have a CRI Ra of 90 or greater, and/or the lamp may have a lumen output of about 600 lumens or greater (or at least 700 lumens, 800 lumens, 900 lumens, 1000 lumens, 1100 lumens, 1200 lumens, 1300 lumens, 1400 lumens, 1500 lumens, 1600 lumens, 1700 lumens, 1800 lumens, or, in some embodiments, even more).

The expression "thermal equilibrium", as used herein, refers to supplying current to one or more light sources in a lamp or lighting element to allow the light source(s) and other surrounding structures to heat up to (or near to) a temperature to which they will typically be heated when the lamp is energized. The particular duration that current should be supplied will depend on the particular configuration of the lamp (or lighting element). For example, the greater the thermal mass, the longer it will take for the light source(s) to approach their thermal equilibrium operating temperature. While a specific time for operating the lamp (or lighting element) prior to reaching thermal equilibrium may be lamp (or lighting element) specific, in some embodiments, durations of from about 1 to about 60 minutes or more and, in specific embodiments, about 30 minutes, may be used. In some instances, thermal equilibrium is reached when the temperature of the light source (or each of the light sources) does not vary substantially (e.g., more than 2 degrees C.) for 15 minutes without a change in ambient or operating conditions.

In many situations, the lifetime of light sources, e.g., solid state light emitters, can be correlated to a thermal equilibrium temperature (e.g., junction temperatures of solid state light emitters). The correlation between lifetime and junction temperature may differ based on the manufacturer (e.g., in the case of solid state light emitters, Cree, Inc., Philips-Lumileds, Nichia, etc). The lifetimes are typically rated as thousands of hours at a particular temperature (junction temperature in the case of solid state light emitters). Thus, in particular embodiments, the component or components of a thermal management system of a lamp (or lighting element) is/are selected so as to dissipate heat at such a rate that a temperature is maintained at or below a particular temperature (e.g., to maintain a junction temperature of a solid state light emitter at or below a 25,000 hour rated lifetime junction temperature for the solid state light source in a 25° C. surrounding environment, in some embodiments, at or below a 35,000 hour rated lifetime junction temperature, in further embodiments, at or below a 50,000 hour rated lifetime junction temperature, or other hour values, or in other embodiments, analogous hour ratings where the surrounding temperature is 35° C. (or any other value).

In some instances, color output can be analyzed while the light emitters (or the entire lamp or lighting element) are at ambient temperature, e.g., substantially immediately after the light emitter (or light emitters, or the entire lamp or lighting element) is illuminated. The expression "at ambient temperature", as used herein, means that the light emitter(s) is within 2 degrees C. of the ambient temperature. As will be appreciated by those of skill in the art, the "ambient temperature" measurement may be taken by measuring the light output of the device in the first few milliseconds or microseconds after the device is energized.

In light of the above discussion, in some embodiments, light output characteristics, such as lumen output, chromaticity (correlated color temperature (CCT)) and/or color rendering index (CRI) are measured with the solid state light emitters, such as LEDs, at thermal equilibrium. In other embodiments, light output characteristics, such as lumens, CCT and/or CRI are measured with the solid state light emitters at ambient temperature. Accordingly, references to lumen output, CCT or CRI describe some embodiments where the light characteristics are measured with the solid state light emitters at thermal equilibrium and other embodiments where the light characteristics are measured with the solid state light emitters at ambient temperature.

In some embodiments in accordance with the present inventive subject matter, the strongest light output is oriented at about 90 degrees relative to an axis of a lamp (or lighting element), i.e., at 3 o'clock positions (i.e., horizontal in the orientation depicted in FIG. 4). There is sometimes a desire to provide greater uniformity among various ranges of angles, e.g., from 0 degrees (12 o'clock or upward in the orientation depicted in FIG. 4) to 150 degrees (5 o'clock), or any other ranges of angles. For example, Energy Star and L-Prize require at least a specified uniformity of light output from 0 degrees to 150 degrees. In embodiments where solid state light emitters are aimed in 90 degree directions, i.e., horizontally in the orientation depicted in FIG. 4 (e.g., on any number of sides, such as four, six, eight, etc., or circumferentially around a circular outer structure), the natural distribution of light output at 0 degrees and 150 degrees with a diffusive lens capable of color mixing light from solid state light emitters that emit light of different colors, e.g., BSY and red, may in some cases be 50% or less of the light output at 90 degrees. In some cases, the light output at 150 degrees can be even lower than the output at 0 degrees (e.g., the light output at 150 degrees can be 20% (or more) less than the light output at 0 degrees), e.g., if the heat sink base is opaque. In order to provide better light output uniformity over any particular range of angles, e.g., from 0 degrees to 150 degrees (e.g., in a device as in the embodiment depicted in FIG. 4): (1) a high loading (or higher loading) of diffuser can be provided in the lens (or lenses)(which might incur losses of light, but will increase uniformity), (2) a thickness of the lens (or lenses) near the region of 0 degrees can be increased relative to other regions of the lens (or lenses) (which will further scatter light that would nominally exit at or near 0 degrees) (which might incur losses of light, but will help to even out spatial output), (3) a base structure (if included) of a lamp, or at least a portion thereof, can be substantially transparent or substantially translucent (rather than being, e.g., reflective, such as MCPET), e.g., the base of the heat sink (or at least a portion thereof) can be made of the same material (or materials) as the diffuser materials used for a lens in the embodiment depicted in FIG. 4, and/or (4) one or more solid state light emitters can be mounted at angles relative to the structure on which they are mounted (e.g., the circuit board regions in the embodiment depicted in FIG. 4), such that the one or more solid state light emitters are aimed at angles other than 90 degrees (e.g., 0 degrees, 10 degrees, 20 degrees, 30 degrees, 60 degrees, 120 degrees, 150 degrees, 160 degrees, 170 degrees or 180 degrees), and/or structures on which one or more solid state light emitters are mounted can be curved and/or contoured so that one or more solid state light emitters mounted flat on one or more surfaces of such structures would be aimed at angles other than 90 degrees (e.g., 0 degrees, 10 degrees, 20 degrees, 30 degrees, 60 degrees, 120 degrees, 150 degrees, 160 degrees, 170 degrees or 180 degrees).

Some embodiments of the present inventive subject matter can provide a solid state lamp (i.e., a lamp that comprises one or more solid state light emitters) that includes at least two solid state light emitters. In such embodiments, the at least two solid state light emitters can be disposed so that a primary axis of a light output (i.e., an axis of the light emission from the light emitter, a direction of maximum brightness of light emission, or a mean direction of light emission (in other words, if the maximum brightness is in a first direction, but a brightness in a second direction ten degrees to one side of the first direction is larger than a brightness in a third direction ten degrees to an opposite side of the first direction, the mean direction of light emission would be moved somewhat toward the second direction as a result of the brightnesses in the second direction and the third direction)) of one of the at least two light emitters is in a direction in which the other (or others) of the at least two solid state light emitters directs no light. In some embodiments, a heat sink structure can be disposed between at least two light emitters, and the heat sink structure can define an internal space (between the at least two light emitters) that is exposed to an environment for heat rejection.

Some embodiments of the present inventive subject matter can provide a solid state lamp that includes a lower portion having an electrical contact and an upper portion that includes a heat sink structure comprising a plurality of outwardly facing heat sink regions, each heat sink region having a plurality of inwardly extending heat dissipation elements extending from a rear surface. In such embodiments, the plurality of outwardly facing heat sink regions and inwardly extending heat dissipation elements can define a central opening extending from the bottom to the top of the heat sink structure, light emitting diodes can be on exterior faces of the heat sink structure and at least one lens can be provided associated with the light emitting diodes. In such embodiments, one or more legs can connect the lower portion and the upper portion in a spaced relationship so as to allow air flow between the upper portion and the lower portion. In some embodiments, an electrical contact can comprise an Edison screw contact, a GU24 contact or a bayonet contact. The upper portion may have a form factor substantially corresponding to an A lamp. The lamp may provide at least about 600 lumens while dissipating at least about 6 W of heat (using only passive heat dissipation, or using active heat dissipation (optionally along with one or more of the passive heat dissipation features described herein)). Driver circuitry (or at least a portion thereof) and/or power supply circuitry (or at least a portion thereof) may also be disposed within the lower portion to provide a self-ballasted lamp.

In some embodiments of the present inventive subject matter, there can be provided a heat sink structure that defines a central opening extending longitudinally thereof, and the heat sink structure can have at least one outwardly facing heat sink region configured to mount a solid state light emitter, and at least one inwardly extending heat dissipation element can extend from the heat sink structure into the central opening.

In some embodiments according to the present inventive subject matter, a plurality of outwardly facing heat sink regions can be provided, and a plurality of inwardly extending heat dissipation elements can also be provided. In some of such embodiments, an outer profile of the heat sink structure can fit within the profile of an A lamp.

In some embodiments according to the present inventive subject matter, a heat sink structure (or at least one of plural heat sink structures) can comprise at least a first inlet opening and at least a first outlet opening, whereby an ambient medium can enter the first inlet opening (or openings), pass through the heat sink structure and exit the first outlet opening (or openings). The inlet opening(s) and the outlet opening(s) can each be of any suitable shape and size. In some of such embodiments, for example, a ratio of a cross-sectional area of a first inlet opening (or a combined cross-sectional area of two or more inlet openings) divided by a cross-sectional area of a first outlet opening (or a combined cross-sectional area of two or more outlet openings) can be at least 0.90, in some cases at least 0.95, in some cases at least 1.0, in some cases at least 1.1, and in some cases at least 1.2, and/or the cross-sectional area of a first inlet opening can be at least 600 square millimeters (in some cases at least 700 square millimeters, in some cases at least 800 square millimeters, in some cases at least 900 square millimeters, and in some cases at least 1000 square millimeters), and/or the cross-sectional area of a first outlet opening can be at least 600 square millimeters (in some cases at least 700 square millimeters, in some cases at least 800 square millimeters, in some cases at least 900 square millimeters, and in some cases at least 1000 square millimeters). In some embodiments, for instance, an inlet opening(s) can comprise a plurality of openings of relatively small cross-sectional area, and an outlet opening(s) can comprise a single opening of comparatively large cross-sectional area, or vice-versa. In some embodiments, sizes of the openings (or a sum of cross-sectional areas of inlet openings and/or a sum of cross-sectional areas of outlet openings) can be adjusted based on (1) temperature difference between surfaces of a chamber within a heat sink structure and temperature of an ambient medium, and/or (2) the rate that heat is being generated by one or more solid state light emitters, and/or (3) surface area for heat exchange between a heat sink structure (and/or heat dissipation elements, such as fin elements, extending therefrom) and an ambient medium, because (a) a greater temperature difference will tend to increase rate of flow of the ambient medium, (b) the sizes of openings (and/or the sums of the inlet opening and the sums of the outlet opening), and the ratio between the same, will affect rate of flow of the ambient medium, (c) the amount of heat being generated by the solid state light emitters will determine the rate that heat has to be removed, and (d) the surface area for heat exchange will affect the rate of heat dissipation (and thus removal of heat from the solid state light emitter(s)).

Embodiments in accordance with the present inventive subject matter are described herein in detail in order to provide exact features of representative embodiments that are within the overall scope of the present inventive subject matter. The present inventive subject matter should not be understood to be limited to such detail.

Embodiments in accordance with the present inventive subject matter are also described with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as being limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

The lamps, lighting elements, heat sink structures, etc. illustrated herein are illustrated with reference to cross-sectional drawings. These cross sections may be rotated around a central axis to provide lamps, lighting elements, heat sink structures, etc. that are circular in nature. Alternatively, the cross sections may be replicated to form sides of a polygon, such as a square, rectangle, pentagon, hexagon or the like, to provide a lamp, lighting element or heat sink structure. Thus, in some embodiments, objects in a center of the cross-section may be surrounded, either completely or partially, by objects at the edges of the cross-section.

FIG. 1 is a perspective view of a lighting element 10 according to the present inventive subject matter. Referring to FIG. 1, the lighting element 10 comprises a heat sink structure, a circuit board and eighteen solid state light emitters 23 (only nine are visible in FIG. 1).

The heat sink structure of the lighting element 10 comprises a first heat sink region 11, a second heat sink region 12, a third heat sink region 13, a fourth heat sink region 14, a fifth heat sink region 15 and a sixth heat sink region 16, with:

a first fold region 17 between the first heat sink region 11 and the second heat sink region 12;
a second fold region 18 between the second heat sink region 12 and the third heat sink region 13;

a third fold region 19 between the third heat sink region 13 and the fourth heat sink region 14;
a fourth fold region 20 between the fourth heat sink region 14 and the fifth heat sink region 15; and
a fifth fold region 21 between the fifth heat sink region 15 and the sixth heat sink region 16.

The six heat sink regions 11-16 extend around and define an internal space 24.

The circuit board of the lighting element 10 comprises a first circuit board region 25 on the first heat sink region 11, a second circuit board region 26 on the second heat sink region 12, a third circuit board region (not visible in FIG. 1) on the third heat sink region 13, a fourth circuit board region (not visible in FIG. 1) on the fourth heat sink region 14, a fifth circuit board region (not visible in FIG. 1) on the fifth heat sink region 15, and a sixth circuit board region 30 on the sixth heat sink region 16, with connection regions 31 connecting:
the first circuit board region 25 with the second circuit board region 26,
the second circuit board region 26 with the third circuit board region,
the third circuit board region with the fourth circuit board region,
the fourth circuit board region with the fifth circuit board region, and
the fifth circuit board region with the sixth circuit board region 30, so that the first circuit board region 25, the second circuit board region 26, the third circuit board region, the fourth circuit board region, the fifth circuit board region, and the sixth circuit board region 30 are integral.

Three solid state light emitters 23 are mounted on each of the circuit board regions.

A first fin element 32 is integral with and extends from the first heat sink region 11 into the internal space 24. A second fin element 33 is integral with and extends from the second heat sink region 12 into the internal space 24. A third fin element 34 is integral with and extends from the third heat sink region 13 into the internal space 24. A fourth fin element 35 is integral with and extends from the fourth heat sink region 14 into the internal space 24. A fifth fin element 36 is integral with and extends from the fifth heat sink region 15 into the internal space 24. A sixth fin element 37 is integral with and extends from the sixth heat sink region 16 into the internal space 24.

A flex tail 38 extends from the first circuit board region 25.

As can be seen in FIG. 1, the first through sixth heat sink regions 11-16 are each substantially flat.

As can also be seen in FIG. 1, the solid state light emitters 23 are mounted on surfaces of the heat sink regions 11-16 of the heat sink structure that are opposite from surfaces of the heat sink regions 11-16 that face the internal space 24. As can also be seen in FIG. 1, each of the solid state light emitters 23 is covered by an encapsulant 27.

As can also be seen in FIG. 1:
a major surface of the first heat sink region 11 has a plane of symmetry in a first plane,
a major surface of the second heat sink region 12 has a plane of symmetry in a second plane,
a major surface of the third heat sink region 13 has a plane of symmetry in a third plane,
a major surface of the fourth heat sink region 14 has a plane of symmetry in a fourth plane,
a major surface of the fifth heat sink region 15 has a plane of symmetry in a fifth plane,
a major surface of the sixth heat sink region 16 has a plane of symmetry in a sixth plane,
the first plane defines an angle of about 60 degrees (i.e., at least 20 degrees) relative to each of the second, third, fifth and sixth planes,
the second plane defines an angle of about 60 degrees (i.e., at least 20 degrees) relative to each of the first, third, fourth and sixth planes,
the third plane defines an angle of about 60 degrees (i.e., at least 20 degrees) relative to each of the first, second, fourth and fifth planes,
the fourth plane defines an angle of about 60 degrees (i.e., at least 20 degrees) relative to each of the second, third, fifth and sixth planes,
the fifth plane defines an angle of about 60 degrees (i.e., at least 20 degrees) relative to each of the first, third, fourth and sixth planes, and
the sixth plane defines an angle of about 60 degrees (i.e., at least 20 degrees) relative to each of the first, second, fourth and fifth planes.

FIG. 2 is a perspective view of another lighting element 39 according to the present inventive subject matter. The lighting element 39 is similar to the lighting element 10 depicted in FIG. 1, except that the lighting element 39 in FIG. 2 further comprises an internal flow guide structure 40 that defines an internal flow conduit 41.

As shown in FIG. 2, the first fin element 32 extends from the first heat sink region 11 to the internal flow guide structure 40; the second fin element 33 extends from the second heat sink region 12 to the internal flow guide structure 40; the third fin element 34 extends from the third heat sink region 13 to the internal flow guide structure 40; the fourth fin element 35 extends from the fourth heat sink region 14 to the internal flow guide structure 40; the fifth fin element 36 extends from the fifth heat sink region 15 to the internal flow guide structure 40; and the sixth fin element 37 extends from the sixth heat sink region 16 to the internal flow guide structure 40.

As shown in FIG. 2, the internal flow guide structure 40 is circular tubular.

FIG. 3 is a sectional view of a portion of a circuit board 43 (in accordance with the present inventive subject matter), on which is mounted a solid state light emitter 44 which is covered by an encapsulant 45. The solid state light emitter 44 has an emission plane that is substantially parallel to the upper surface of the circuit board 43. As can be seen in FIG. 3, the encapsulant 45 extends more than twice as far in a horizontal direction along the emission plane of the solid state light emitter 44 than it extends in a direction perpendicular to the emission plane of the solid state light emitter 44 (i.e., upward).

The encapsulant 45 in FIG. 3 is substantially dome-shaped.

FIG. 4 is an exploded sectional view of a lamp 46 according to the present inventive subject matter. Referring to FIG. 4, the lamp 46 comprises a heat sink structure 47, a circuit board comprising a plurality of circuit board regions 48 (only two of which are visible in FIG. 4), a plurality of solid state light emitters 49 (only some of which are visible in FIG. 4), each solid state light emitter 99 covered by encapsulant 50, a lens 51, an electrical connector 52 (in the form of an Edison connector), a base structure (comprising a base element 53, a base element cover 54, a plurality of legs 55 (integral with the base element cover 54), a dish structure 56, a power supply comprising a first power supply element 57 and a second power supply element 58. The legs 55 are between the base element cover 54 and the dish structure 56.

The first power supply element 57 is embedded in heat transfer medium 59 within a base chamber 60 defined by the base element 53 and the base element cover 54. The first power supply element 57 receives AC power (via the electrical connector 52), and outputs DC power to the second power supply element 58. Wires 86 and 87 extend from the first power supply element 57 through one of the legs 55 (alternatively, one or more wires can extend through each of two or more legs), through the dish structure 56 and into the heat sink structure 47.

FIGS. 5 and 6 are perspective (non-exploded) views of the lamp 46.

FIG. 7 is a perspective view of the dish structure 56. The heat sink structure 47 and the lens 51 are both supported on the dish structure 56.

As shown in FIG. 4, the middle of the base element cover 54 is dome-shaped, so that portions of the base element cover 54 along a periphery of the base element cover 54 (defined by regions of the base element cover 54 that are in contact with the base element 53) are farther from the heat sink structure 47 than portions of the base element cover 54 (e.g., the middle of the base element cover 54) that are spaced from its periphery. As a result of the middle of the base element cover 54 being dome-shaped, additional volume is provided within the base chamber 60 for dissipating heat generated in the first power supply element 57. The dome shape does not substantially interfere with flow of ambient fluid through openings 61 (see FIGS. 5 and 6) defined by the base element cover 54, the legs 55 and the dish structure 56 (and through the heat sink structure 47 and through the opening 62 in the lens 51), because the provision of the dome-shaped portion of the base element cover 54 does not cause the cross-sectional area for flow of ambient fluid to be less than that provided by the openings 61.

As also shown in FIG. 4, the second power supply element 58 is on the heat sink structure 47, in this case mounted on one of the circuit board regions 48. The second power supply element 58 receives DC power via the first power supply element 57, and outputs DC power which is sent to at least some of the solid state light emitters 49.

As an alternative for the embodiment depicted in FIG. 4, the legs 55 can snap into or interlock with a cutout or locking slot.

In this embodiment, the spacing between the base element cover 54 and the dish structure 56 can help to allow for more free flow of ambient medium and can help to provide for thermal isolation between the first power supply element 57 and the solid state light emitters 49.

Additionally, in this and other embodiments, the specific configuration of components may be varied while still falling within the teachings of the present inventive subject matter. For example, the number of legs may be increased or decreased from the four legs shown. Alternatively, the legs could be eliminated and a circular mesh or screen that allows air flow to the opening in the heat sink could be utilized. Similarly, the dish structure is shown as a disk with an opening corresponding to the internal space defined by the heat sink regions of the heat sink structure, but the dish structure may also include openings to allow for light extraction (i.e., downward in the orientation depicted in FIG. 4).

FIG. 8 is a top view of another heat sink structure 63 according to the present inventive subject matter. Referring to FIG. 8, the heat sink structure 63 comprises six heat sink regions 64 and six heat dissipation elements 65. The heat sink regions 64 together define an internal space 66 into which the heat dissipation elements 65 extend. As shown in FIG. 8, the heat sink regions 64 comprise ridges 67 to increase their surface area, to provide increased heat exchange area with ambient fluid in the internal space 66.

FIG. 9 is a top view of another heat sink structure 68 according to the present inventive subject matter. The heat sink structure 68 is similar to the heat sink structure 63 (shown in FIG. 8), except that the heat sink structure 68 further comprises an internal flow guide structure 69 that defines an internal flow conduit 70.

FIG. 10 is a top view of another heat sink structure 71 according to the present inventive subject matter. Referring to FIG. 10, the heat sink structure 71 comprises six heat sink regions 72, six heat dissipation elements 73 and an internal flow guide structure 74. The heat sink regions 72 together define an internal space 75 which is divided into sections by the heat dissipation elements 73 and the internal flow guide structure 74. The internal flow guide structure 74 defines an internal flow conduit 76.

FIG. 11 depicts another lamp 77 according to the present inventive subject matter. The lamp 77 is similar to the lamp 46 depicted in FIGS. 4-7, except that the lamp 77 further comprises an active cooling device 78 located in a gap between the base element cover 54 and the dish structure 56. The active cooling device 78 can be any suitable active cooling device, e.g., a fan, an electrostatic accelerator, a synthetic jet or a piezoelectric fan. The direction of ambient fluid flow can be in any direction, e.g., upward or downward in the orientation depicted in FIG. 11. If the active cooling device 78 is a device that pushes or pulls ambient fluid, the direction that the active cooling device 78 pushes or pulls ambient fluid can be the same as the direction that passive ambient fluid flow (e.g., by convection) would be.

FIG. 19 is a perspective view of a lighting element 110 according to the present inventive subject matter. Referring to FIG. 19, the lighting element 110 comprises a heat sink structure (comprising six separate (i.e., non-integral) heat sink regions, 111, 112, 113, 114, 115 and 116), a flexible circuit board 117 and eighteen solid state light emitters 118 (only six are visible in FIG. 19).

The six heat sink regions 111-116 extend around and define an internal space 119 (divided into seven regions by the fin elements discussed below).

The flexible circuit board 117 a first circuit board region 120, a second circuit board region 121, a third circuit board region 122, a fourth circuit board region 123, a fifth circuit board region 124, and a sixth circuit board region 125.

Three solid state light emitters 118 are mounted on each of the circuit board regions.

A first fin element 126 is integral with and extends from the sixth heat sink region 116 into the internal space 119. A second fin element 127 is integral with and extends from the first heat sink region 111 into the internal space 119. A third fin element 128 is integral with and extends from the second heat sink region 112 into the internal space 119. A fourth fin element 129 is integral with and extends from the third heat sink region 113 into the internal space 119. A fifth fin element 130 is integral with and extends from the fourth heat sink region 114 into the internal space 119. A sixth fin element 131 is integral with and extends from the fifth heat sink region 115 into the internal space 119.

A flex tail 132 extends from the first circuit board region 120.

As can be seen in FIG. 19, the first through sixth heat sink regions 111-116 are each substantially flat.

As can also be seen in FIG. 19, the solid state light emitters 118 are mounted on respective circuit board regions 120-125 that face away from the internal space 119. As can also be seen in FIG. 19, each of the solid state light emitters 118 is covered by an encapsulant 133.

As can also be seen in FIG. 19:
a major surface of the first heat sink region 111 has a plane of symmetry in a first plane,
a major surface of the second heat sink region 112 has a plane of symmetry in a second plane,
a major surface of the third heat sink region 113 has a plane of symmetry in a third plane,
a major surface of the fourth heat sink region 114 has a plane of symmetry in a fourth plane,
a major surface of the fifth heat sink region 115 has a plane of symmetry in a fifth plane,
a major surface of the sixth heat sink region 116 has a plane of symmetry in a sixth plane,
the first plane defines an angle of about 60 degrees (i.e., at least 20 degrees) relative to each of the second, third, fifth and sixth planes,
the second plane defines an angle of about 60 degrees (i.e., at least 20 degrees) relative to each of the first, third, fourth and sixth planes,
the third plane defines an angle of about 60 degrees (i.e., at least 20 degrees) relative to each of the first, second, fourth and fifth planes,
the fourth plane defines an angle of about 60 degrees (i.e., at least 20 degrees) relative to each of the second, third, fifth and sixth planes,
the fifth plane defines an angle of about 60 degrees (i.e., at least 20 degrees) relative to each of the first, third, fourth and sixth planes, and
the sixth plane defines an angle of about 60 degrees (i.e., at least 20 degrees) relative to each of the first, second, fourth and fifth planes.

FIG. 21 depicts the lighting element 110 (prior to mounting the solid state light emitters 116 and the encapsulant 133) with the flexible circuit board 117 substantially flat (and with the heat sink regions 111 through 116 oriented such that their surfaces bonded to the flexible circuit board 117 are substantially co-planar). The lighting element 110 as depicted in FIG. 21 can be folded along five line segments which are substantially parallel and between each pair of neighboring heat sink regions into an arrangement as depicted in FIG. 19 (and can take on an arrangement as shown in FIG. 20 in the process of being folded). FIG. 22 is a top view of the lighting element 110 in the arrangement shown in FIG. 21.

Representative examples of methods of constructing items in accordance with the present inventive subject matter will now be described with reference to FIGS. 12-15.

In one representative method, a heat sink structure can be made by:
making an element 79 that comprises:
two or more heat sink regions 80 (in this case, six), with major surfaces of the heat sink regions 80 being substantially co-planar, e.g., as shown in FIGS. 12 and 13);
fold regions 81 between each pair of adjacent heat sink regions 80;
heat dissipation elements 82 extending from each of the heat sink regions 80; and
flow guide structure regions 83 integral with each of the heat dissipation elements 82;
then applying circuitry to each of the heat sink regions 80 by applying to the element 79 a circuit board that comprises six circuit board regions, with one circuit board region on each of the heat sink regions 80, and mounting to the circuit board (before or after the circuit board is applied to the element 79) solid state light emitters and optionally other electrical components);
then the element 79 and circuitry can be tested to see whether the circuitry operates correctly;
then the element 79, with the circuit board and optionally other electrical components mounted thereon, can be folded into a hexagonal structure as shown in FIG. 14, i.e., the shape in which it will be in the finished lamp or lighting element, whereby opposite sides of each flow guide structure region each come into contact with a side of an adjacent flow guide structure region to form an internal flow guide structure (and, if desired, the flow guide structure regions can be joined together in any suitable way).

Additional representative examples of methods of constructing items in accordance with the present inventive subject matter will now be described with reference to FIGS. 19-22.

In a representative method, a lighting element can be made by:
making a flexible circuit board comprising a plurality of circuit board regions;
then bonding a plurality of heat sink regions (each as a separate structure) to respective circuit board regions (e.g., to provide a lighting element as depicted in FIG. 20 and FIG. 22);
then mounting at least one solid state light emitter on each of the circuit board regions;
then supplying power to circuitry in the flexible circuit board to test at least some of the circuitry (and/or one or more of the solid state light emitters);
and then folding the lighting element along line segments between each neighboring pair of heat sink regions (e.g., to provide a lighting element as depicted in FIG. 19). In any such method, any of the solid state light emitters can be mounted on any of the circuit board regions prior to bonding any of the heat sink regions to respective circuit board regions.

Alternatively, as noted above, in some embodiments in accordance with the present inventive subject matter, which can include or not include any of the other features and/or aspects described herein, a heat sink structure that comprises two or more heat sink regions, optionally one or more heat dissipation elements and optionally one or more internal flow guide structures can be formed in substantially its final shape (e.g., as shown in any of FIGS. 8-10). In any such embodiment, circuitry can be added in any suitable way, e.g., by mounting individual circuit board regions on individual heat sink regions and mounting electrical components (including one or more solid state light emitters on the circuit board regions either before or after mounting the circuit board regions on the heat sink regions), or by forming a circuit board (with two or more circuit board regions) in a shape that can be mounted on a heat sink structure that is substantially in its final shape, e.g., as shown in FIG. 15, a circuit board 84 that has two or more circuit board regions 85 (in this embodiment, six circuit board regions 85), and optionally mounting electrical components on the circuit board 84 (1) before shaping the circuit board (e.g., with it substantially flat, followed by bending it), or (2) with the circuit board 84 shaped, e.g., as in FIG. 15, and either before or after the circuit board is mounted on the heat sink structure.

FIG. 23 is a top view of another heat sink structure according to the present inventive subject matter.

FIG. 24 is a perspective view of the heat sink structure depicted in FIG. 23.

FIG. 25 is a top view of another heat sink structure according to the present inventive subject matter.

FIG. 26 is a top view of another heat sink structure according to the present inventive subject matter.

FIG. 27 is a top view of another heat sink structure according to the present inventive subject matter.

FIG. 28 is a top view of another heat sink structure according to the present inventive subject matter.

FIG. 29 is a top view of another heat sink structure according to the present inventive subject matter.

FIG. 30 is a top view of another heat sink structure according to the present inventive subject matter.

FIG. 31 is a top view of another heat sink structure according to the present inventive subject matter.

FIG. 32 is a top view of another heat sink structure according to the present inventive subject matter.

FIG. 33 is a top view of another heat sink structure according to the present inventive subject matter.

FIG. 34 is a top view of another heat sink structure according to the present inventive subject matter.

While the present inventive subject matter has been disclosed in the context of various aspects of embodiments, it will be recognized that the inventive subject matter may be suitably applied to other devices, consistent with the claims which follow.

In the drawings and specification, there have been disclosed typical embodiments of the present inventive subject matter and, although specific terms are employed, they are used in a generic and descriptive sense only and not for purposes of limitation, the scope of the present inventive subject matter being set forth in the following claims.

Embodiments of the present inventive subject matter have been described with reference to a substantially hexagonal cross-sectional heat sink structure with six heat sink regions. However, other configurations, such as triangular, square, pentagonal, octagonal or even circular could be provided. Furthermore, while the mounting surfaces are shown as flat, other shapes could be used. For example, the mounting surfaces could be convex or concave. Thus, a reference to a mounting face refers to location to and/or on which LEDs may be affixed and is not limited to a particular size or shape as the size and shape may vary, for example, depending on the LED configuration.

While illustrated embodiments of the present inventive subject matter are shown as LED based solid state lamps having a form factor making it suitable as a retrofit replacement for an incandescent A lamp, the teachings of the illustrated embodiments are applicable to other types of lamps, mounting arrangements and shapes. As an example, while an Edison screw type connector is depicted, the teachings are applicable to GU-24, bayonet, or other presently available or future-developed connectors. Similarly, the teachings are applicable to replacements for bulbs having other form factors, as well as new lamp designs. While six heat sink regions are shown in some embodiments, other numbers and shapes or a mix of shapes may be employed in other embodiments.

Furthermore, embodiments of the present inventive subject matter have been illustrated as enclosed structures having openings only at opposing ends. However, the structure of the heat sink need not make a complete enclosure. In such a case, an enclosure could be made by other components of the lamp in combination with the heat sink, or a portion of the lamp structure could be left open.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

Any two or more structural parts of the lamps or lighting devices described herein can be integrated. Any structural part of the lamps or lighting devices described herein can be provided in two or more parts (which may be held together in any known way, e.g., with adhesive, screws, bolts, rivets, staples, etc.). Similarly, any two or more functions can be conducted simultaneously, and/or any function can be conducted in a series of steps.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

The invention claimed is:

1. A lighting element, comprising:
   at least a first heat sink structure; and
   at least a first group of solid state light emitters and a second group of solid state light emitters,
   the first heat sink structure a one-piece structure that comprises at least first and second heat sink regions integral with one another and at least a first fold region between the first and second heat sink regions, the fold region of rigidity that is lower than the rigidity of the first heat sink region and lower than the rigidity of the second heat sink region, at least a first solid state light emitter on the first heat sink region, at least a second solid state light emitter on the second heat sink region, the first heat sink structure defining a first internal space defined at least in part by the first and second heat sink regions, an entirety of the first internal space between a first plane and a second plane, the first plane substantially parallel to the second plane, the first internal space comprising at least one plenum extending from the first plane to the second plane, each plenum extending from the first plane to the second plane having no path through which air can pass along a straight line from the first plane to the second plane, each of the first group of solid state light emitters, when supplied with electricity, emitting light having a first color point, each of the second group of solid state light emitter, when supplied with electricity, emitting light having a second color point, the first color point different from the second color point, at least one of the first group of solid state light emitters and at least one of the second group of solid state light emitters on a first string, at least one of the first group of solid state light emitters and at least one of the second group of solid state light emitters on a second string, a first ratio equal to (1) a number of solid state light emitters in said second group of solid state light emitters and in said first string, divided by (2) a number of solid state light emitters in said first group of solid state light emitters and in said first string, a second ratio equal to (3) a number of solid state light emitters in said second group of solid state light emitters and in said second string, divided by (4) a number of solid state light emitters in said first group of solid state light emitters and in said second string, the first ratio different from the second ratio.

2. A lighting element as recited in claim 1, wherein the first fold region is substantially linear and has a thickness that is less than a thickness of every portion of each of the first and second heat sink regions.

3. A lighting element as recited in claim 1, wherein the first heat sink structure further comprises at least a third heat sink region and a second fold region between the second and third heat sink regions.

4. A lighting element as recited in claim 3, wherein the first internal space is defined at least in part by the first, second and third heat sink regions.

5. A lighting element as recited in claim 3, wherein the first, second and third heat sink regions are substantially flat.

6. A lighting element as recited in claim 3, wherein:
a major surface of the first heat sink region has a plane of symmetry in a first plane,
a major surface of the second heat sink region has a plane of symmetry in a second plane,
a major surface of the third heat sink region has a plane of symmetry in a third plane,
the first plane defines an angle of at least 20 degrees relative to each of the second plane and the third plane,
the second plane defines an angle of at least 20 degrees relative to the third plane.

7. A lamp comprising a lighting element as recited in claim 1, wherein the lamp fits within an envelope of an A lamp.

8. A lighting element as recited in claim 1, wherein at least the first solid state light emitter comprises a light emitting diode.

9. A lighting element as recited in claim 1, wherein the first heat sink structure comprises at least a first heat dissipation element attached to the first heat sink region.

10. A lighting element as recited in claim 9, wherein the first heat dissipation element comprises at least a first fin element.

11. A lighting element as recited in claim 1, wherein the lighting element further comprises at least a first circuit board that extends across the first fold region.

12. A method of making a lighting element, comprising:
mounting first and second groups of solid state light emitters on a first heat sink structure, said mounting comprising mounting at least a first solid state light emitter on a first heat sink region of the first heat sink structure; and mounting at least a second solid state light emitter on a second heat sink region of the first heat sink structure, the first heat sink structure a one-piece structure that comprises at least a first fold region between the first and second heat sink regions, the first and second heat sink regions integral with one another, the fold region of rigidity that is lower than the rigidity of the first heat sink region and lower than the rigidity of the second heat sink region, the first heat sink structure defining a first internal space defined at least in part by the first and second heat sink regions, an entirety of the first internal space between a first plane and a second plane, the first plane substantially parallel to the second plane, the first internal space comprising at least one plenum extending from the first plane to the second plane, each plenum extending from the first plane to the second plane having no path through which air can pass along a straight line from the first plane to the second plane, each of the first group of solid state light emitters, when supplied with electricity, emitting light having a first color point, each of the second group of solid state light emitter, when supplied with electricity, emitting light having a second color point, the first color point different from the second color point, at least one of the first group of solid state light emitters and at least one of the second group of solid state light emitters on a first string, at least one of the first group of solid state light emitters and at least one of the second group of solid state light emitters on a second string, a first ratio equal to (1) a number of solid state light emitters in said second group of solid state light emitters and in said first string, divided by (2) a number of solid state light emitters in said first group of solid state light emitters and in said first string, a second ratio equal to (3) a number of solid state light emitters in said second group of solid state light emitters and in said second string, divided by (4) a number of solid state light emitters in said first group of solid state light emitters and in said second string, the first ratio different from the second ratio.

13. A method as recited in claim 12, wherein the method further comprises bending the first heat sink structure substantially along the first fold region.

14. A method as recited in claim 13, wherein the method further comprises testing the first and second solid state light emitters before bending the first heat sink structure.

15. A method as recited in claim 12, wherein:
the first heat sink structure further comprises at least a second fold region, and
the method further comprises bending the first heat sink structure at least along the first fold region and bending the first heat sink structure along the second fold region so that first and second edges of the first heat sink structure are in contact with each other.

16. A method as recited in claim 15, wherein the method further comprises testing the first and second solid state light emitters before bending the first heat sink structure along the first fold region or along the second fold region.

17. A method as recited in claim 12, wherein the method further comprises:
supplying power to at least the first and second solid state light emitters, and then
bending the first heat sink structure substantially along the first fold region.

18. A method as recited in claim 12, wherein at least the first and second solid state light emitters comprise light emitting diodes.

19. A method as recited in claim 12, wherein the first heat sink structure comprises at least a first heat dissipation element attached to the first heat sink region.

20. A method as recited in claim 19, wherein the first heat dissipation element comprises at least a first fin element.

21. A method as recited in claim 12, wherein:
the method further comprises mounting at least a first circuit board on the first heat sink structure so that a first region of the first circuit board is on the first heat sink region and a second region of the first circuit board is on the second heat sink region, and
the first region of the first circuit board and the second region of the first circuit board are integral with each other, and the first circuit board is a one-piece structure.

22. A lighting element, comprising:
at least a first one-piece flexible circuit board;
at least first and second heat sink regions; and
at least first and second groups of solid state light emitters,
the first one-piece flexible circuit board having at least first and second circuit board regions,
the first heat sink region on the first circuit board region, the second heat sink region on the second circuit board region,
at least a first solid state light emitter on the first circuit board region, at least a second solid state light emitter on the second circuit board region,
the first and second heat sink regions both part of a first heat sink structure that defines a first internal space defined at least in part by the first and second heat sink regions,
an entirety of the first internal space between a first plane and a second plane, the first plane substantially parallel to the second plane,
the first internal space comprising at least one plenum extending from the first plane to the second plane,
each plenum extending from the first plane to the second plane having no path through which air can pass along a straight line from the first plane to the second plane,
each of the first group of solid state light emitters, when supplied with electricity, emitting light having a first color point,
each of the second group of solid state light emitter, when supplied with electricity, emitting light having a second color point,
the first color point different from the second color point,
at least one of the first group of solid state light emitters and at least one of the second group of solid state light emitters on a first string,
at least one of the first group of solid state light emitters and at least one of the second group of solid state light emitters on a second string,
a first ratio equal to (1) a number of solid state light emitters in said second group of solid state light emitters and in said first string, divided by (2) a number of solid state light emitters in said first group of solid state light emitters and in said first string,
a second ratio equal to (3) a number of solid state light emitters in said second group of solid state light emitters and in said second string, divided by (4) a number of solid state light emitters in said first group of solid state light emitters and in said second string,
the first ratio different from the second ratio.

23. A lighting element as recited in claim 22, wherein the first and second heat sink regions are separate from one another.

24. A lighting element as recited in claim 23, wherein the lighting element further comprises at least a third heat sink region.

25. A lighting element as recited in claim 24, wherein the first, second and third heat sink regions, alone or with more heat sink regions, together define the first internal space.

26. A lighting element as recited in claim 24, wherein the first, second and third heat sink regions are each substantially flat.

27. A lighting element as recited in claim 24, wherein:
a major surface of the first heat sink region has a plane of symmetry in a first plane,
a major surface of the second heat sink region has a plane of symmetry in a second plane,
a major surface of the third heat sink region has a plane of symmetry in a third plane,
the first plane defines an angle of at least 20 degrees relative to each of the second plane and the third plane,
the second plane defines an angle of at least 20 degrees relative to the third plane.

28. A lighting element as recited in claim 22, wherein the heat sink structure is an integral one-piece structure.

29. A lighting element as recited in claim 28, wherein the heat sink structure comprises at least a first fold region between the first and second heat sink regions.

30. A lamp comprising a lighting element as recited in claim 22, wherein the lamp fits within an envelope of an A lamp.

31. A lighting element as recited in claim 22, wherein at least a first heat dissipation element is attached to the first heat sink region.

32. A method of making a lighting element, comprising:
mounting first and second groups of solid state light emitters on a first heat sink structure, said mounting comprising mounting at least a first solid state light emitter on a first heat sink region of a first heat sink structure; and mounting at least a second solid state light emitter on a second heat sink region of the first heat sink structure, the first heat sink region on a first circuit board region of a first one-piece flexible circuit board, the second heat sink region on a second circuit board region of the first one-piece flexible circuit board, the first heat sink structure defining a first internal space defined at least in part by the first and second heat sink regions, an entirety of the first internal space between a first plane and a second plane, the first plane substantially parallel to the second plane, the first internal space comprising at least one plenum extending from the first plane to the second plane, each plenum extending from the first plane to the second plane having no path through which air can pass along a straight line from the first plane to the second plane, each of the first group of solid state light emitters, when supplied with electricity, emitting light having a first color point, each of the second group of solid state light emitter, when supplied with electricity, emitting light having a second color point, the first color point different from the second color point, at least one of the first group of solid state light emitters and at least one of the second group of solid state light emitters on a first string, at least one of the first group of solid state light emitters and at least one of the second group of solid state light emitters on a second string, a first ratio equal to (1) a number of solid state light emitters in said second group of solid state light emitters and in said first string, divided by (2) a number of solid state light emitters in said first group of solid state light emitters and in said first string, a second ratio equal to (3) a number of solid state light emitters in said second group of solid state light emitters and in said second string, divided by (4) a number of solid state light emitters in said first group of solid state light emitters and in said second string, the first ratio different from the second ratio.

33. A method as recited in claim 32, wherein the method further comprises folding the first flexible circuit board along a first line segment extending between the first circuit board region and the second circuit board region.

34. A method as recited in claim 33, wherein the method further comprises testing the first and second solid state light emitters before folding the first flexible circuit board.

35. A method as recited in claim 32, wherein:
the method further comprises mounting a third solid state light emitter on a third heat sink region of the first heat sink structure,
the third heat sink region is on a third circuit board region of the first flexible circuit board, and
the method further comprises folding the first flexible circuit board along a second line segment extending between the second circuit board region and the third circuit board region.

36. A method as recited in claim 32, wherein the method further comprises:
supplying power to at least the first and second solid state light emitters, and then
folding the first flexible circuit board along a first line segment extending between the first circuit board region and the second circuit board region.

37. A method as recited in claim 32, wherein the first and second heat sink regions are separate from one another.

38. A lighting element as recited in claim 32, wherein the first heat sink structure is an integral one-piece structure.

39. A lighting element comprising:
a first heat sink structure comprising at least first and second heat sink regions;
at least a first circuit board; and
at least first and second groups of solid state light emitters,
the first circuit board a one-piece structure comprising at least a first circuit board region and a second circuit board region,
the first circuit board region on the first heat sink region,
the second circuit board region on the second heat sink region,
at least a first solid state light emitter on the first circuit board region,
at least a second solid state light emitter on the second circuit board region,
the first circuit board region integral with the second circuit board region,
the first circuit board region having a first circuit board region surface that extends in a first plane of symmetry,
the second circuit board region having a second circuit board region surface that extends in a second plane of symmetry,
the first plane of symmetry defining an angle of at least 20 degrees relative to the second plane of symmetry,
the first heat sink structure defining a first internal space defined at least in part by the first and second heat sink regions,
an entirety of the first internal space between a first plane and a second plane, the first plane substantially parallel to the second plane,
the first internal space comprising at least one plenum extending from the first plane to the second plane,
each plenum extending from the first plane to the second plane having no path through which air can pass along a straight line from the first plane to the second plane,
each of the first group of solid state light emitters, when supplied with electricity, emitting light having a first color point,
each of the second group of solid state light emitter, when supplied with electricity, emitting light having a second color point,
the first color point different from the second color point,
at least one of the first group of solid state light emitters and at least one of the second group of solid state light emitters on a first string,
at least one of the first group of solid state light emitters and at least one of the second group of solid state light emitters on a second string,
a first ratio equal to (1) a number of solid state light emitters in said second group of solid state light emitters and in said first string, divided by (2) a number of solid state light emitters in said first group of solid state light emitters and in said first string,
a second ratio equal to (3) a number of solid state light emitters in said second group of solid state light emitters and in said second string, divided by (4) a number of solid state light emitters in said first group of solid state light emitters and in said second string,
the first ratio different from the second ratio.

40. A lighting element as recited in claim 39, wherein each of the heat sink regions has two opposite edges that each abut another heat sink region of the lighting element.

41. A lighting element as recited in claim 39, wherein:
the first heat sink structure further comprises at least a third heat sink region,
the first circuit board further comprises at least a third circuit board region, and the third circuit board region is on the third heat sink region.

42. A lighting element as recited in claim 41, wherein the first internal space is defined at least in part by the first, second and third heat sink regions.

43. A lighting element as recited in claim 41, wherein the first, second and third heat sink regions are substantially flat.

44. A lighting element as recited in claim 41, wherein:
a major surface of the first heat sink region has a plane of symmetry in a first heat sink plane,
a major surface of the second heat sink region has a plane of symmetry in a second heat sink plane,
a major surface of the third heat sink region has a plane of symmetry in a third heat sink plane,
the first heat sink plane defines an angle of at least 20 degrees relative to each of the second heat sink plane and the third heat sink plane,
the second heat sink plane defines an angle of at least 20 degrees relative to the third heat sink plane.

45. A lamp comprising a lighting element as recited in claim 39, wherein the lamp fits within an envelope of an A lamp.

46. A lighting element as recited in claim 39, wherein the lighting element comprises at least a first heat dissipation element attached to the first heat sink region.

47. A lighting element as recited in claim 46, wherein the first heat dissipation element comprises at least a first fin element.

48. A lamp comprising:
at least a first heat sink structure, the first heat sink structure comprising at least first and second heat sink regions;
at least a first power supply element; and
at least first and second groups of solid state light emitters,
the first heat sink structure defining at least a first internal space defined at least in part by the first and second heat sink regions,
the first heat sink structure comprising a first surface and a second surface, the first surface opposite the second surface,
a first solid state light emitter on the first surface of the first heat sink structure,
the second surface of the first heat sink structure facing the first internal space,
at least the first power supply element on the first heat sink structure,
an entirety of the first internal space between a first plane and a second plane, the first plane substantially parallel to the second plane,
the first internal space comprising at least one plenum extending from the first plane to the second plane,
each plenum extending from the first plane to the second plane having no path through which air can pass along a straight line from the first plane to the second plane,
each of the first group of solid state light emitters, when supplied with electricity, emitting light having a first color point,
each of the second group of solid state light emitter, when supplied with electricity, emitting light having a second color point,
the first color point different from the second color point,
at least one of the first group of solid state light emitters and at least one of the second group of solid state light emitters on a first string,
at least one of the first group of solid state light emitters and at least one of the second group of solid state light emitters on a second string,
a first ratio equal to (1) a number of solid state light emitters in said second group of solid state light emitters and in said first string, divided by (2) a number of solid state light emitters in said first group of solid state light emitters and in said first string,
a second ratio equal to (3) a number of solid state light emitters in said second group of solid state light emitters and in said second string, divided by (4) a number of solid state light emitters in said first group of solid state light emitters and in said second string,
the first ratio different from the second ratio.

49. A lamp as recited in claim 48, wherein the first power supply element receives DC power and outputs DC power.

50. A lamp as recited in claim 48, wherein the lamp fits within an envelope of an A lamp.

51. A lamp as recited in claim 48, wherein at least the first solid state light emitter comprises a light emitting diode.

52. A lighting element as recited in claim 22, wherein:
the first solid state light emitter is directly on the first circuit board region, and
the second solid state light emitter is directly on the second circuit board region.

\* \* \* \* \*